United States Patent
Koduri

(10) Patent No.: US 11,756,914 B2
(45) Date of Patent: *Sep. 12, 2023

(54) MICROELECTRONIC DEVICE WITH PILLARS HAVING FLARED ENDS

(71) Applicant: Texas Instruments Incorporated, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 93 days.

This patent is subject to a terminal disclaimer.

(21) Appl. No.: 17/404,958

(22) Filed: Aug. 17, 2021

(65) Prior Publication Data

US 2021/0375812 A1 Dec. 2, 2021

Related U.S. Application Data

(63) Continuation of application No. 16/588,304, filed on Sep. 30, 2019, now Pat. No. 11,094,659.

(51) Int. Cl.
*H01L 23/00* (2006.01)

(52) U.S. Cl.
CPC .............. *H01L 24/17* (2013.01); *H01L 24/11* (2013.01); *H01L 2924/01029* (2013.01)

(58) Field of Classification Search
CPC ..................... H01L 24/17; H01L 24/11; H01L 2924/01029; H01L 2224/13017; H01L 24/13
See application file for complete search history.

(56) References Cited

U.S. PATENT DOCUMENTS

| 6,103,552 | A | * | 8/2000 | Lin | ........................ | H01L 24/12 |
| | | | | | | 257/E23.021 |
| 6,177,636 | B1 | * | 1/2001 | Fjelstad | ............ | H01L 23/49816 |
| | | | | | | 29/830 |
| 8,823,166 | B2 | | 9/2014 | Lin et al. | | |
| 8,957,524 | B2 | | 2/2015 | Breuer et al. | | |
| 9,425,136 | B2 | | 8/2016 | Kuo et al. | | |
| 9,674,952 | B1 | | 6/2017 | Liu et al. | | |
| 11,094,659 | B2 | * | 8/2021 | Koduri | ..................... | H01L 24/13 |
| 2001/0040290 | A1 | * | 11/2001 | Sakurai | .................... | H01L 24/13 |
| | | | | | | 257/737 |

(Continued)

*Primary Examiner* — Victor A Mandala
(74) *Attorney, Agent, or Firm* — Dawn Jos; Frank D. Cimino

(57) ABSTRACT

A microelectronic device has a die with a die conductor at a connection surface. The microelectronic device includes a pillar electrically coupled to the die conductor, and a head electrically coupled to the pillar. The pillar has a die-side flared end at a die end of the pillar; the pillar widens progressively along the die-side flared end, and extends outward by more than a lesser of half a thickness of the die conductor and half a lateral width of the pillar midway between a die end and a head end. The pillar has a head-side flared end at a head end of the pillar; the pillar widens progressively along the die-side flared end, and extends outward by a distance that is greater than a lesser of half a thickness of the head and half the lateral width of the pillar. Methods of forming the microelectronic device are disclosed.

18 Claims, 28 Drawing Sheets

(56) References Cited

U.S. PATENT DOCUMENTS

| | | | |
|---|---|---|---|
| 2002/0096787 A1* | 7/2002 | Fjelstad | H01L 23/49811 |
| | | | 257/772 |
| 2010/0052164 A1* | 3/2010 | Lee | H01L 24/05 |
| | | | 257/738 |
| 2012/0007232 A1* | 1/2012 | Haba | H01L 21/4853 |
| | | | 257/737 |
| 2012/0025365 A1* | 2/2012 | Haba | H01L 25/50 |
| | | | 977/773 |
| 2014/0077359 A1* | 3/2014 | Tsai | H01L 24/11 |
| | | | 257/737 |
| 2014/0145329 A1* | 5/2014 | Haba | H01L 23/49811 |
| | | | 257/737 |
| 2015/0137354 A1 | 5/2015 | Foong et al. | |
| 2016/0014898 A1* | 1/2016 | Adachi | H01L 23/49894 |
| | | | 361/767 |
| 2016/0322321 A1* | 11/2016 | Yajima | H01L 24/13 |
| 2017/0330853 A1 | 11/2017 | Jiang | |
| 2019/0109108 A1* | 4/2019 | Koduri | H01L 24/14 |

* cited by examiner

MICROELECTRONIC DEVICE WITH PILLARS HAVING FLARED ENDS

This application is a continuation of U.S. patent application Ser. No. 16/588,304, filed Sep. 30, 2019, the contents of which are herein incorporated by reference in its entirety.

FIELD

This disclosure relates to the field of microelectronic devices. More particularly, this disclosure relates to pillars for bump bonds in microelectronic devices.

BACKGROUND

Some microelectronic devices have pillars on a die connected to bump bonds. During operation of the microelectronic devices, current flowing through the pillars generates hot spots due to current crowding, which can lead to voids in the pillars and subsequent reduced reliability.

SUMMARY

The present disclosure introduces a microelectronic device having a die with a connection surface. The microelectronic device includes a die conductor in or on the die, at the connection surface. The microelectronic device further includes a pillar electrically coupled to the die conductor, and a head electrically coupled to the pillar. The pillar has a die-side flared end at the die end of the pillar, wherein the die-side flared end extends outward by a distance that is greater than a lesser of half a thickness of the die conductor and half a lateral width of the pillar midway between a die end and a head end. The pillar has a head-side flared end at the head end of the pillar, wherein the head-side flared end extends outward by a distance that is greater than a lesser of half a thickness of the head and half the lateral width of the pillar. Methods of forming the microelectronic device are disclosed.

DETAILED DESCRIPTION

Figure 1A:
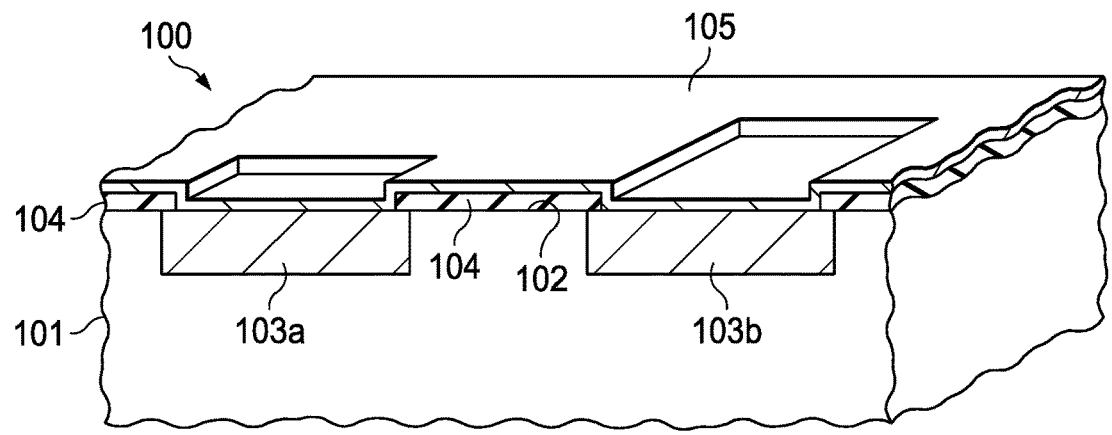
FIG. 1A through FIG. 1O are cross sections of an example microelectronic device, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a die having a connection surface. The microelectronic device includes a die conductor at the connection surface of the die, such as a top level interconnect, a bond pad, or a lead of a redistribution layer (RDL). The microelectronic device further includes a pillar that is electrically coupled to the die conductor at a die end of the pillar, and a head that is electrically coupled to the pillar at a head end of the pillar. The die conductor, the pillar, and the head are electrically conductive. For the purposes of this disclosure, elements that are disclosed as "electrically coupled" may be directly connected or may be coupled by materials or structures such as metal interconnects or semiconductor material, that conduct direct (DC) electrical currents. The pillar may be directly connected to the die conductor, or may be coupled to the die conductor through a die interface layer that is electrically conductive. The head may be directly connected to the pillar, or may be coupled to the pillar through a head interface layer that is electrically conductive. The die conductor extends past the pillar in a first lateral direction parallel to the connection surface. The pillar extends past the pillar in a second lateral direction parallel to the connection surface.

The die conductor has a die conductor thickness which is a dimension of the die conductor in a direction perpendicular to the connection surface, at a point of overlap between the die conductor and an edge of the pillar at the die end. The head has a head thickness which is a dimension of the head in a direction perpendicular to the connection surface, at a point of overlap between the head and an edge of the pillar at the head end. The pillar has a pillar width which is a minimum dimension of the pillar in a direction parallel to the connection surface, midway between the die end and the head end. For the purposes of this disclosure, the term "lateral" is understood to refer to a direction parallel to the connection surface of the die. The term "vertical" is understood to refer to a direction perpendicular to the connection surface of the die.

The pillar has a die-side flared end at the die end of the pillar. The pillar widens progressively along the die-side flared end toward the die end of the pillar. The die-side flared end extends outward at the die end of the pillar, from a surface of the pillar midway between the die end and the head end, by a die-side flare extension that is greater than a lesser of half the die conductor thickness and half the pillar width.

The pillar has a head-side flared end at the head end of the pillar. The pillar widens progressively along the head-side flared end toward the head end of the pillar. The head-side flared end extends outward at the head end of the pillar, from the surface of the pillar midway between the die end and the head end, by a head-side flare extension that is greater than a lesser of half the head thickness and half the pillar width. The head-side flare extension may be different from the die-side flare extension.

During operation of the microelectronic device, current flows from the die conductor through the pillar into the head, or alternately, from the head through the pillar into the die conductor. The die-side flared end of the pillar advantageously reduces a density of the current in the pillar at the die end. Similarly, the head-side flared end of the pillar advantageously reduces a density of the current in the pillar at the head end. Having the die-side flare extension greater than a lesser of half the die conductor thickness of the die conductor and half the lateral thickness of the pillar, and having the head-side flare extension greater than a lesser of half the pillar thickness of the die conductor and half the lateral thickness of the pillar, enables attainment of a measureable improvement in reliability of the pillar.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, a center of an element or area.

Figure 1B:
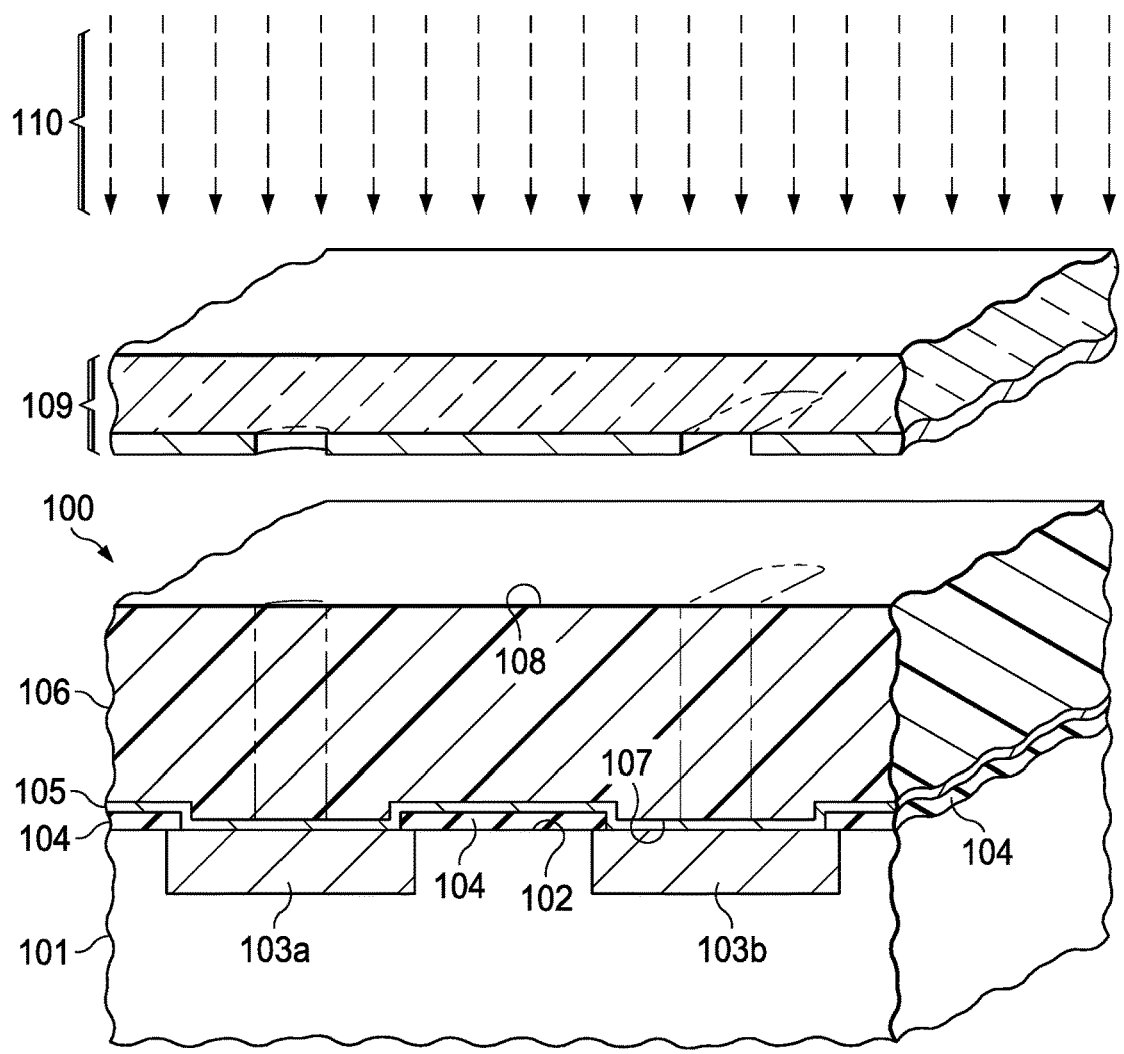
Figure 1C:
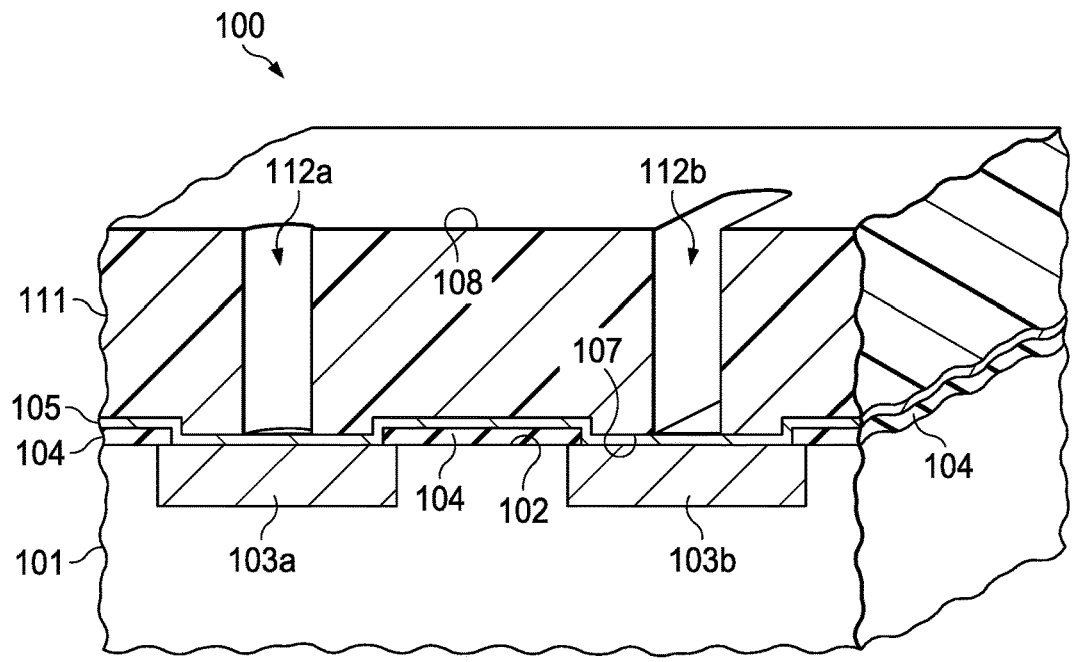
Figure 1D:
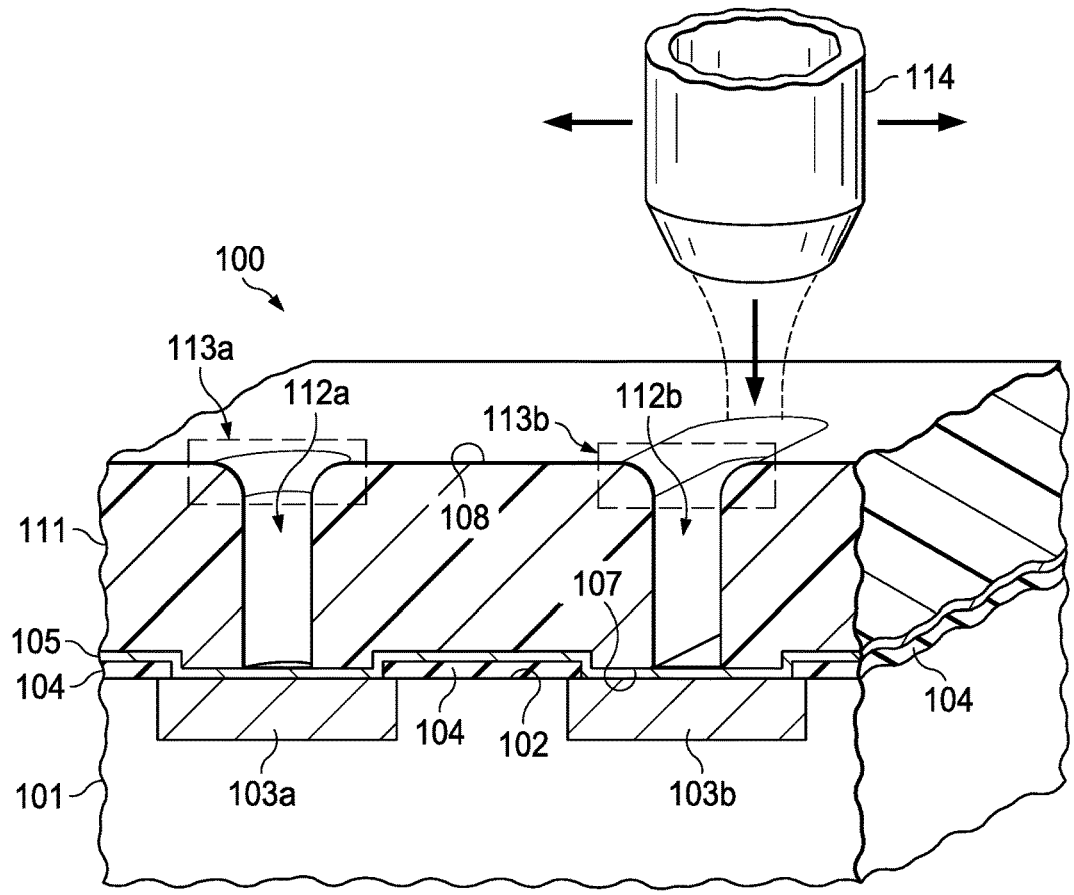
Figure 1E:
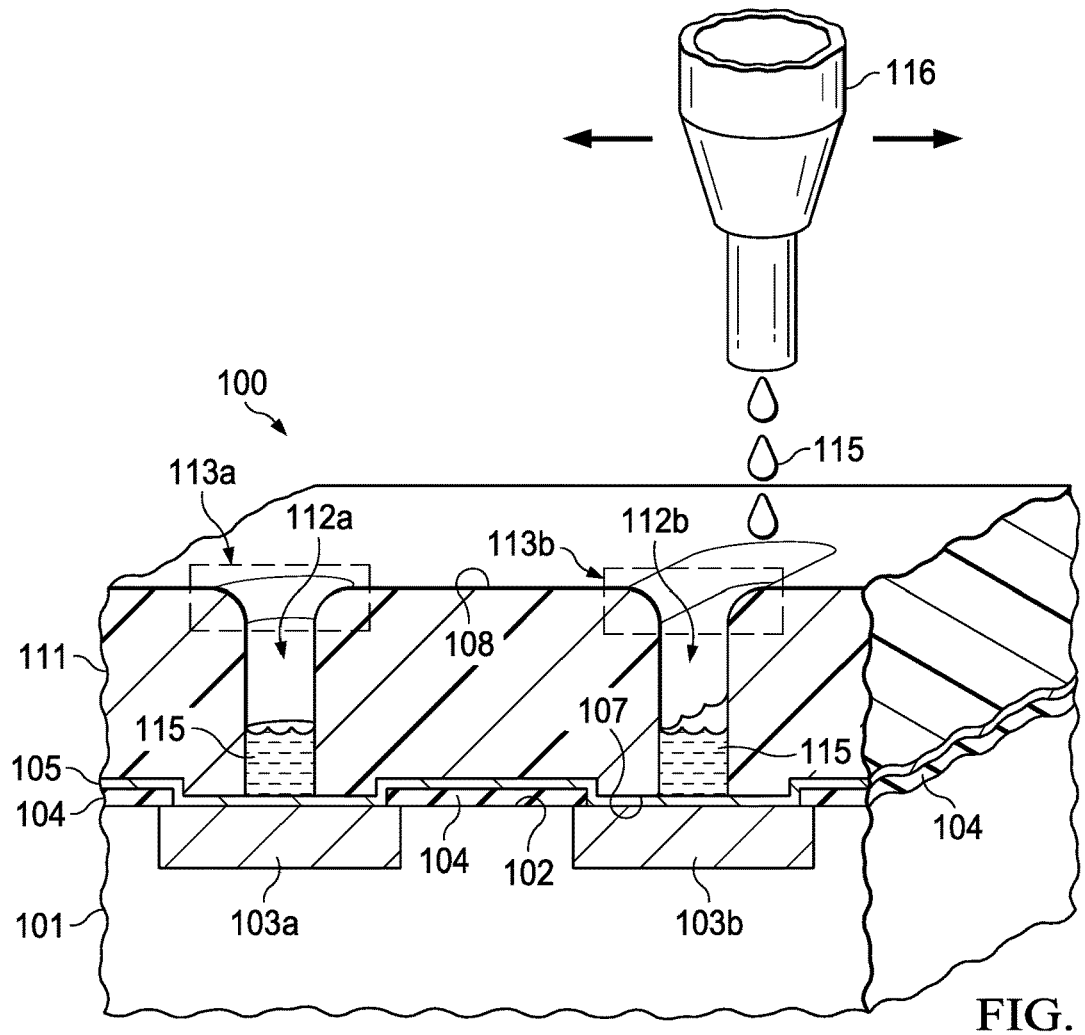
Figure 1F:
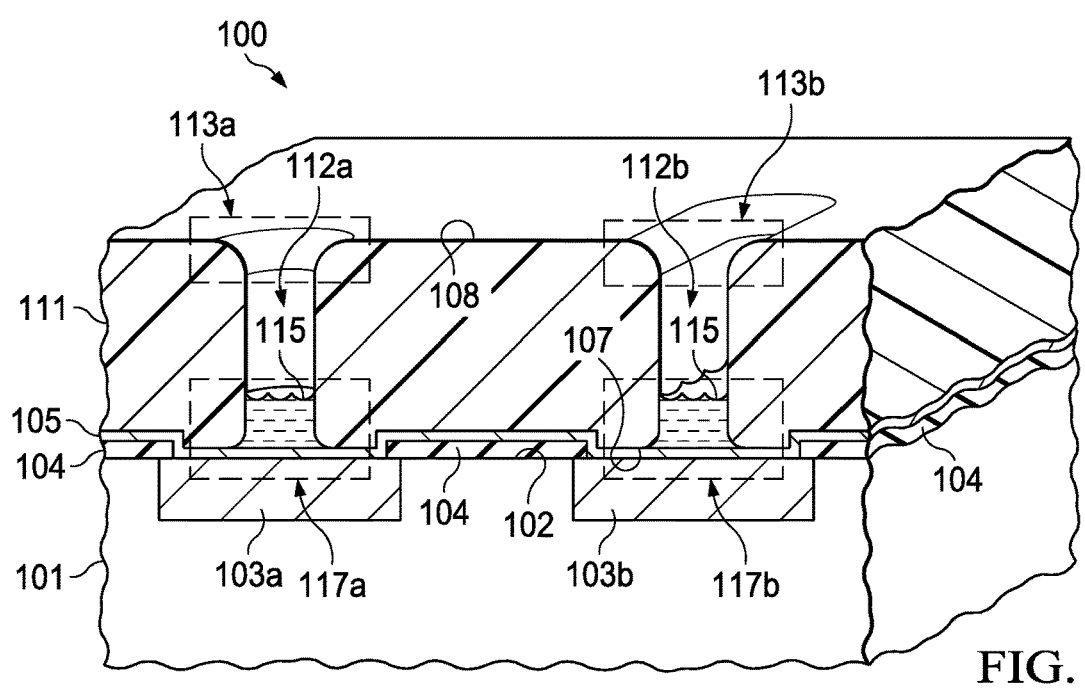
Figure 1G:
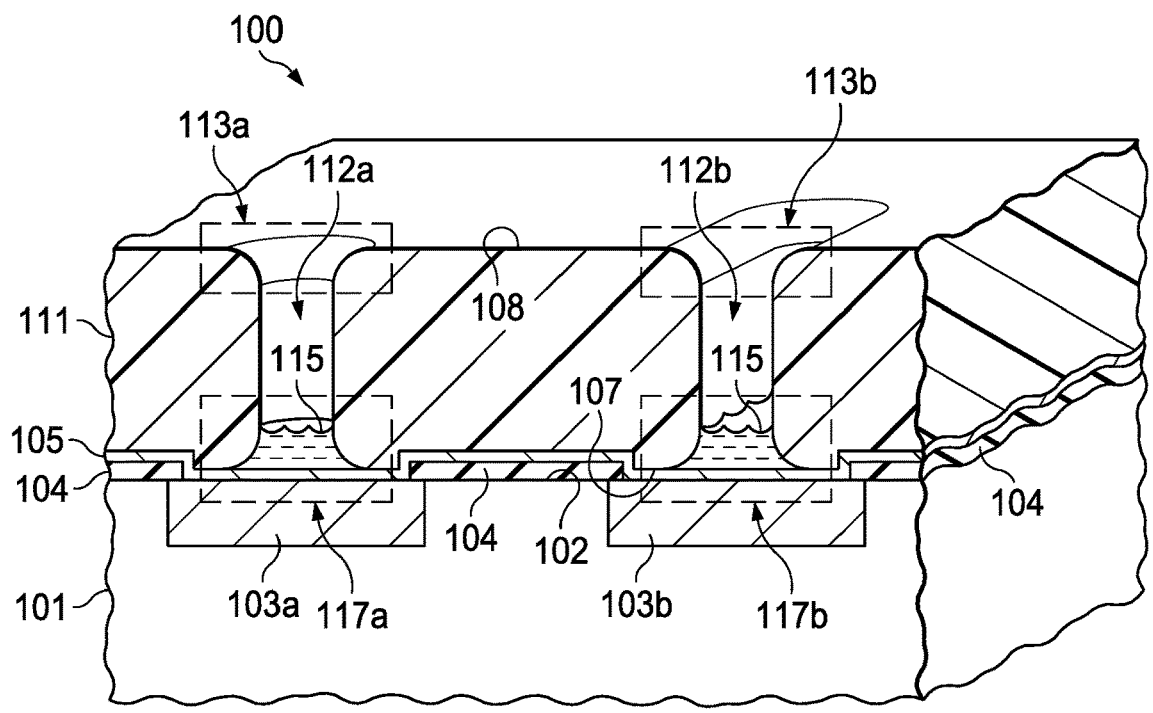
Figure 1H:
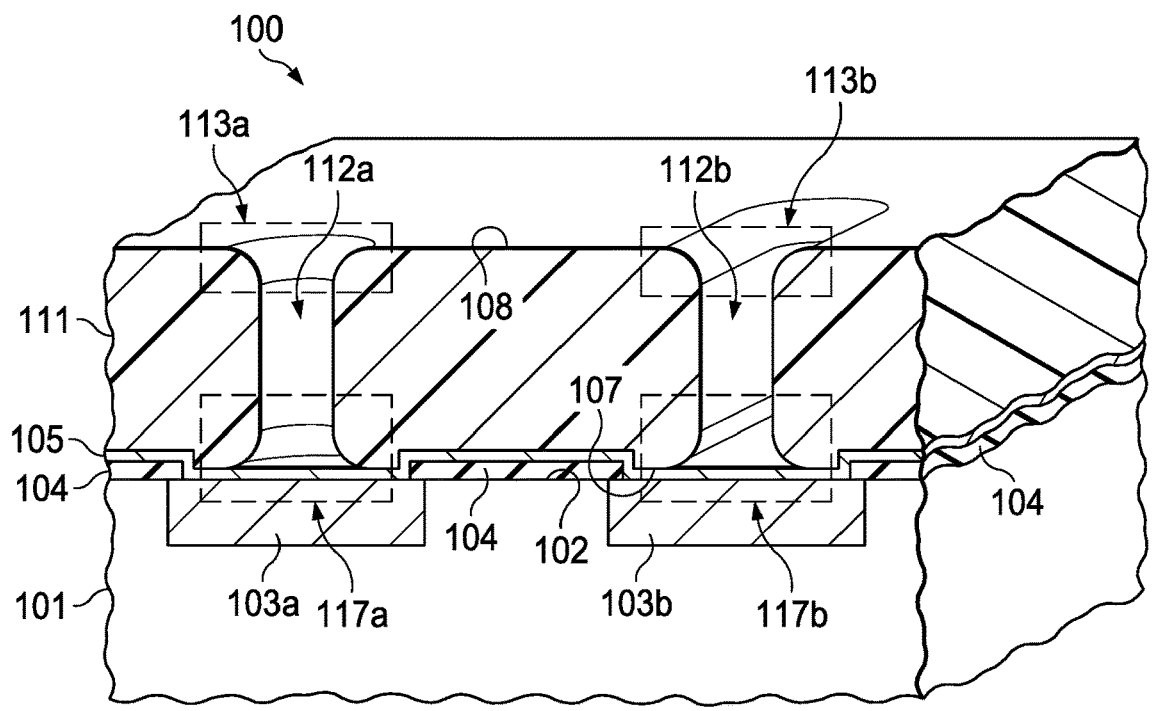
Figure 1I:
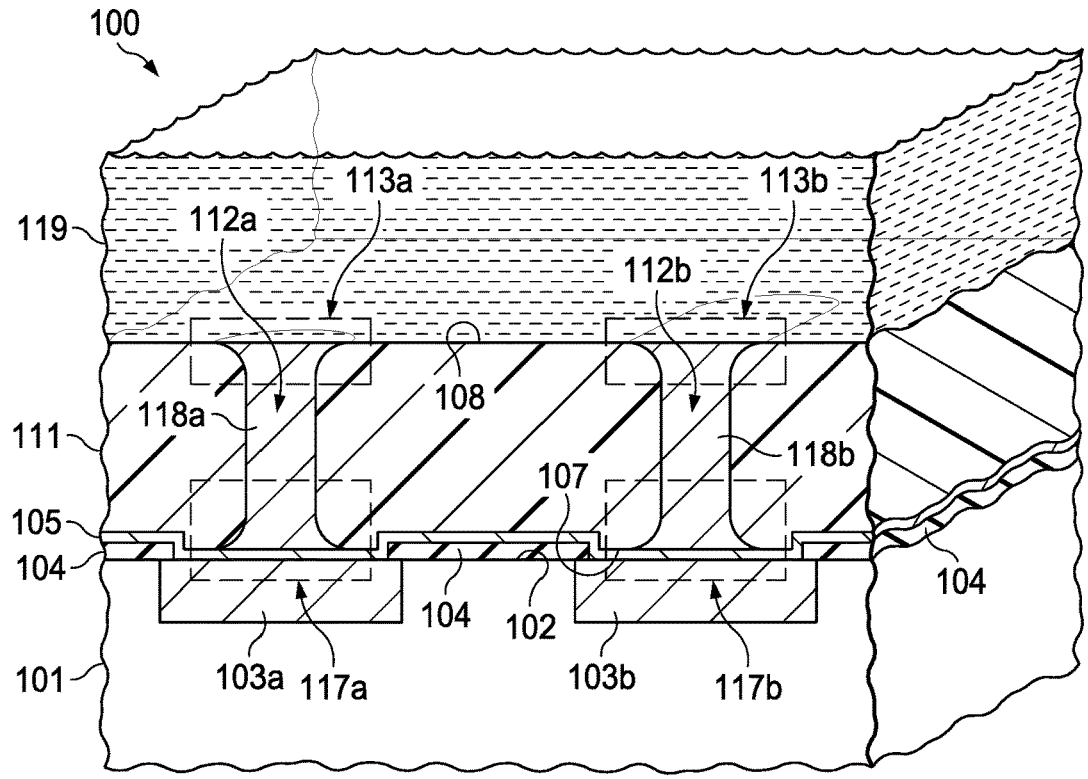
Figure 1J:
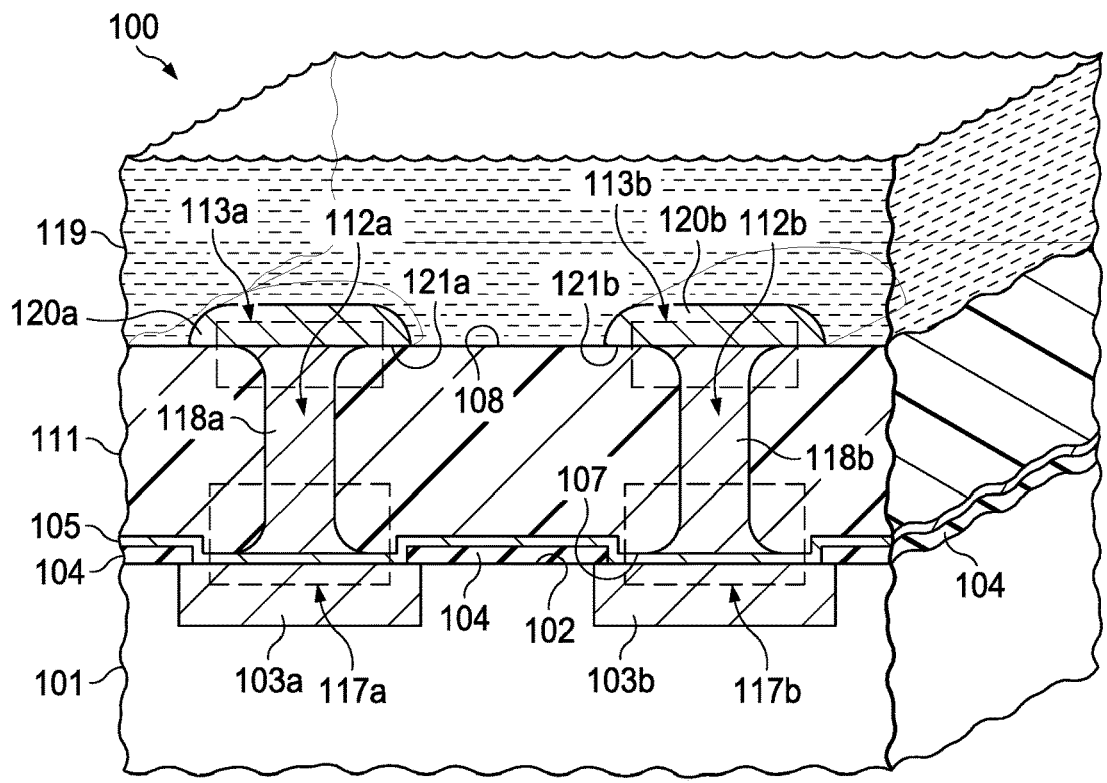
Figure 1K:
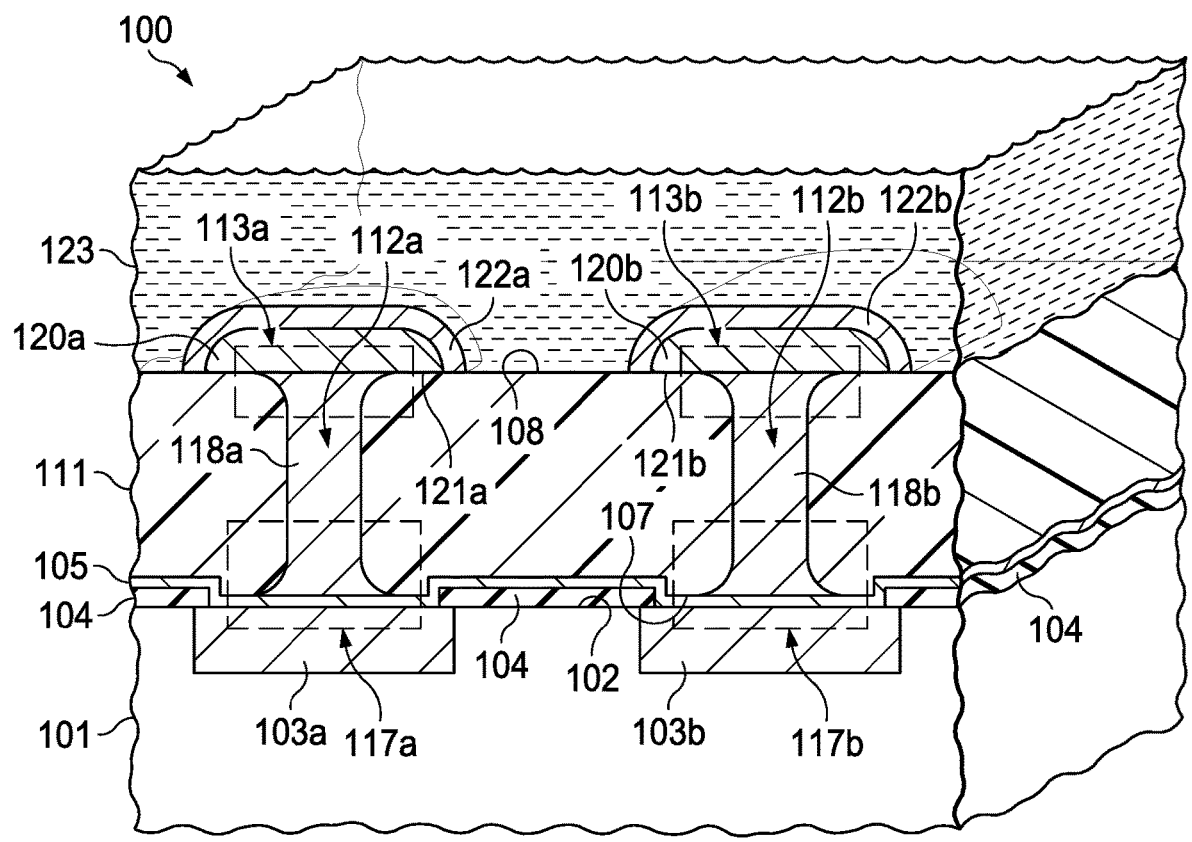
Figure 1L:
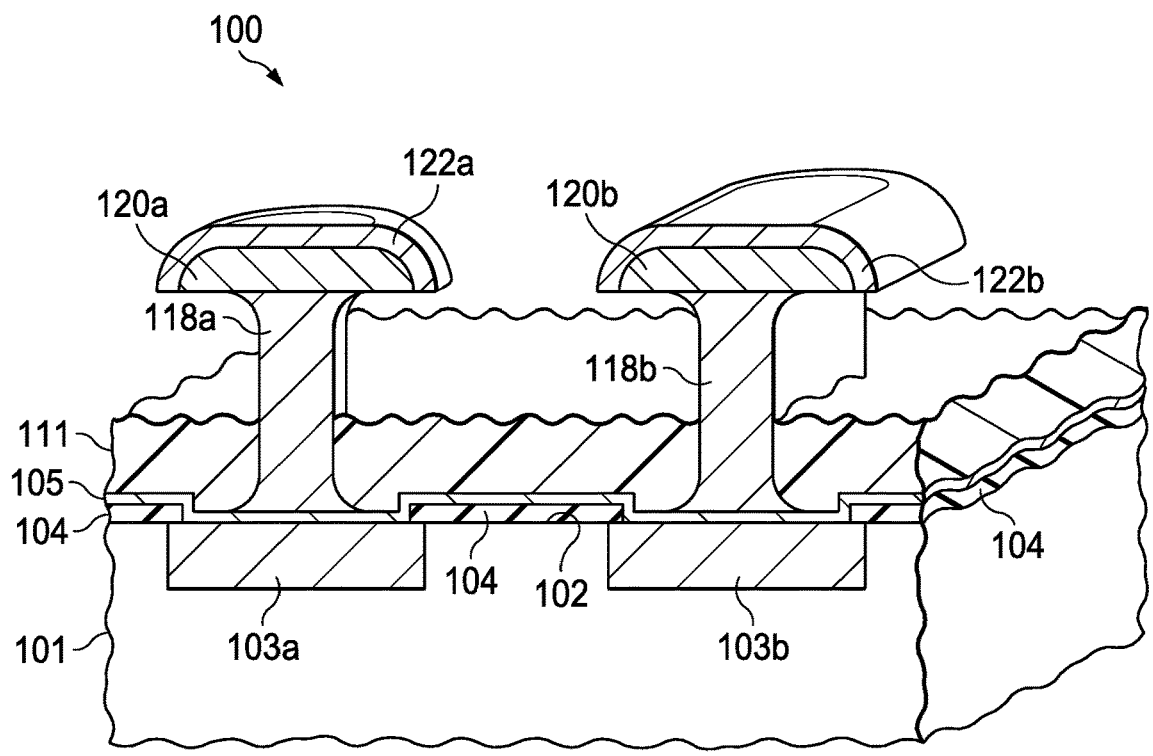
Figure 1M:
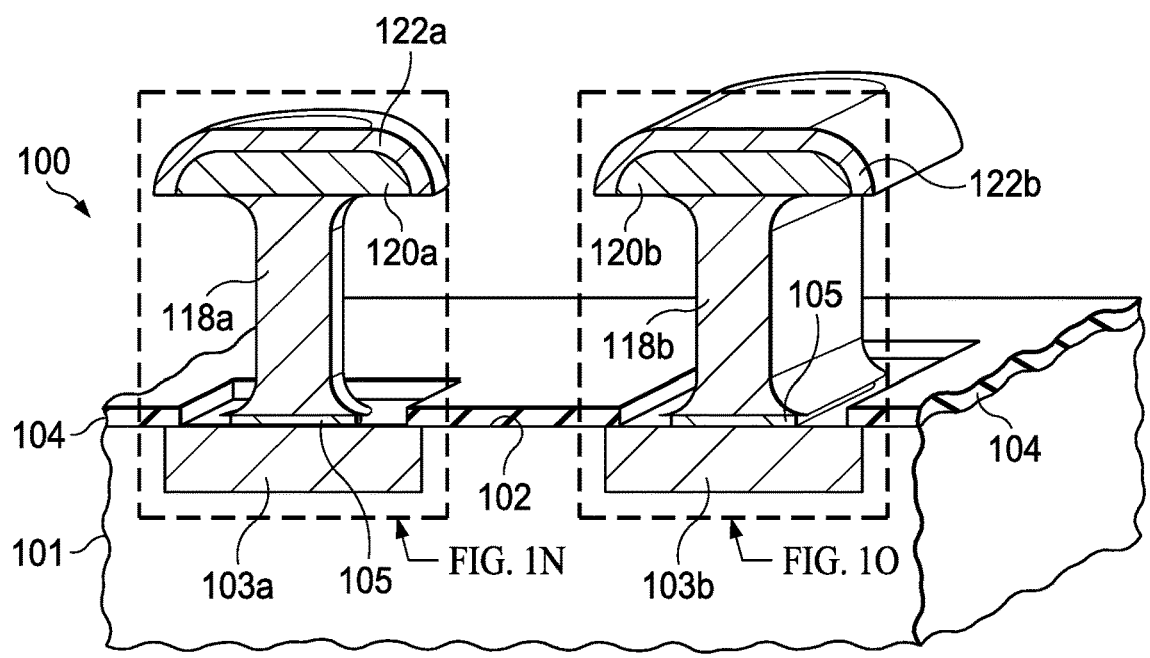
Figure 1N:
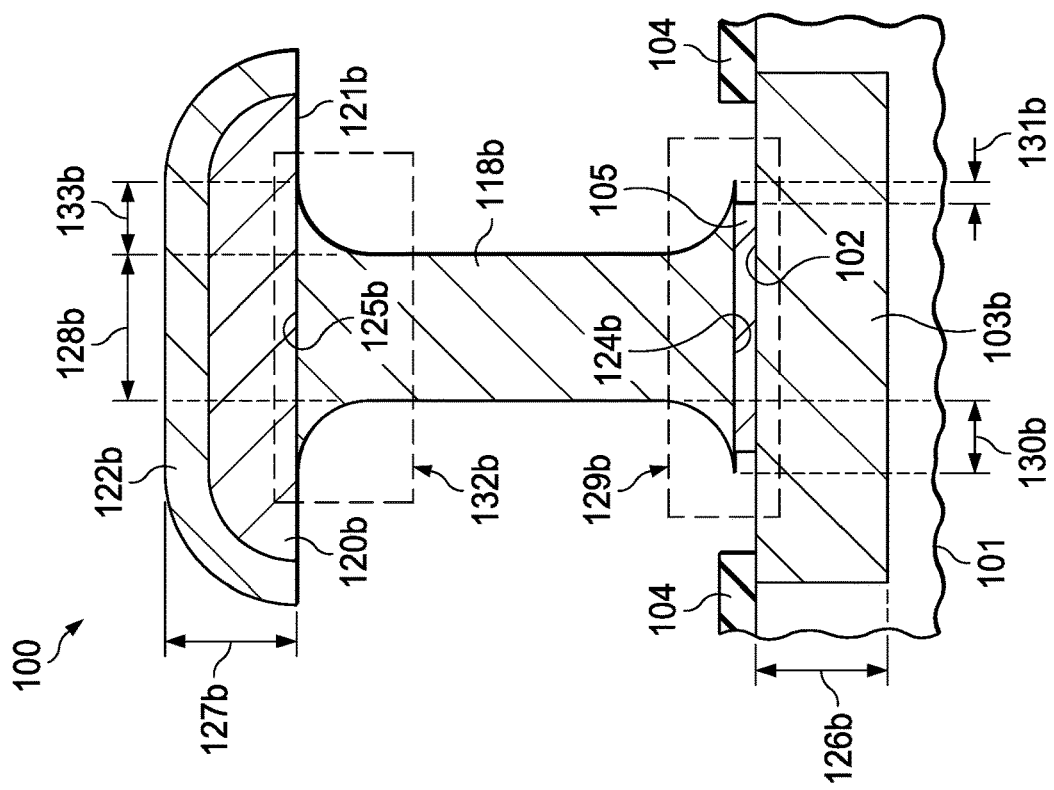
Figure 1O:
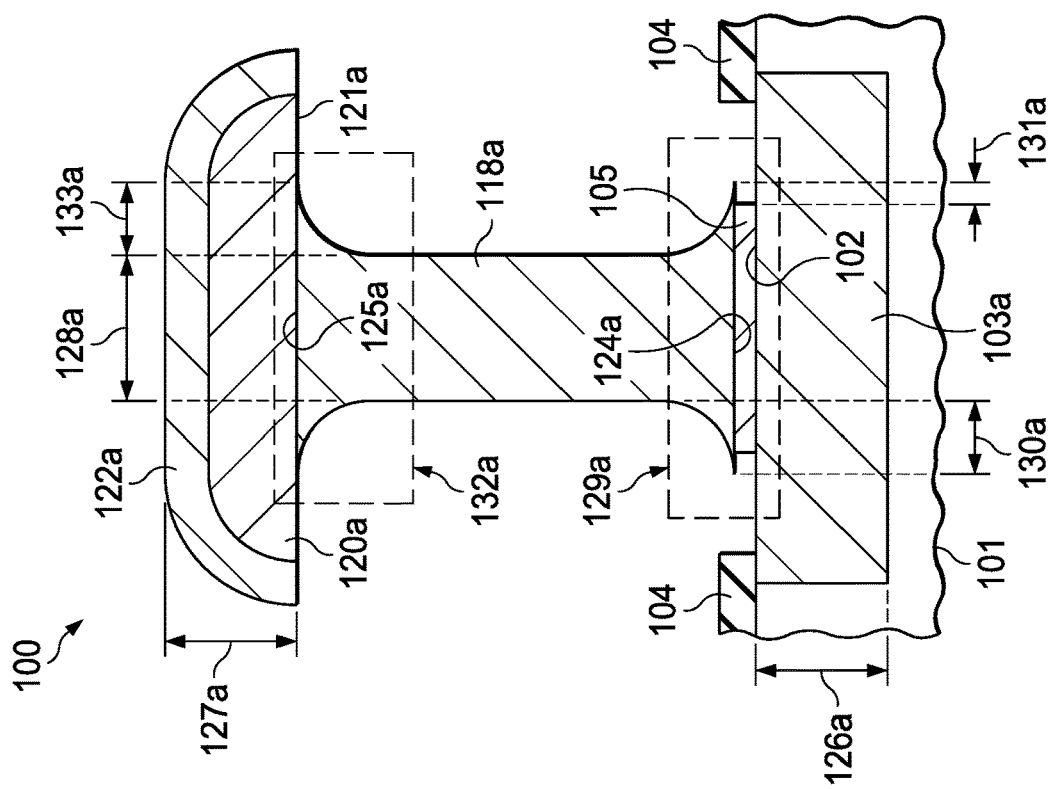

FIG. 1A through FIG. 1O are cross sections of an example microelectronic device, depicted in stages of an example method of formation. Referring to FIG. 1A, the microelectronic device 100 includes a die 101. The die 101 may be implemented as an integrated circuit, a discrete semiconductor device, a micro electromechanical system (MEMS) device, an electro-optical device, a micro optomechanical system device, or a microfluidics device, for example. The die 101 may be part of a workpiece, not shown in FIG. 1A, such as a semiconductor wafer or MEMS substrate, that includes additional die. Alternatively, the die 101 may be a single die, optionally attached to a carrier or holder. The die 101 has a connection surface 102.

The microelectronic device 100 includes a first die conductor 103a and a second die conductor 103b at the connection surface 102. The first die conductor 103a and the second die conductor 103b are electrically conductive. The first die conductor 103a and the second die conductor 103b may include, by way of example, aluminum, copper, platinum, gold, palladium, or nickel. In this example, the first die conductor 103a and the second die conductor 103b extend partway into the die 101, and extend partway past the connection surface 102 out of the die 101, as depicted in FIG. 1A. The microelectronic device 100 may optionally include a protective overcoat (PO) layer 104 over the connection surface 102. The PO layer 104 is electrically non-conductive, and may include silicon dioxide, silicon nitride, silicon oxy-nitride, aluminum oxide, or other dielectric material. The PO layer 104 may extend partway onto the first die conductor 103a and the second die conductor 103b, as depicted in FIG. 1A.

A die interface layer 105 is formed over the die 101, the first die conductor 103a, and the second die conductor 103b, and over the PO layer 104, if present. The die interface layer 105 contacts the first die conductor 103a and the second die conductor 103b. The die interface layer 105 has a different composition from the first die conductor 103a and the second die conductor 103b. The die interface layer 105 is electrically conductive, and may include an adhesion sublayer contacting the first die conductor 103a and the second die conductor 103b, a barrier sublayer on the adhesion sublayer, and a plating seed layer on the barrier layer. The adhesion sublayer may include titanium, tungsten, or tantalum, and may provide adhesion to the PO layer 104 and a low resistance electrical connection to the first die conductor 103a and the second die conductor 103b. The barrier sublayer may include nickel, cobalt, or molybdenum, and may reduce metal diffusion from a subsequently-formed first pillar 118a and a subsequently-formed second pillar 118b, shown in FIG. 1I, into the die 101. The plating seed sublayer may include copper, zinc, or nickel, and may provide a suitable surface to facilitate a pillar plating operation used to form the first pillar 118a and the second pillar 118b. The die interface layer 105 may be formed by a sequence of sputter processes, evaporation processes, or other metal thin film formation processes. The die interface layer 105 may have a thickness of 100 nanometers to 5 microns, by way of example.

Referring to FIG. 1B, a photoresist layer 106 is formed over the die interface layer 105. The photoresist layer 106 may include positive tone photoresist, and may be formed by a spin coat process. In this example, the photoresist layer 106 is formed to have a thickness equal to a thickness of the subsequently-formed first pillar 118a and second pillar 118b, which may be 10 microns to 200 microns, by way of example. The photoresist layer 106 has a die-side surface 107 adjacent to the die 101, and a head-side surface 108, located opposite from the die-side surface 107.

A photomask 109 is provided which has light-transmitting geometries corresponding to areas for the subsequently-formed first pillar 118a and the subsequently-formed second pillar 118b. The photomask 109 is positioned over the head-side surface 108 of the photoresist layer 106 so that the light-transmitting geometries are aligned to the areas for the subsequently-formed first pillar 118a and second pillar 118b. The photomask 109 is illuminated with ultraviolet (UV) light 110, which passes through the light-transmitting geometries to expose the photoresist layer 106 in the areas for the subsequently-formed first pillar 118a and second pillar 118b.

Referring to FIG. 1C, a develop process is performed which exposes the photoresist layer 106 of FIG. 1B to a developer solution, such as an aqueous alkaline solution. The developer solution dissolves photoresist exposed by the UV light 110 of FIG. 1B, leaving the remaining photoresist layer 106 to form a pillar plating mask 111 with a first pillar hole 112a in the area for the first pillar 118a and a second pillar hole 112b in the area for the second pillar 118b. The first pillar hole 112a and the second pillar hole 112b extend through the pillar plating mask 111 from the die-side surface 107 to the head-side surface 108. The die interface layer 105 is exposed by the first pillar hole 112a and the second pillar hole 112b. Residual organic material from the develop process on the die interface layer 105 in the first pillar hole 112a and the second pillar hole 112b may be removed by a plasma process such as an oxygen cold plasma process or a hydrogen cold plasma process. Cold plasma processes to remove the residual organic material may advantageously be performed at room temperature and atmospheric pressure, obviating a need for a dedicated vacuum process chamber.

Referring to FIG. 1D, a first head-side flare 113a is formed in the pillar plating mask 111 around the first pillar hole 112a at the head-side surface 108 of the pillar plating mask 111. A second head-side flare 113b is formed in the pillar plating mask 111 around the second pillar hole 112b at the head-side surface 108. The first head-side flare 113a and the second head-side flare 113b may be formed by ablating material from the pillar plating mask 111 in a laser ablation process using a laser 114, as depicted in FIG. 1D. Other micromachining processes for forming the first head-side flare 113a and the second head-side flare 113b, such as ultrasonic micromachining processes, are within the scope of this example. Lateral dimensions of the first pillar hole 112a increase progressively along the first head-side flare 113a toward the head-side surface 108. Similarly, lateral dimensions of the second pillar hole 112b increase progressively along the second head-side flare 113b toward the head-side surface 108, as depicted in FIG. 1D.

Referring to FIG. 1E, a solvent 115 is dispensed into the first pillar hole 112a and the second pillar hole 112b. The solvent 115 is dispensed so as to fill the first pillar hole 112a and the second pillar hole 112b partway, as depicted in FIG. 1E. The solvent 115 may fill the first pillar hole 112a and the second pillar hole 112b to depths of one-fourth to one half of the distance from the die-side surface 107 to the head-side surface 108, by way of example. The solvent 115 may be dispensed directly into the first pillar hole 112a and the second pillar hole 112b, to attain desired levels of the solvent 115 in the first pillar hole 112a and the second pillar hole 112b. The solvent 115 may be dispensed by a liquid drop-on-demand dispenser 116, for example. Alternatively, the solvent may be dispensed by a spray operation in a controlled pattern. FIG. 1E depicts the microelectronic device 100 immediately after the solvent 115 is dispensed into the first pillar hole 112a and the second pillar hole 112b.

Referring to FIG. 1F, the solvent 115 dissolves material in the pillar plating mask 111. The solvent 115 has a sufficiently high volatility that a portion of the solvent 115 in the first pillar hole 112a and the second pillar hole 112b evaporates as the material in the pillar plating mask 111 is dissolved, lowering surfaces of the solvent 115 in the first pillar hole 112a and the second pillar hole 112b. Evaporation of the solvent 115 from the first pillar hole 112a and the second pillar hole 112b may be facilitated by flowing an ambient, such as air, over the microelectronic device 100. As the surfaces of the solvent 115 in the first pillar hole 112a and the second pillar hole 112b are lowered, dissolution of the pillar plating mask 111 above the surfaces of the solvent 115 ceases, while dissolution of the pillar plating mask 111 below the surfaces of the solvent 115, that is, in contact with the solvent 115, continues. By this method, more material in the pillar plating mask 111 is dissolved proximate to the die-side surface 107 than higher in the pillar plating mask 111, forming a first die-side flare 117a in the pillar plating mask 111 around the first pillar hole 112a at the die-side surface 107 of the pillar plating mask 111. Similarly, a second die-side flare 117b is formed in the pillar plating mask 111 around the second pillar hole 112b at the die-side surface 107 of the pillar plating mask 111. FIG. 1F depicts formation of the first die-side flare 117a and the second die-side flare 117b partway to completion.

Referring to FIG. 1G, formation of the first die-side flare 117a in the pillar plating mask 111 around the first pillar hole 112a at the die-side surface 107 and formation of the second die-side flare 117b in the pillar plating mask 111 around the second pillar hole 112b at the die-side surface 107 is continued by concurrent dissolution of the material of the pillar plating mask 111 and evaporation of the solvent 115. FIG. 1G depicts formation of the first die-side flare 117a and the second die-side flare 117b at completion.

Referring to FIG. 1H, the solvent 115 of FIG. 1G is removed from the first pillar hole 112a and the second pillar hole 112b, leaving the pillar plating mask 111 in place with the first die-side flare 117a and the first head-side flare 113a around the first pillar hole 112a, and the second die-side flare 117b and the second head-side flare 113b around the second pillar hole 112b. The solvent 115 may be removed by a rinse operation using another solvent which mixes with the solvent 115 and does not dissolve the pillar plating mask 111, such as an alcohol rinse, followed by a drying operation.

Referring to FIG. 1I, the first pillar 118a and the second pillar 118b are formed in the first pillar hole 112a and the second pillar hole 112b, respectively. In this example, the first pillar 118a and the second pillar 118b are formed by a pillar plating operation using a pillar plating bath 119. The pillar plating bath 119 may be implemented as an electroplating bath or as an electroless bath. In one version of this example, the pillar plating bath 119 may include copper ions with no other metals other than trace amounts, so that the first pillar 118a and the second pillar 118b have more than 95 weight percent copper, which may advantageously provide low electrical resistances in the first pillar 118a and the second pillar 118b at low cost and using a simplified plating process. In another version, the pillar plating bath 119 may include copper ions with one or more additional metal ion species, such as nickel ions or gold ions, so that the first pillar 118a and the second pillar 118b include at least 50 weight percent copper with a mixture of the additional metals, which may advantageously provide the first pillar 118a and the second pillar 118b with more corrosion resistance than pure copper. Other implementations of the pillar plating bath 119, such as a bath having more gold or nickel than copper, are within the scope of this example. The first pillar 118a and the second pillar 118b are formed directly on the die interface layer 105, so that the first pillar 118a and the second pillar 118b are electrically coupled to the first die conductor 103a and the second die conductor 103b, respectively, through the die interface layer 105. The die interface layer 105 has a different composition from the first pillar 118a and the second pillar 118b.

In this example, the pillar plating operation is continued until the first pillar 118a and the second pillar 118b fill the first pillar hole 112a and the second pillar hole 112b, respectively. In particular, the first pillar 118a fills the first die-side flare 117a and the first head-side flare 113a, and the second pillar 118b fills the second die-side flare 117b and the second head-side flare 113b, as depicted in FIG. 1I. Top surfaces of the first pillar 118a and the second pillar 118b may be coplanar with the head-side surface 108, as depicted in FIG. 1I.

Referring to FIG. 1J, a first head 120a is formed on the first pillar 118a, and a second head 120b is formed on the second pillar 118b. The first head 120a and the second head 120b may be formed by continuing the pillar plating operation of FIG. 1H using the same pillar plating bath 119, as depicted in FIG. 1J, so that the first head 120a and the second head 120b have compositions similar to compositions of the first pillar 118a and the second pillar 118b. In this case, a boundary between the first head 120a and the first pillar 118a may be difficult to discern by examination, and similarly for a boundary between the second head 120b and the second pillar 118b. The boundary between the first head 120a and the first pillar 118a may be taken to be coplanar with a first bottom surface 121a of the first head 120a outward of the first pillar 118a, as indicated in FIG. 1J by the dashed line at the boundary between the first head 120a and the first pillar 118a. Similarly, the boundary between the second head 120b and the second pillar 118b may be taken to be coplanar with a second bottom surface 121b of the second head 120b outward of the second pillar 118b, as indicated in FIG. 1J by the dashed line at the boundary between the second head 120b and the second pillar 118b. Alternatively, the first head 120a and the second head 120b may be formed by a different plating operation using a different plating bath. The first head 120a extends above the first pillar 118a and laterally past the first pillar 118a in all directions in this example. Similarly, the second head 120b extends above the second pillar 118b and laterally past the second pillar 118b in all directions.

Referring to FIG. 1K, a first barrier layer 122a is formed on the first head 120a, and a second barrier layer 122b is formed on the second head 120b. The first barrier layer 122a and the second barrier layer 122b may include metals which reduce diffusion of copper from the first head 120a and the second head 120b into subsequently-formed solder joints on the first barrier layer 122a and the second barrier layer 122b when the microelectronic device 100 is attached to a substrate such as a lead frame or a printed circuit board. The first barrier layer 122a and the second barrier layer 122b may include nickel, cobalt, or molybdenum, and may have thicknesses of 1 micron to 10 microns, by way of example. The first barrier layer 122a and the second barrier layer 122b may be formed by a second plating operation using a second plating bath 123. Other methods of forming the first barrier layer 122a and the second barrier layer 122b are within the scope of this example.

Referring to FIG. 1L, the pillar plating mask 111 is removed. The pillar plating mask 111 may be removed by a dry process such as a cold plasma process using oxygen or hydrogen, for example. FIG. 1L depicts removal of the pillar plating mask 111 partway to completion. Removal of the pillar plating mask 111 leaves the first pillar 118a, the first head 120a, the second pillar 118b, and the second head 120b in place.

Referring to FIG. 1M, the die interface layer 105 is removed where exposed by the first pillar 118a and the second pillar 118b. The die interface layer 105 may be removed by a wet etch process for a prescribed time duration, so that undercut of the die interface layer 105 with respect to the first pillar 118a and the second pillar 118b is less than a target value, and so that etching of the first pillar 118a, the first head 120a, the second pillar 118b, and the second head 120b is less than a target value. A composition of the wet etch process may be dependent on a composition of the die interface layer 105. Copper in the die interface layer 105 may be removed by an aqueous solution of hydrochloric acid and ferric chloride. Nickel in the die interface layer 105 may be removed by an aqueous solution of nitric acid, acetic acid, and sulfuric acid. Titanium in the die interface layer 105 may be removed by an aqueous solution of dilute hydrofluoric acid and hydrogen peroxide. Tungsten in the die interface layer 105 may be removed by a heated aqueous solution of at least 25 percent hydrogen peroxide solution. FIG. 1M depicts the microelectronic device 100 after removal of the die interface layer 105 is completed.

FIG. 1N is a cross section of the microelectronic device 100 through the first pillar 118a. The first pillar 118a has a first die end 124a coupled to the first die conductor 103a. In this example, the first die end 124a is coupled to the first die conductor 103a through the die interface layer 105. The first pillar 118a has a first head end 125a coupled to the first head 120a. In this example, the first head end 125a is directly connected to the first head 120a.

The first die conductor 103a has a first die conductor thickness 126a, which is a dimension of the first die conductor 103a in a direction perpendicular to the connection surface 102, at a point of overlap between the first die conductor 103a and an edge of the first pillar 118a at the first die end 124a. The first head 120a has a first head thickness 127a, which is a dimension of the first head 120a in a direction perpendicular to the connection surface 102, at a point of overlap between the first head 120a and an edge of the first pillar 118a at the first head end 125a. The first pillar 118a has a first pillar width 128a, which is a minimum dimension of the first pillar 118a in a direction parallel to the connection surface 102, midway between the first die end 124a and the first head end 125a.

The first pillar 118a has a first die-side flared end 129a at the first die end 124a. The first pillar 118a widens progressively along the first die-side flared end 129a toward the first die end 124a. The first die-side flared end 129a extends outward, at the first die end 124a, from a surface of the first pillar 118a midway between the first die end 124a and the first head end 125a, by a first die-side flare extension 130a. The first die-side flare extension 130a is greater than a lesser of half the first die conductor thickness 126a and half the first pillar width 128a, to reduce a current density in the first pillar 118a at the first die end 124a, to provide a measureable improvement in reliability of the first pillar 118a. The die interface layer 105 may be recessed, that is, undercut, with respect to an edge of the first pillar 118a at the first die end 124a, as depicted in FIG. 1N, by a first die-side undercut 131a, which is a distance between an edge of the die interface layer 105 and the edge of the first pillar 118a at the first die end 124a. If the die interface layer 105 is recessed from an edge of the first pillar 118a, the first die-side undercut 131a is less than half the first die-side flare extension 130a, to retain the advantage of reducing the current density in the first pillar 118a to provide a measureable improvement in reliability of the first pillar 118a. The first die conductor 103a extends past the first pillar 118a in a first lateral direction parallel to the connection surface 102.

The first pillar 118a has a first head-side flared end 132a at the first head end 125a of the first pillar 118a. The first pillar 118a widens progressively along the first head-side flared end 132a toward the first head end 125a. The first head-side flared end 132a extends outward at the first head end 125a, from the surface of the first pillar 118a midway between the first die end 124a and the first head end 125a, by a first head-side flare extension 133a that is greater than a lesser of half the first head thickness 127a and half the first pillar width 128a, to reduce a current density in the first pillar 118a at the first head end 125a, to provide a measureable improvement in reliability of the first pillar 118a. The first head-side flare extension 133a may be different from the first die-side flare extension 130a. The first head 120a extends past the first pillar 118a in a second lateral direction parallel to the connection surface 102. The second lateral direction may be in a different direction than the first lateral direction. In this example, the first bottom surface 121a of the first head 120a extends past the first pillar 118a in all directions parallel to the connection surface 102.

FIG. 1O is a cross section of the microelectronic device 100 through the second pillar 118b. The second pillar 118b has a second die end 124b coupled to the second die conductor 103b. In this example, the second die end 124b is coupled to the second die conductor 103b through the die interface layer 105. The second pillar 118b has a second head end 125b coupled to the second head 120b. In this example, the second head end 125b is directly connected to the second head 120b.

The second die conductor 103b has a second die conductor thickness 126b, which is a dimension of the second die conductor 103b in a direction perpendicular to the connection surface 102, at a point of overlap between the second die conductor 103b and an edge of the second pillar 118b at the second die end 124b. The second die conductor thickness 126b of the second die conductor 103b may be different from the first die conductor thickness 126a of the first die conductor 103a of FIG. 1N.

The second head 120b has a second head thickness 127b, which is a dimension of the second head 120b in a direction perpendicular to the connection surface 102, at a point of overlap between the second head 120b and an edge of the second pillar 118*b* at the second head end 125*b*. The second head thickness 127*b* of the second head 120*b* may be different from the first head thickness 127*a* of the first head 120*a* of FIG. 1N.

The second pillar 118*b* has a second pillar width 128*b*, which is a minimum dimension of the second pillar 118*b* in a direction parallel to the connection surface 102, midway between the second die end 124*b* and the second head end 125*b*. The second pillar width 128*b* of the second pillar 118*b* may be different from the first pillar width 128*a* of the first pillar 118*a* of FIG. 1N.

The second pillar 118*b* has a second die-side flared end 129*b* at the second die end 124*b*. The second pillar 118*b* widens progressively along the second die-side flared end 129*b* toward the second die end 124*b*. The second die-side flared end 129*b* extends outward, at the second die end 124*b*, from a surface of the second pillar 118*b* midway between the second die end 124*b* and the second head end 125*b*, by a second die-side flare extension 130*b*. The second die-side flare extension 130*b* is greater than a lesser of half the second die conductor thickness 126*b* and half the second pillar width 128*b*, to reduce a current density in the second pillar 118*b* at the second die end 124*b*, to provide a measureable improvement in reliability of the second pillar 118*b*. The die interface layer 105 may be recessed, that is, undercut, with respect to an edge of the second pillar 118*b* at the second die end 124*b*, as depicted in FIG. 1O, by a second die-side undercut 131*b*, which is a distance between an edge of the die interface layer 105 and the edge of the second pillar 118*b* at the second die end 124*b*. If the die interface layer 105 is recessed from an edge of the second pillar 118*b*, the second die-side undercut 131*b* is less than half the second die-side flare extension 130*b*, to retain the advantage of reducing the current density in the second pillar 118*b* to provide a measureable improvement in reliability of the second pillar 118*b*. The second die-side flare extension 130*b* of the second pillar 118*b* may be different from the first die-side flare extension 130*a* of the first pillar 118*a* of FIG. 1N. The second die conductor 103*b* extends past the second pillar 118*b* in a third lateral direction parallel to the connection surface 102.

The second pillar 118*b* has a second head-side flared end 132*b* at the second head end 125*b* of the second pillar 118*b*. The second pillar 118*b* widens progressively along the second head-side flared end 132*b* toward the second head end 125*b*. The second head-side flared end 132*b* extends outward at the second head end 125*b*, from the surface of the second pillar 118*b* midway between the second die end 124*b* and the second head end 125*b*, by a second head-side flare extension 133*b* that is greater than a lesser of half the second head thickness 127*b* and half the second pillar width 128*b*, to reduce a current density in the second pillar 118*b* at the second head end 125*b*, to provide a measureable improvement in reliability of the second pillar 118*b*. The second head-side flare extension 133*b* of the second pillar 118*b* may be different from the first head-side flare extension 133*a* of the first pillar 118*a* of FIG. 1N. The second head-side flare extension 133*b* may be different from the second die-side flare extension 130*b*. The second head 120*b* extends past the second pillar 118*b* in a fourth lateral direction parallel to the connection surface 102. The fourth lateral direction may be in a different direction than the third lateral direction. In this example, the second bottom surface 121*b* of the second head 120*b* extends past the second pillar 118*b* in all directions parallel to the connection surface 102.

Figure 2A:
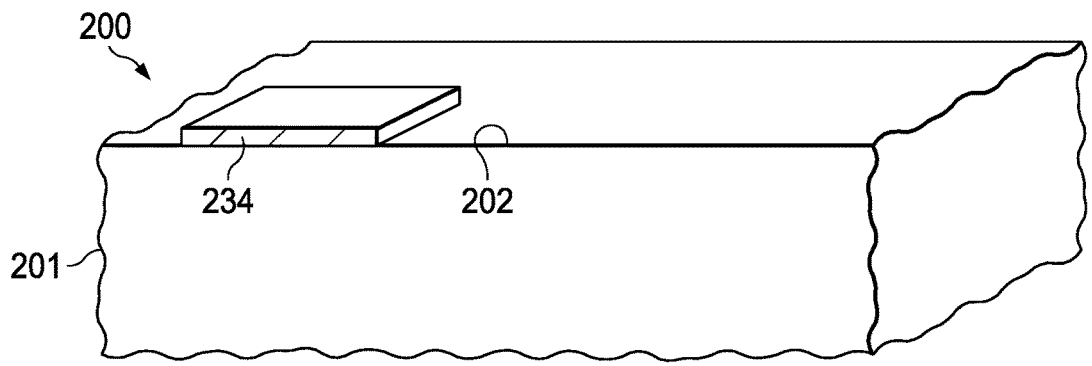
FIG. 2A through FIG. 2K are cross sections of another example microelectronic device, depicted in stages of another example method of formation.

FIG. 2A through FIG. 2K are cross sections of another example microelectronic device, depicted in stages of another example method of formation. Referring to FIG. 2A, the microelectronic device 200 includes a die 201. The die 201 may be implemented as any of the device types disclosed in reference to the die 101 of FIG. 1A. The die 201 may be part of a workpiece, not shown in FIG. 2A, that includes additional die. Alternatively, the die 201 may be a single die. The die 201 has a connection surface 202. The die includes a terminal 234 at the connection surface 202. The terminal 234 is electrically conductive. The terminal 234 may be implemented as a bond pad or an exposed portion of a top level interconnect, for example.

Figure 2B:
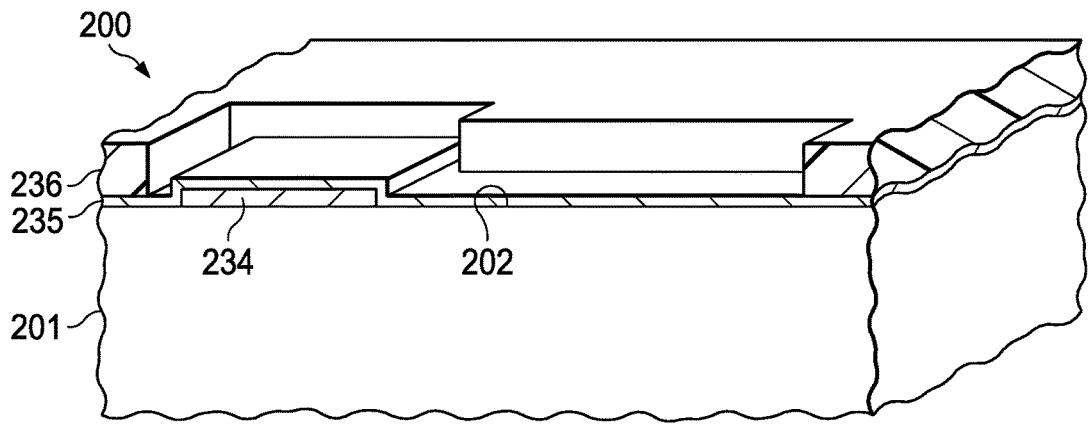

Referring to FIG. 2B, a lower interface layer 235 is formed over the connection surface 202 and the terminal 234, making electrical contact to the terminal 234. The lower interface layer 235 is electrically conductive. The lower interface layer 235 may include, for example, an adhesion sublayer contacting the die 201 and the terminal 234, and a plating seed sublayer over the adhesion sublayer. The adhesion sublayer may include titanium or tungsten, to provide adhesion to the die 201 and the terminal 234. The plating seed sublayer may include copper, zinc, or nickel, and may provide a suitable surface to facilitate a die conductor plating operation used to form a die conductor 203, shown in FIG. 2C. The lower interface layer 235 may be formed by one or more sputter processes, evaporation processes, or other metal thin film formation processes.

A die conductor plating mask 236 is formed over the lower interface layer 235, exposing an area for the die conductor 203. The die conductor plating mask 236 may include photoresist, and may be formed by a photolithographic process. Alternatively, the die conductor plating mask 236 may include a polymer material, and may be formed by an additive process such as a material extrusion process or a material jetting process, which disposes the polymer material on the lower interface layer 235.

Figure 2C:
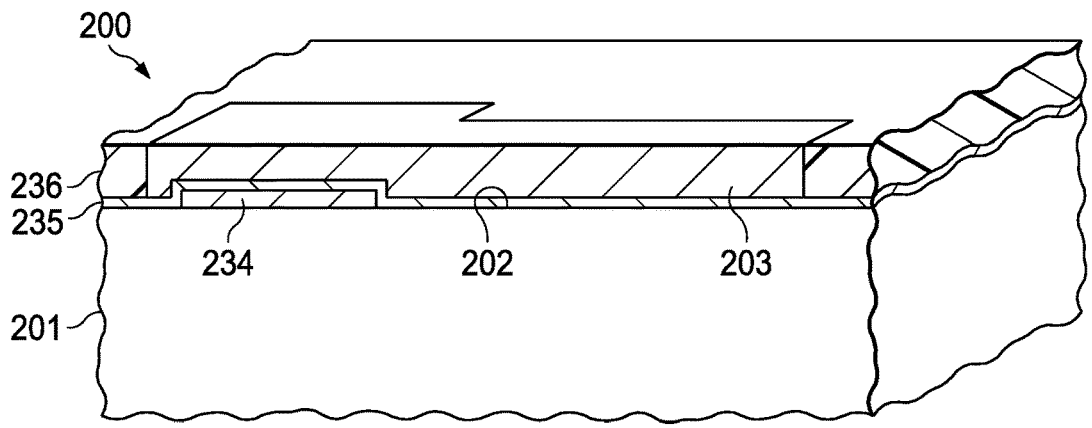

Referring to FIG. 2C, the die conductor 203 is formed on the lower interface layer 235 in the area exposed by the die conductor plating mask 236 using a plating operation. The die conductor 203 may include copper, nickel, gold, or platinum, by way of example. The die conductor 203 may have a single layer, as depicted in FIG. 2C, or may have one or more sublayers. The plating operation used to form the die conductor 203 may be implemented with an electroplating process, or with an electroless process.

Figure 2D:
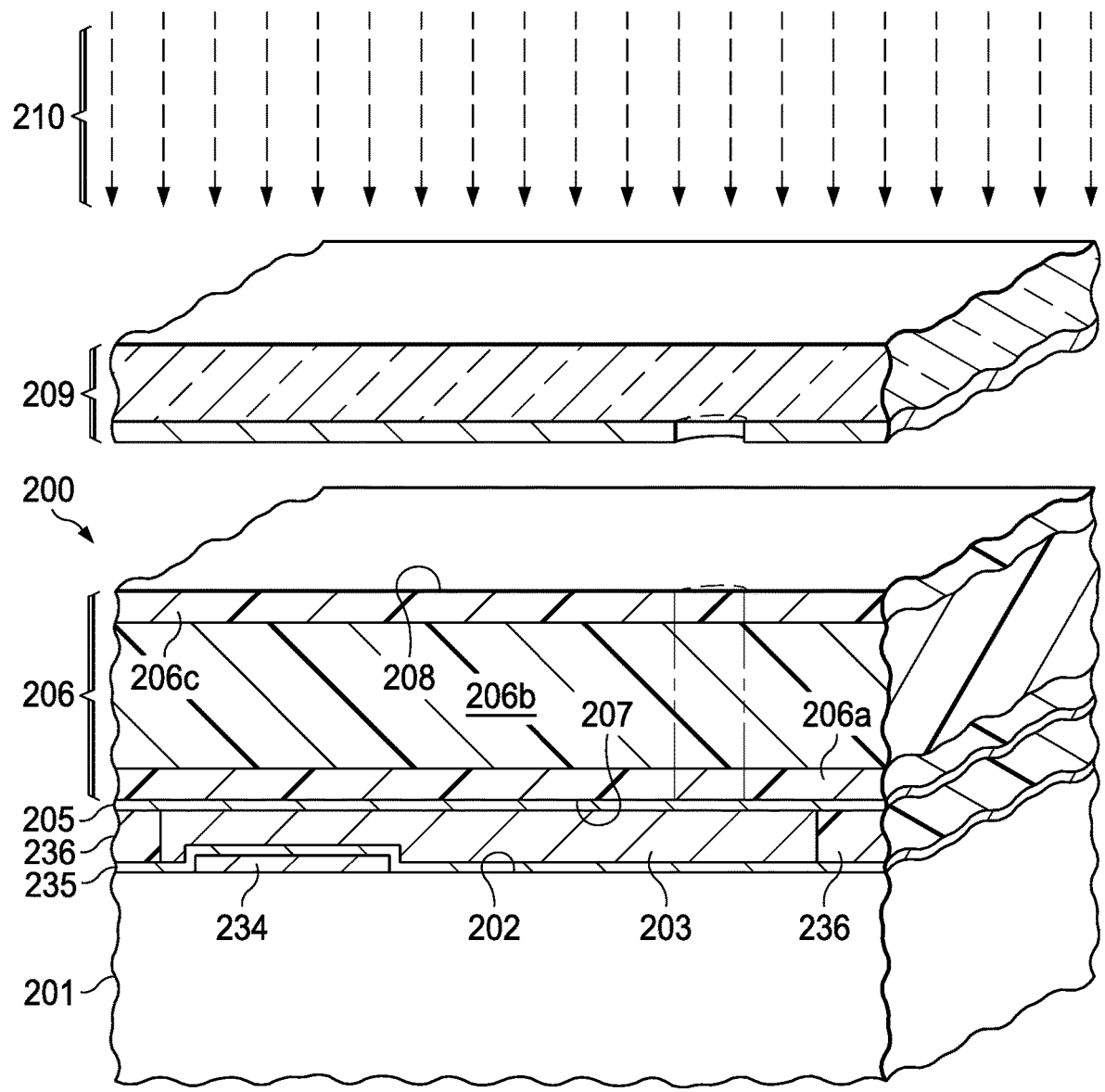

Referring to FIG. 2D, a die interface layer 205 is formed over the die conductor plating mask 236 and on the die conductor 203. The die interface layer 205 is electrically conductive, and makes electrical contact to the die conductor 203. The die interface layer 205 may have a structure and composition similar to the structure and composition disclosed in reference to the die interface layer 105 of FIG. 1A. The die interface layer 205 has a different composition from the die conductor 203.

A photoresist layer 206 is formed over the die interface layer 205. The photoresist layer 206 of this example includes a first sublayer 206*a* formed on the die interface layer 205, a second sublayer 206*b* formed on the first sublayer 206*a*, and a third sublayer 206*c* formed on the second sublayer 206*b*. The first sublayer 206*a* includes a first positive tone photoresist having a first dissolution rate in an aqueous alkaline developer. The first sublayer 206*a* may include, for example, Shipley LOL or LOR photoresist, and may be formed by a first spin coat process. The second sublayer 206*b* includes a second positive tone photoresist having a second dissolution rate in the aqueous alkaline developer which is less than the first dissolution rate of the first sublayer 206*a*. The second sublayer 206*b* may include, for example, AZ5214 photoresist, and may be formed by a second spin coat process. The third sublayer 206c includes a third positive tone photoresist having a third dissolution rate in the aqueous alkaline developer which is greater than the second dissolution rate of the second sublayer 206b, and may be comparable to the first dissolution rate of the first sublayer 206a. The third sublayer 206c may include, for example, Shipley LOL or LOR photoresist, and may be formed by a third spin coat process. A thermal profile of the photoresist layer 206 between forming the first sublayer 206a and the second sublayer 206b may be controlled to provide some intermixing of the photoresist of the first sublayer 206a with the photoresist of and the second sublayer 206b. Similarly, a thermal profile of the photoresist layer 206 between forming the second sublayer 206b and the third sublayer 206c may be controlled to provide some intermixing of the photoresist of the second sublayer 206b with the photoresist of and the third sublayer 206c. In this example, the photoresist layer 206 is formed to have a thickness equal to a thickness of a subsequently-formed pillar 218, shown in FIG. 2F, which may be 10 microns to 200 microns, by way of example. The photoresist layer 206 has a die-side surface 207 adjacent to the die 201, and a head-side surface 208, located opposite from the die-side surface 207.

A photomask 209 is provided which has a light-transmitting geometry corresponding to an area for the subsequently-formed pillar 218. The photomask 209 is positioned over the head-side surface 208 of the photoresist layer 206 so that the light-transmitting geometry is aligned to the area for the subsequently-formed pillar 218. The photomask 209 is illuminated with UV light 210, which passes through the light-transmitting geometry to expose the photoresist layer 206 in the area for the subsequently-formed pillar 218. The first sublayer 206a, the second sublayer 206b, and the third sublayer 206c are exposed by the UV light 210 in the area for the subsequently-formed pillar 218.

Figure 2E:
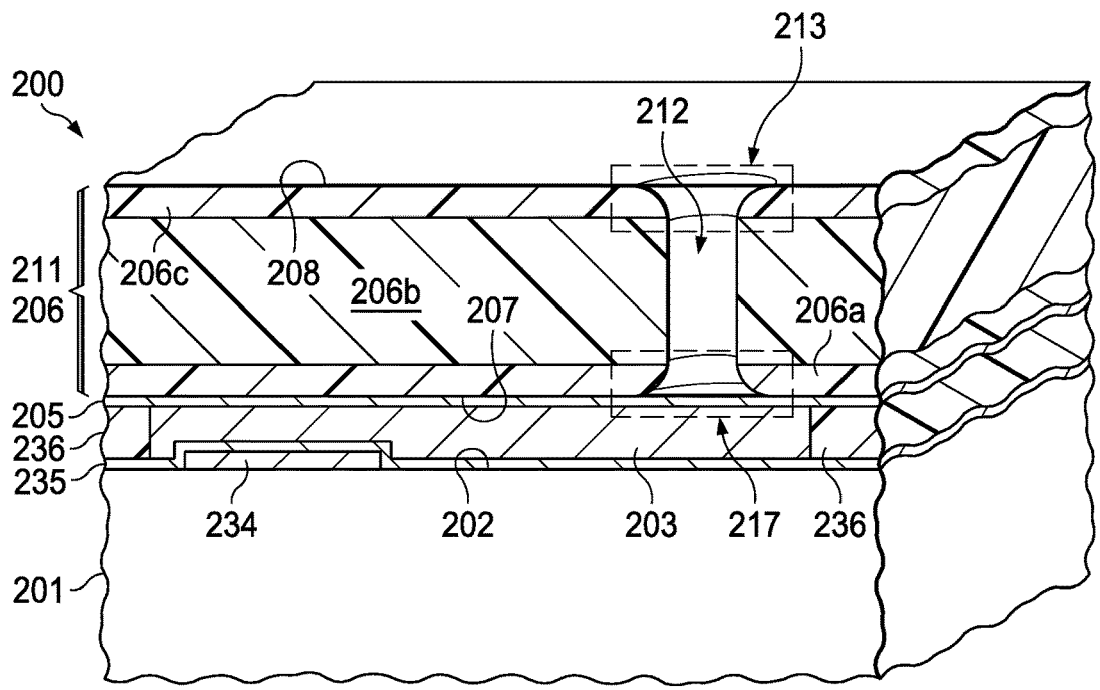

Referring to FIG. 2E, a develop process is performed which exposes the photoresist layer 206 of FIG. 2D to a developer solution containing an aqueous alkaline solution. The developer solution dissolves photoresist exposed by the UV light 210 of FIG. 2D, leaving the remaining photoresist layer 206 to form a pillar plating mask 211 with a pillar hole 212 in the area for the pillar 218. The photoresist of the first sublayer 206a dissolves at a higher rate in the developer solution than the photoresist of the second sublayer 206b, due to the first dissolution rate of the photoresist of the first sublayer 206a being greater than the second dissolution rate of the photoresist of the second sublayer 206b, forming a die-side flare 217 in the pillar plating mask 211 around the pillar hole 212 at the die-side surface 207 of the pillar plating mask 211. Lateral dimensions of the pillar hole 212 increase progressively along the die-side flare 217 toward the die-side surface 207. Concurrently, the photoresist of the third sublayer 206c dissolves at a higher rate in the developer solution than the photoresist of the second sublayer 206b, due to the third dissolution rate of the photoresist of the third sublayer 206c being greater than the second dissolution rate of the photoresist of the second sublayer 206b, forming a head-side flare 213 in the pillar plating mask 211 around the pillar hole 212 at the head-side surface 208 of the pillar plating mask 211. Lateral dimensions of the pillar hole 212 increase progressively along the head-side flare 213 toward the head-side surface 208.

The pillar hole 212 extends through the pillar plating mask 211 from the die-side surface 207 to the head-side surface 208. The die interface layer 205 is exposed by the pillar hole 212. Residual organic material from the develop process on the die interface layer 205 in the pillar hole 212 may be removed, for example as disclosed in reference to FIG. 1C.

Figure 2F:
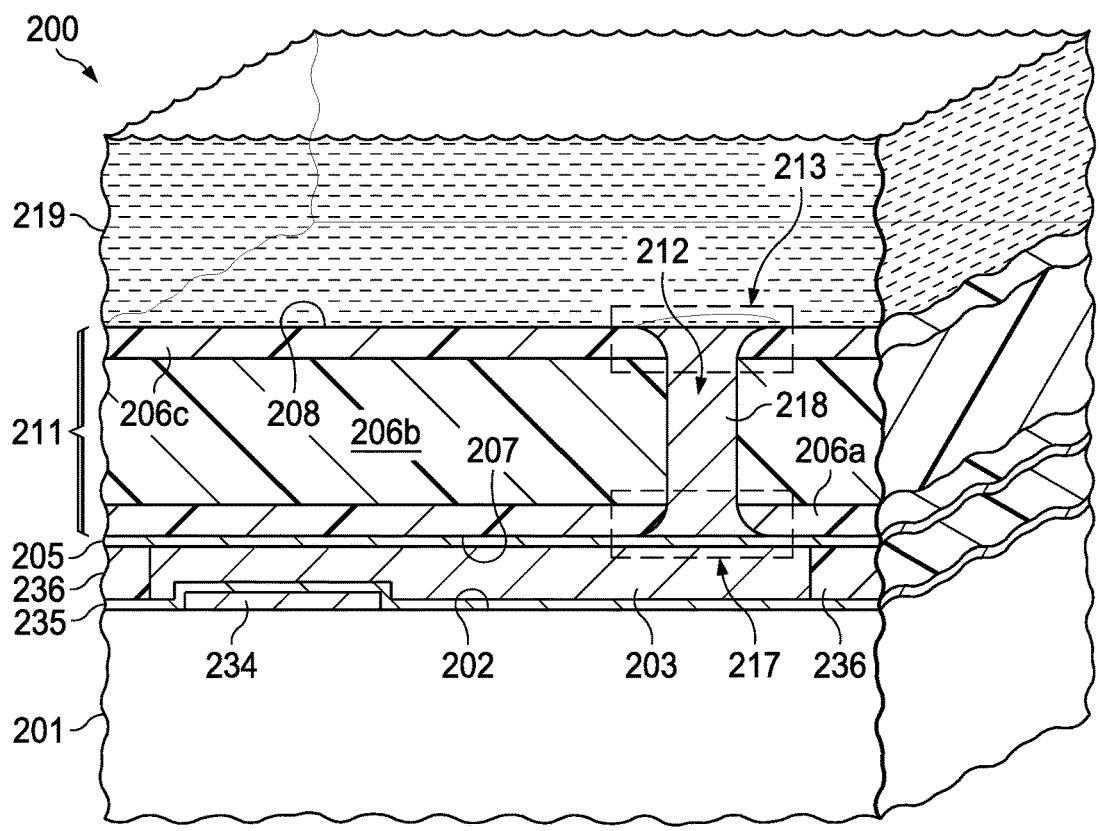

Referring to FIG. 2F, the pillar 218 is formed in the pillar hole 212 by a pillar plating operation using a pillar plating bath 219. The pillar plating bath 219 may be implemented with an electroplating process, or with an electroless process. The pillar plating bath 219 may have any of the compositions disclosed in reference to the pillar plating bath 119 of FIG. 1I. Other implementations of the pillar plating bath 219 are within the scope of this example. The pillar 218 is formed directly on the die interface layer 205. The die interface layer 205 has a different composition from the pillar 218. In this example, the plating operation is continued until the pillar 218 fills the pillar hole 212. In particular, the pillar 218 fills the die-side flare 217 and the head-side flare 213, as depicted in FIG. 2F.

Figure 2G:
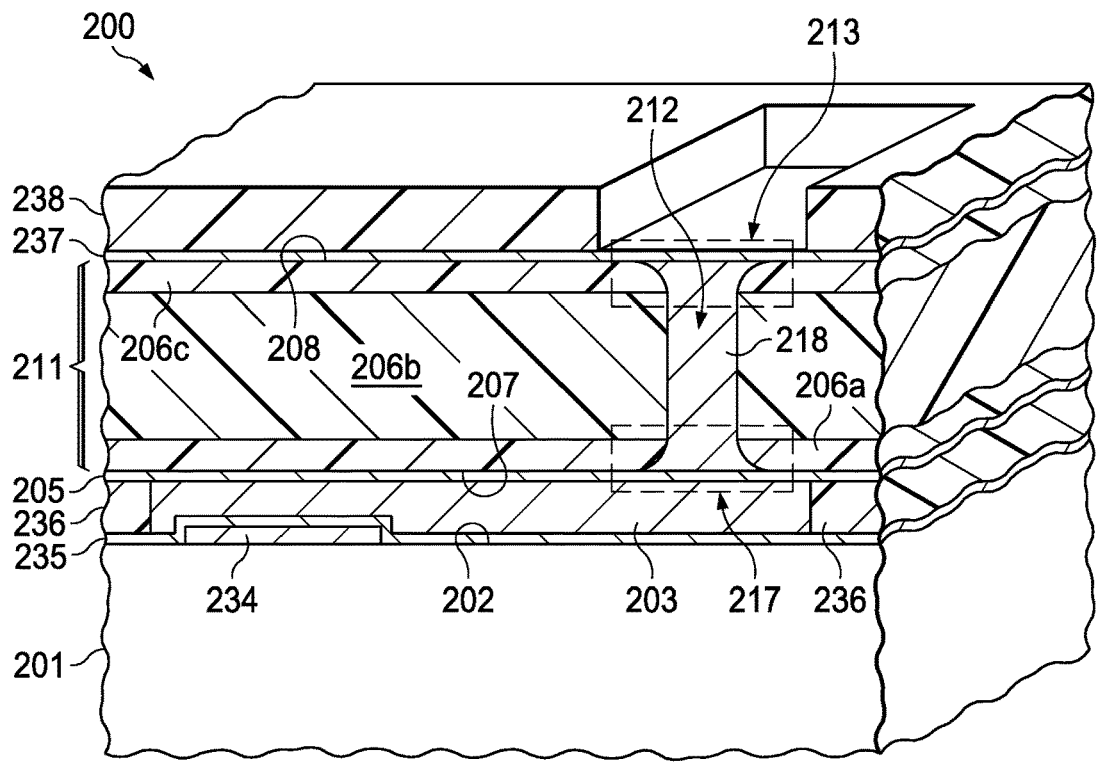

Referring to FIG. 2G, a head interface layer 237 is formed over the pillar plating mask 211, contacting the pillar 218. The head interface layer 237 may include an adhesion sublayer on the pillar plating mask 211 and the pillar 218, and a plating seed layer on the adhesion sublayer. The adhesion sublayer may include titanium or tungsten, to provide adhesion to the pillar plating mask 211 and the pillar 218. The plating seed layer may include copper, nickel, palladium, or gold, to provide a suitable surface for a subsequent head plating operation. The head interface layer 237 may be formed by one or more sputter processes, evaporation processes, or other metal thin film formation processes. The head interface layer 237 has a different composition than the pillar 218.

A head plating mask 238 is formed over the head interface layer 237, exposing the head interface layer 237 in an area for a subsequently-formed head 220, shown in FIG. 2H. The head plating mask 238 may include photoresist and may be formed by a photolithographic process. Alternately, the head plating mask 238 may be formed by an additive process.

Figure 2H:
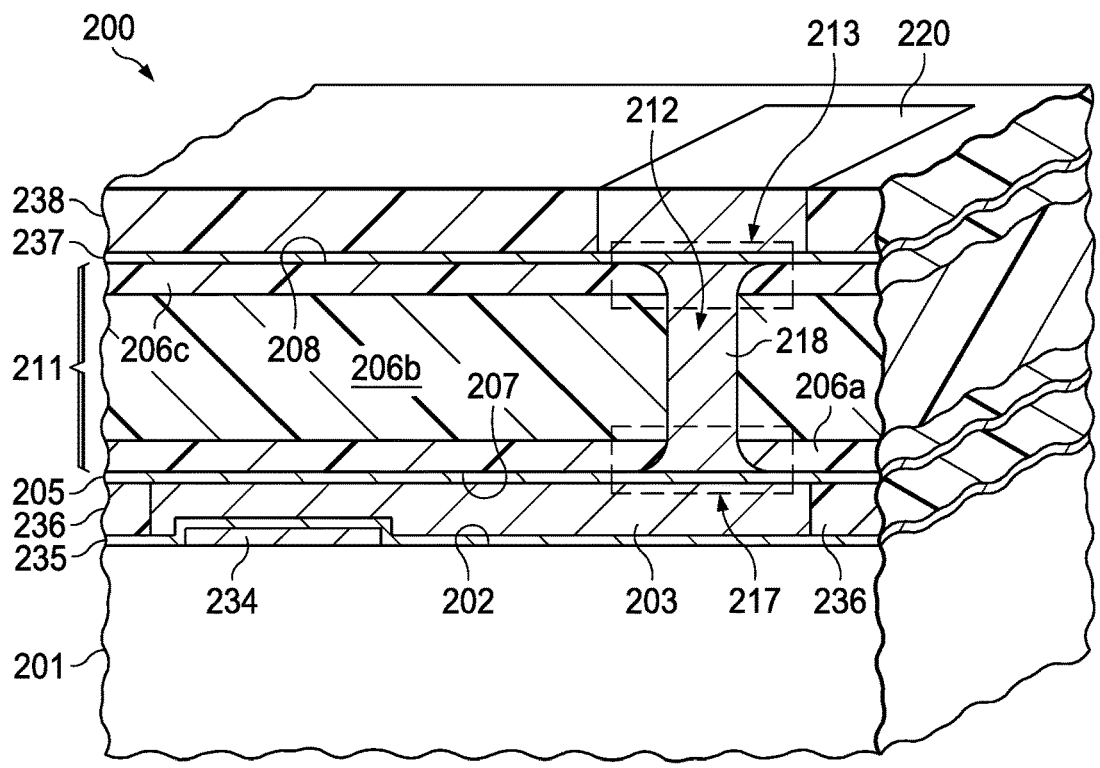

Referring to FIG. 2H, the head 220 is formed on the head interface layer 237 where exposed by the head plating mask 238, by a head plating operation. The head plating operation may be implemented with an electroplating process, or with an electroless plating process. The head 220 may include copper, nickel, palladium, platinum, or gold, by way of example. The head 220 may have a thickness of 5 microns to 100 microns, for example. The head interface layer 237 has a different composition than the head 220. The thickness of the head 220 may be less than a thickness of the head plating mask 238, may be equal to the thickness of the head plating mask 238, as depicted in FIG. 2H, or may be greater than the thickness of the head plating mask 238.

The head plating mask 238 is subsequently removed. The head plating mask 238 may be removed by dissolving in solvents or by a dry process using oxygen radicals. A portion or all of the pillar plating mask 211 and a portion or all of the die conductor plating mask 236 may be removed while the head plating mask 238 is removed. The head interface layer 237 is removed where exposed by the head 220. The head interface layer 237 may be removed by a wet etch process. The pillar plating mask 211 is removed. The pillar plating mask 211 may be removed by a process similar to the process used to remove the head plating mask 238. The die interface layer 205 is removed where exposed by the pillar 218, for example, by a wet etch process. The die conductor plating mask 236 is removed, either concurrently with the pillar plating mask 211, or by a separate process using solvents or oxygen radicals. The lower interface layer 235 is removed, for example by a wet etch process.

Figure 2I:
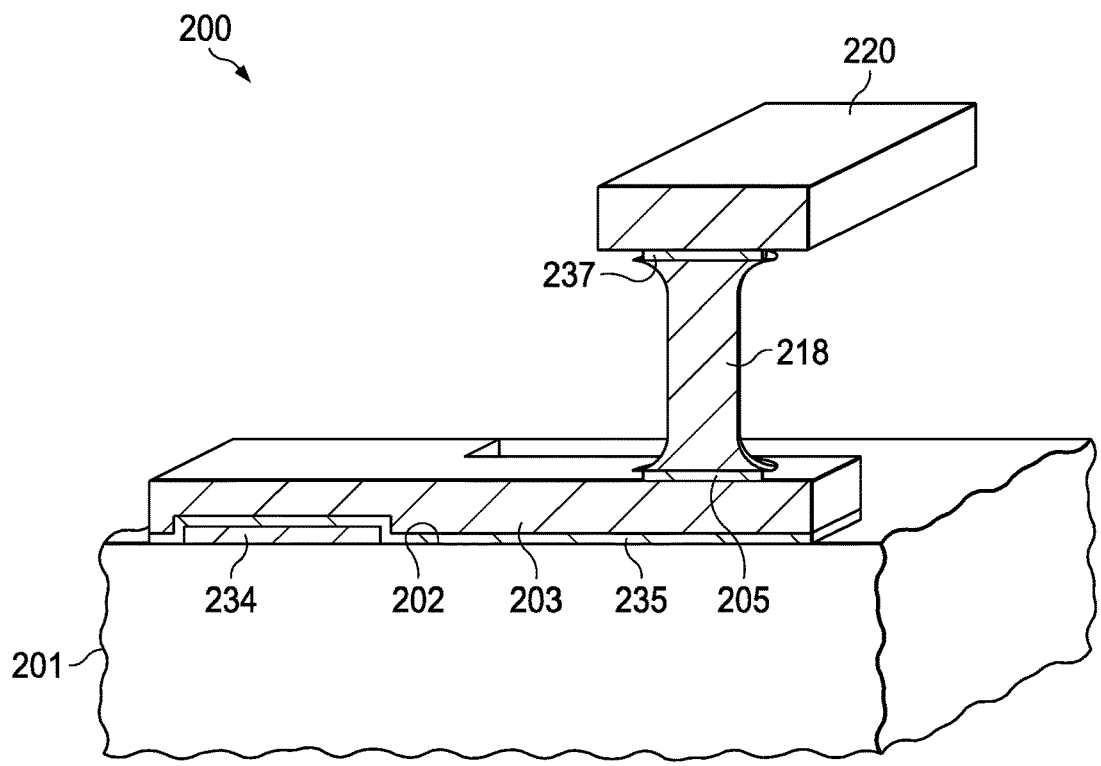

FIG. 2I depicts the microelectronic device 200 after the head plating mask 238, the head interface layer 237, the pillar plating mask 211, the die interface layer 205, the die conductor plating mask 236, and the lower interface layer 235, of FIG. 2H, are removed. The head 220 is electrically coupled to the pillar 218 through the head interface layer 237. The pillar 218 is electrically coupled to the die conductor 203 through the die interface layer 205. In this example, the die conductor 203 is electrically coupled to the terminal 234 through the lower interface layer 235.

Figure 2J:
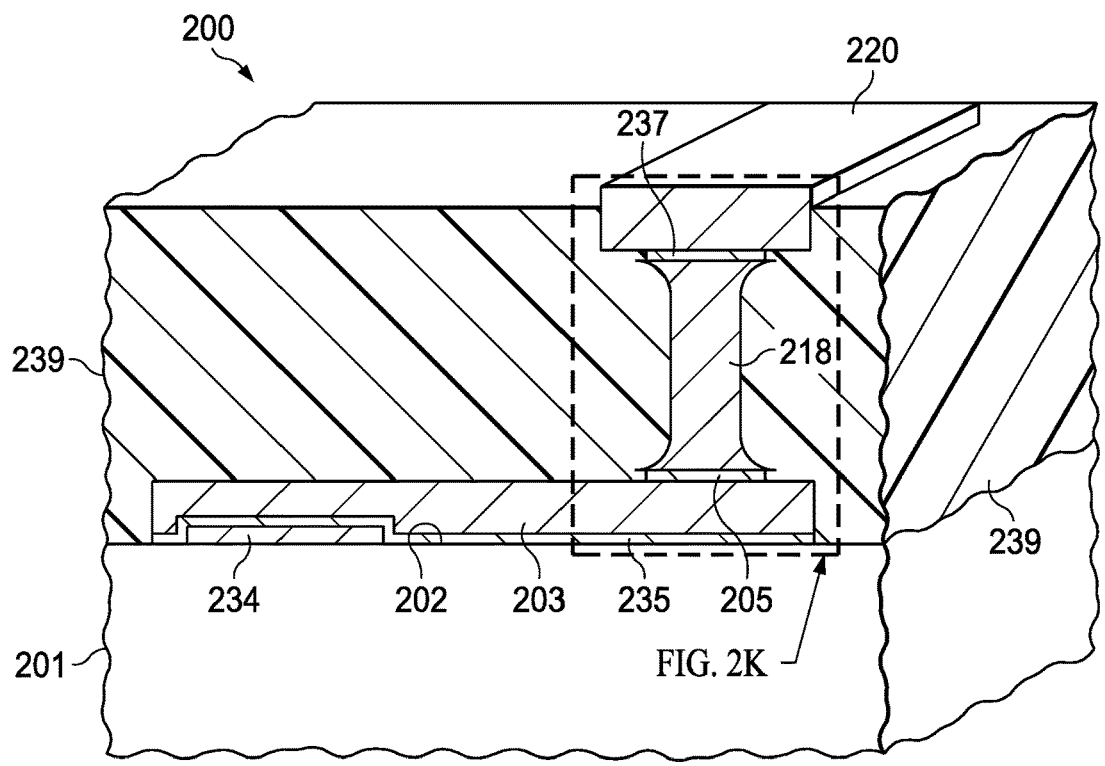

Referring to FIG. 2J, a package structure 239 of the microelectronic device 200 is formed on the die 201, contacting the die conductor 203, the pillar 218, and the head 220. The package structure 239 is electrically non-conductive. The package structure 239 may include epoxy, for example. In this example, a portion of the head 220 is exposed by the package structure 239. The package structure 239 may be formed by an injection molding process, such as a film-assisted molding process, by way of example. FIG. 2J depicts the completed microelectronic device 200.

Figure 2K:
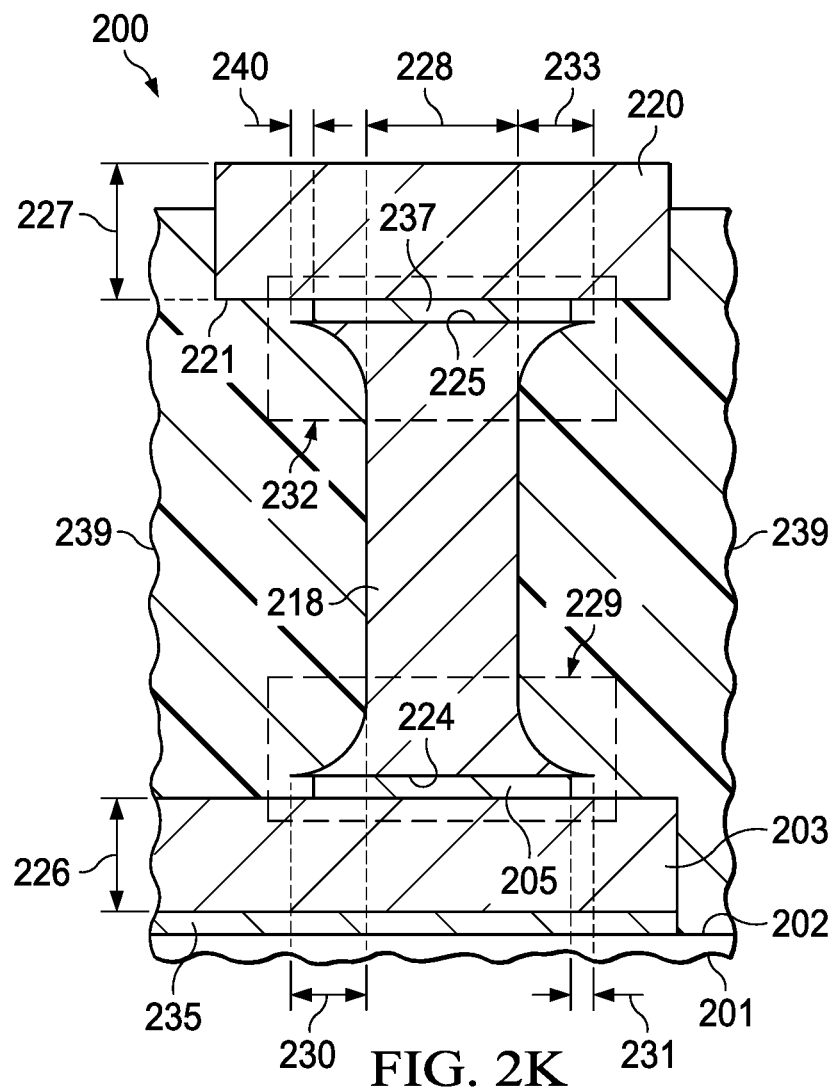

FIG. 2K is a cross section of the microelectronic device 200 through the pillar 218. The pillar 218 has a die end 224 coupled to the die conductor 203. In this example, the die end 224 is coupled to the die conductor 203 through the die interface layer 205. The pillar 218 has a head end 225 coupled to the head 220. In this example, the head end 225 is coupled to the head 220 through the head interface layer 237.

The die conductor 203 has a die conductor thickness 226, which is a dimension of the die conductor 203 in a direction perpendicular to the connection surface 202, at a point of overlap between the die conductor 203 and an edge of the pillar 218 at the die end 224. The head 220 has a head thickness 227, which is a dimension of the head 220 in a direction perpendicular to the connection surface 202, at a point of overlap between the head 220 and an edge of the pillar 218 at the head end 225. The pillar 218 has a pillar width 228, which is a minimum dimension of the pillar 218 in a direction parallel to the connection surface 202, midway between the die end 224 and the head end 225.

The pillar 218 has a die-side flared end 229 at the die end 224. The pillar 218 widens progressively along the die-side flared end 229 toward the die end 224. The die-side flared end 229 extends outward, at the die end 224, from a surface of the pillar 218 midway between the die end 224 and the head end 225, by a die-side flare extension 230. The die-side flare extension 230 is greater than a lesser of half the die conductor thickness 226 and half the pillar width 228, to reduce a current density in the pillar 218 at the die end 224, to provide a measureable improvement in reliability of the pillar 218. The die interface layer 205 may be recessed, that is, undercut, with respect to an edge of the pillar 218 at the die end 224, as depicted in FIG. 2K, by a die-side undercut 231, which is a distance between an edge of the die interface layer 205 and the edge of the pillar 218 at the die end 224. If the die interface layer 205 is recessed from an edge of the pillar 218, the die-side undercut 231 is less than half the die-side flare extension 230, to retain the advantage of reducing the current density in the pillar 218 to provide a measureable improvement in reliability of the pillar 218. The die conductor 203 extends past the pillar 218 in a first lateral direction parallel to the connection surface 202.

The pillar 218 has a head-side flared end 232 at the head end 225 of the pillar 218. The pillar 218 widens progressively along the head-side flared end 232 toward the head end 225. The head-side flared end 232 extends outward at the head end 225, from the surface of the pillar 218 midway between the die end 224 and the head end 225, by a head-side flare extension 233 that is greater than a lesser of half the head thickness 227 and half the pillar width 228, to reduce a current density in the pillar 218 at the head end 225, to provide a measureable improvement in reliability of the pillar 218. The head-side flare extension 233 may be different from the die-side flare extension 230. The head interface layer 237 may be recessed, that is, undercut, with respect to an edge of the pillar 218 at the head end 225, as depicted in FIG. 2K, by a head-side undercut 240, which is a distance between an edge of the head interface layer 237 and the edge of the pillar 218 at the head end 225. If the head interface layer 237 is recessed from an edge of the pillar 218, the head-side undercut 240 is less than half the head-side flare extension 233, to retain the advantage of reducing the current density in the pillar 218 to provide a measureable improvement in reliability of the pillar 218. The head 220 extends past the pillar 218 in a second lateral direction parallel to the connection surface 202. The second lateral direction may be in a different direction than the first lateral direction. In this example, a bottom surface 221 of the head 220 extends past the pillar 218 in at least the second lateral direction.

Figure 3A:
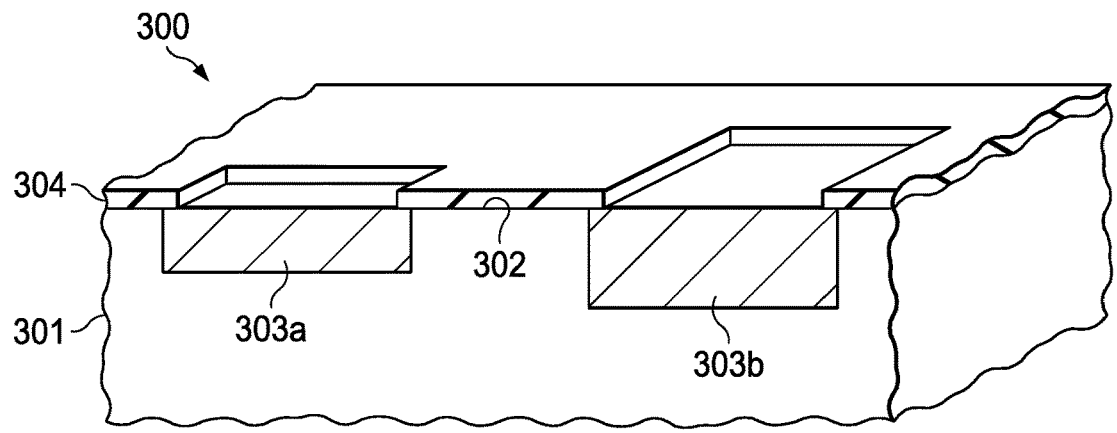
FIG. 3A through FIG. 3G are cross sections of a further example microelectronic device, depicted in stages of a further example method of formation.

FIG. 3A through FIG. 3G are cross sections of a further example microelectronic device, depicted in stages of a further example method of formation. Referring to FIG. 3A, the microelectronic device 300 includes a die 301. The die 301 may be implemented as any of the device types disclosed in reference to the die 101 of FIG. 1A. The die 301 may be part of a workpiece, not shown in FIG. 3A, that includes additional die, or may be a single die. The die 301 has a connection surface 302.

The microelectronic device 300 includes a first die conductor 303a and a second die conductor 303b at the connection surface 302. The first die conductor 303a and the second die conductor 303b are electrically conductive. The first die conductor 303a and the second die conductor 303b may include any of the materials disclosed in reference to the first die conductor 103a and a second die conductor 103b of FIG. 1A. In this example, the first die conductor 303a and the second die conductor 303b extend partway into the die 301, and are exposed at the connection surface 302, as depicted in FIG. 1A. The microelectronic device 300 may optionally include a PO layer 304 over the connection surface 302 extending partway onto the first die conductor 303a and the second die conductor 303b, so that portions of the first die conductor 303a and the second die conductor 303b are exposed by the PO layer 304.

Figure 3B:
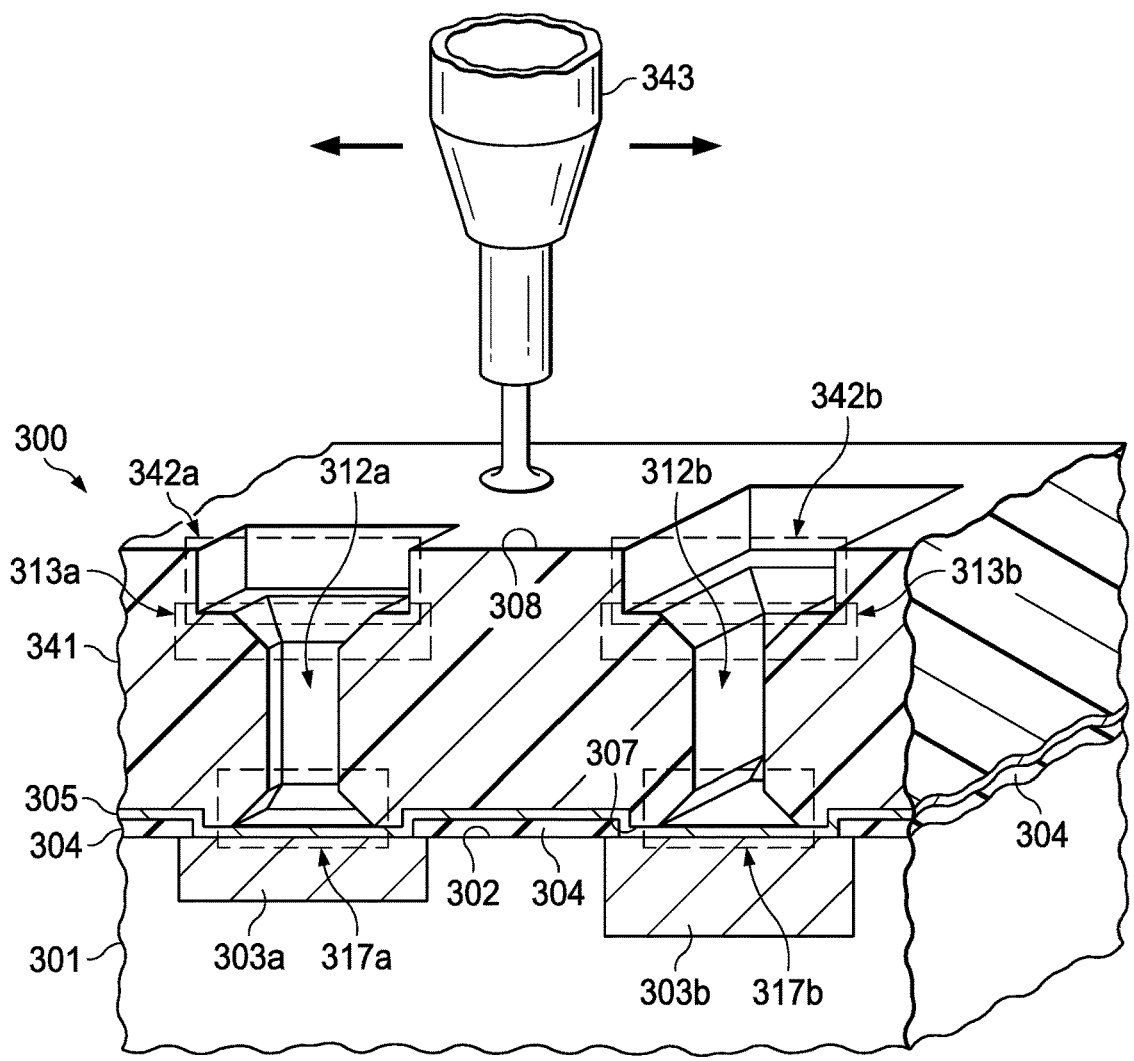

Referring to FIG. 3B, a die interface layer 305 is formed over the die 301, the first die conductor 303a and the second die conductor 303b, and over the PO layer 304, if present. The die interface layer 305 contacts the first die conductor 303a and the second die conductor 303b. The die interface layer 305 is electrically conductive. The die interface layer 305 may have a structure and composition similar to the structure and composition disclosed in reference to the die interface layer 105 of FIG. 1B. The die interface layer 305 has a different composition than the first die conductor 303a and the second die conductor 303b. The die interface layer 305 may be formed by a process as disclosed in reference to the die interface layer 105. The die interface layer 305 may have a thickness of 100 nanometers to 5 microns, by way of example.

A pillar/head plating mask 341 is formed on the die interface layer 305. The pillar/head plating mask 341 has a die-side surface 307 adjacent to the die 301, and a head-side surface 308, located opposite from the die-side surface 307. The pillar/head plating mask 341 is formed to have a first pillar hole 312a which exposes a portion of the first die conductor 303a, and formed to have a second pillar hole 312b which exposes a portion of the second die conductor 303b. The pillar/head plating mask 341 is also formed to have a first head opening 342a which extends from the first pillar hole 312a to the head-side surface 308. The pillar/head plating mask 341 is further formed to have a second head opening 342b which extends from the second pillar hole 312b to the head-side surface 308. The second head opening 342b extends laterally past the second pillar hole 312b.

The pillar/head plating mask 341 is formed so that the first pillar hole 312a has a first head-side flare 313a, extending to the first head opening 342a. Lateral dimensions of the first pillar hole 312a increase progressively along the first head-side flare 313a toward the first head opening 342a. The first head opening 342a extends laterally past the first pillar hole 312a, including the first head-side flare 313a.

The pillar/head plating mask 341 is also formed so that the first pillar hole 312a has a first die-side flare 317a, extending to the die-side surface 307. Lateral dimensions of the first pillar hole 312a increase progressively along the first die-side flare 317a toward the die-side surface 307.

The pillar/head plating mask 341 is further formed so that the second pillar hole 312b has a second head-side flare 313b, extending to the second head opening 342b. Lateral dimensions of the second pillar hole 312b increase progressively along the second head-side flare 313b toward the second head opening 342b. The second head opening 342b extends laterally past the second pillar hole 312b, including the second head-side flare 313b. The pillar/head plating mask 341 is also formed so that the second pillar hole 312b has a second die-side flare 317b, extending to the die-side surface 307. Lateral dimensions of the second pillar hole 312b increase progressively along the second die-side flare 317b toward the die-side surface 307.

The pillar/head plating mask 341 may include polymer material such as novolac resin, acrylic resin, or polyisoprene, which are insoluble in acidic plating solutions and are soluble in some solvents, to facilitate a plating operation and subsequent removal. The pillar/head plating mask 341 may be formed by an additive process, such as a material extrusion process using a material extrusion dispenser head 343, as depicted in FIG. 3B, or a material jetting process. Alternately, the pillar/head plating mask 341 may be formed by a sequence of photolithographic operations using positive tone and negative tone photoresists and filler resins.

Figure 3C:
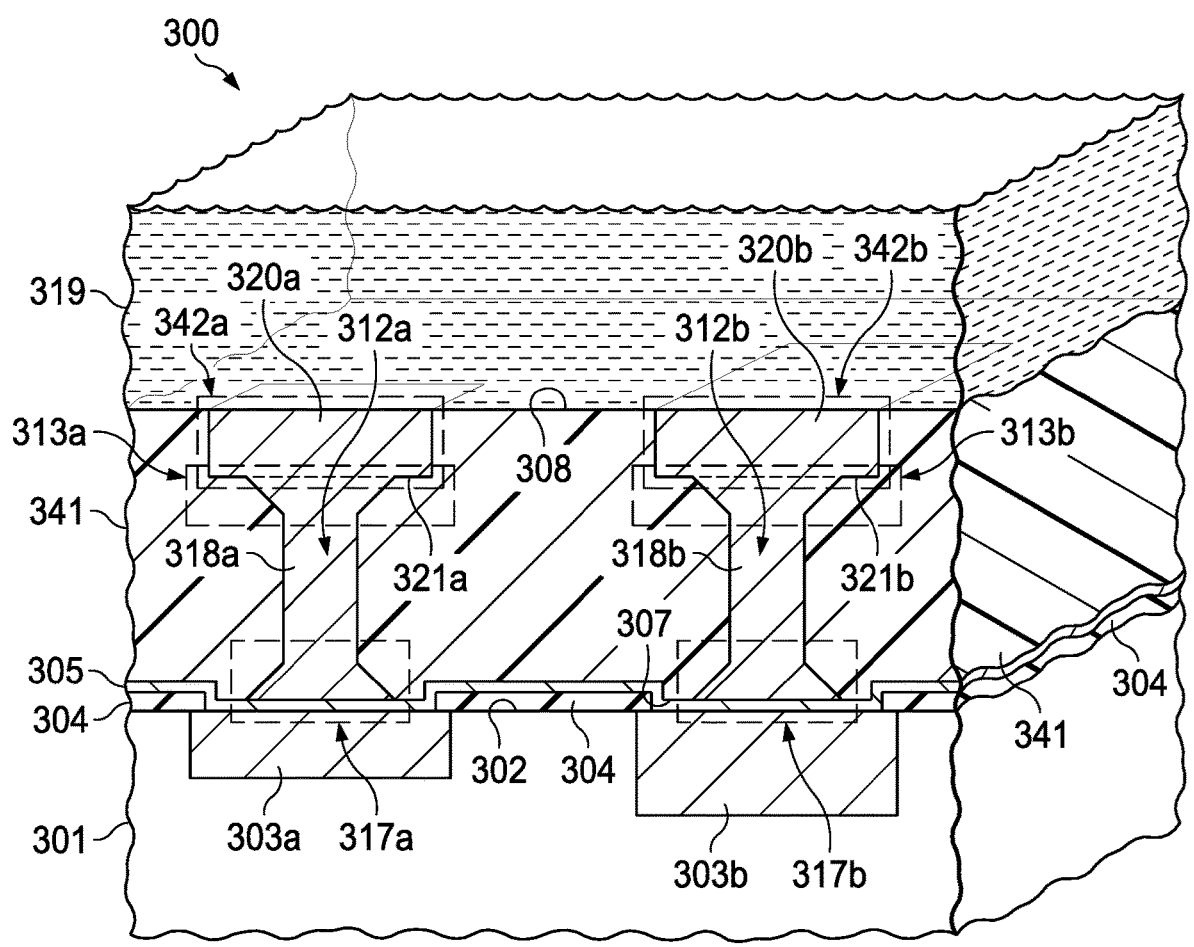

Referring to FIG. 3C, a first pillar 318a, a first head 320a, a second pillar 318b, and a second head 320b are formed in the first pillar hole 312a, the first head opening 342a, the second pillar hole 312b, and the second head opening 342b, respectively. In this example, the first pillar 318a, the first head 320a, the second pillar 318b, and the second head 320b are formed by a pillar/head plating operation using a pillar/head plating bath 319. The pillar/head plating bath 319 may be implemented as an electroplating bath or as an electroless bath. The pillar/head plating bath 319 may include the metals disclosed in reference to the pillar plating bath 119 of FIG. 1I. Other implementations of the pillar/head plating bath 319 are within the scope of this example. The first pillar 318a and the second pillar 318b are formed directly on the die interface layer 305, so that the first pillar 318a and the second pillar 318b are electrically coupled to the first die conductor 303a and the second die conductor 303b, respectively, through the die interface layer 305. The die interface layer 305 has a different composition than the first pillar 318a and the second pillar 318b. The first pillar 318a and the second pillar 318b fill the first pillar hole 312a and the second pillar hole 312b up to the first head opening 342a and the second head opening 342b, respectively. The first head 320a fills the first head opening 342a, and, in this example, is continuous with the first pillar 318a. Similarly, the second head 320b fills the second head opening 342b, and, in this example, is continuous with the second pillar 318b. The first head 320a extends laterally past the first pillar 318a. Similarly, the second head 320b extends laterally past the second pillar 318b. In this example, a boundary between the first head 320a and the first pillar 318a may be difficult to discern by examination, because the first head 320a and the first pillar 318a have similar compositions as a result of both being formed using the pillar/head plating bath 319. The boundary between the first head 320a and the first pillar 318a may be taken to be coplanar with a first bottom surface 321a of the first head 320a outward of the first pillar 318a, as indicated in FIG. 3C by the dashed line at the boundary between the first head 320a and the first pillar 318a. Similarly, the boundary between the second head 320b and the second pillar 318b may be taken to be coplanar with a second bottom surface 321b of the second head 320b outward of the second pillar 318b, as indicated in FIG. 3C by the dashed line at the boundary between the second head 320b and the second pillar 318b.

Figure 3D:
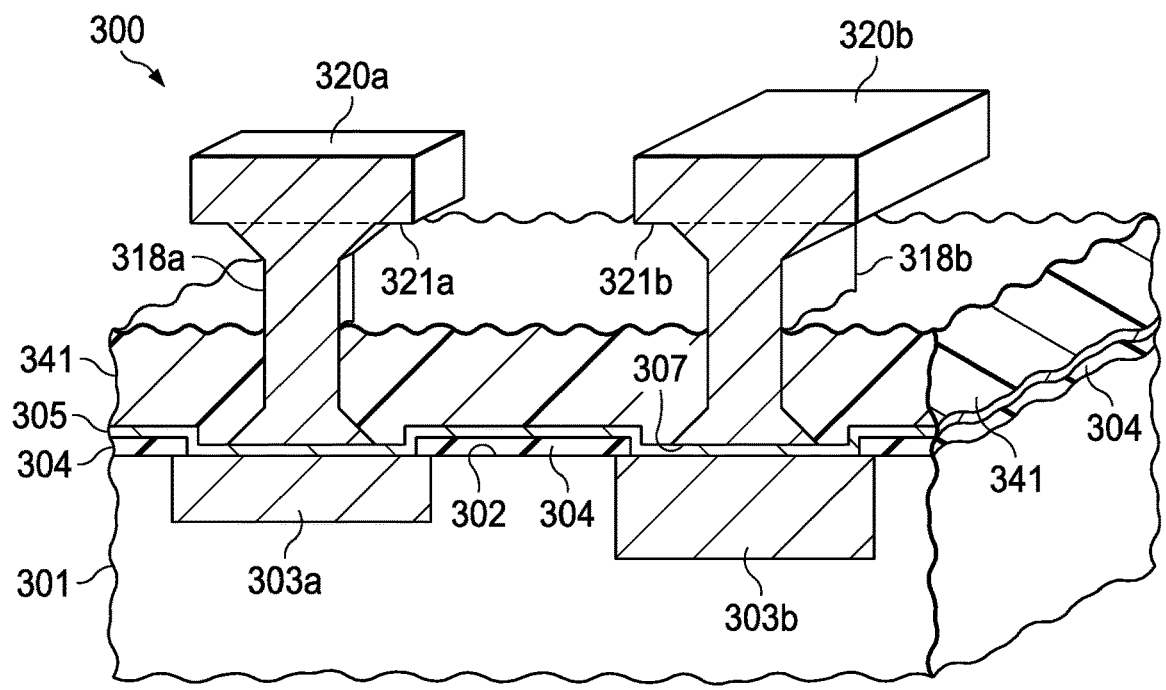

Referring to FIG. 3D, the pillar/head plating mask 341 is removed, leaving the first pillar 318a, the first head 320a, the second pillar 318b, and the second head 320b in place. The pillar/head plating mask 341 may be removed by a dry process using oxygen radicals, such as a cold plasma. Alternatively, the pillar/head plating mask 341 may be removed by a wet process using solvents, such as acetone, 1-methyl-2-pyrrolidone (NMP), or dimethyl sulfoxide (DMSO), or commercial photoresist removers, such as AZ-100 Remover, TechniStrip P1316, or TechniStrip P1331. The pillar/head plating mask 341 may be removed by a combination of a wet process, followed by a dry process. FIG. 3D depicts removal of the pillar/head plating mask 341 partway to completion.

Figure 3E:
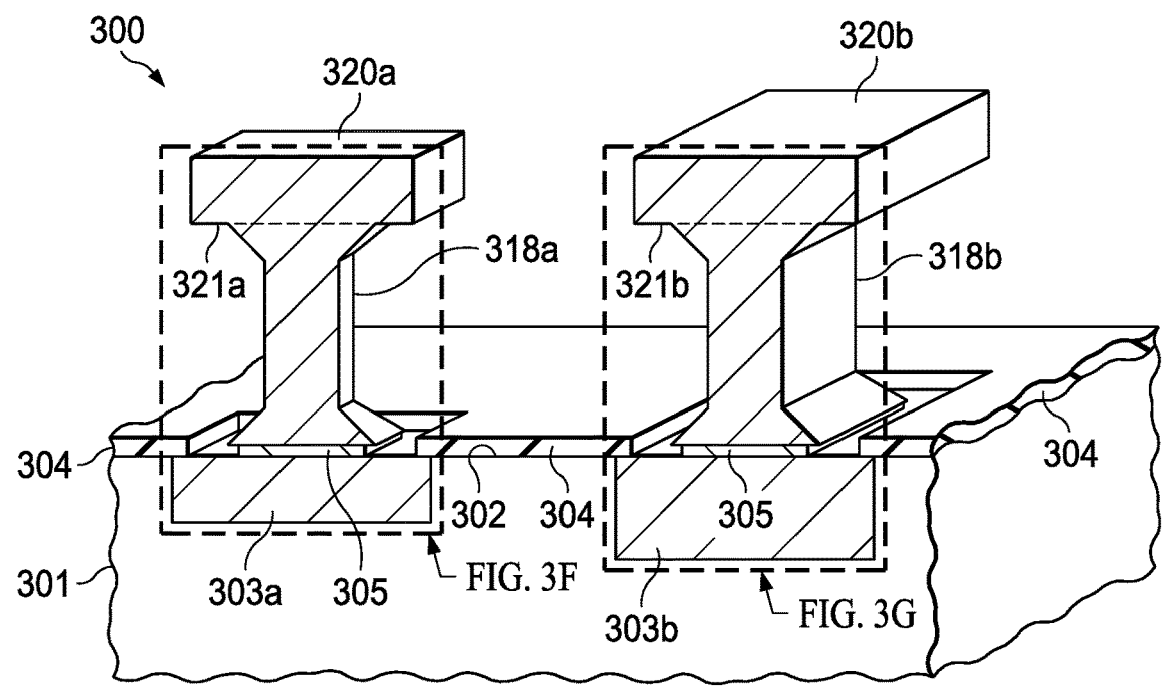

Referring to FIG. 3E, the die interface layer 305 is removed where exposed by the first pillar 318a and the second pillar 318b. The die interface layer 305 may be removed by any of the processes disclosed in reference to removal of the die interface layer 105 of FIG. 1M.

Figure 3G:
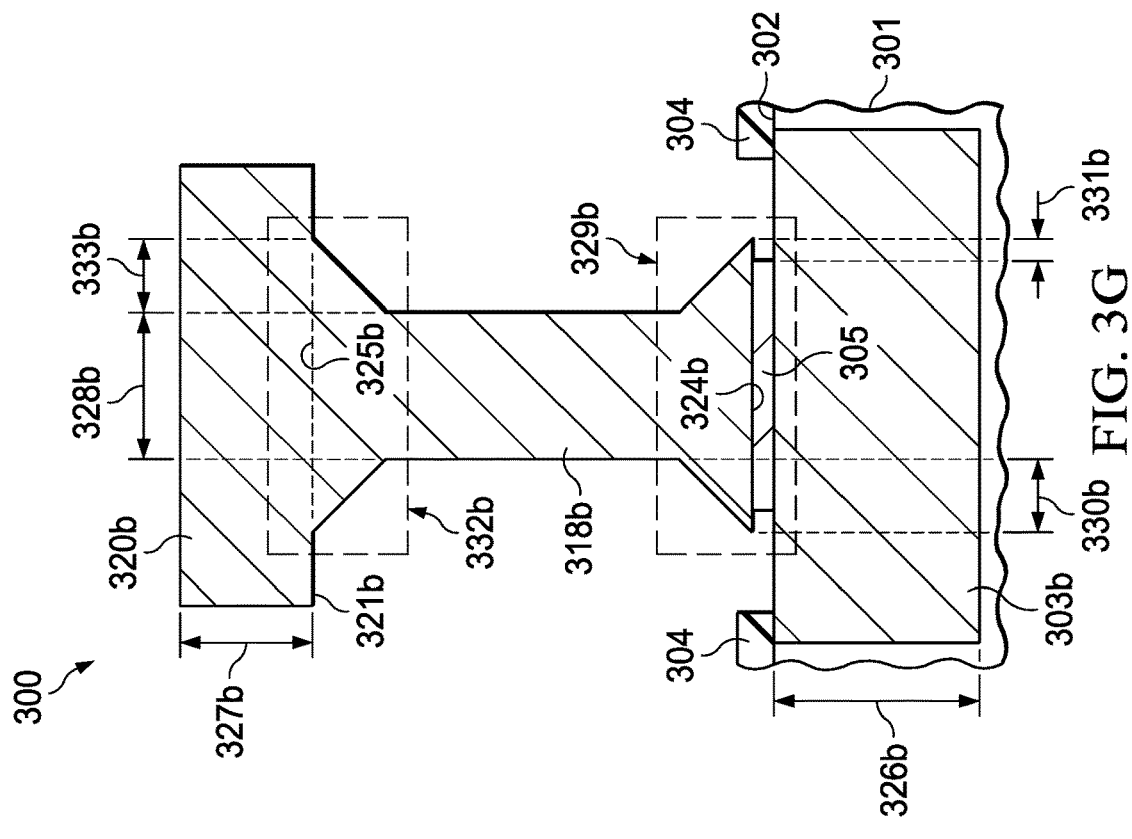
Figure 3F:
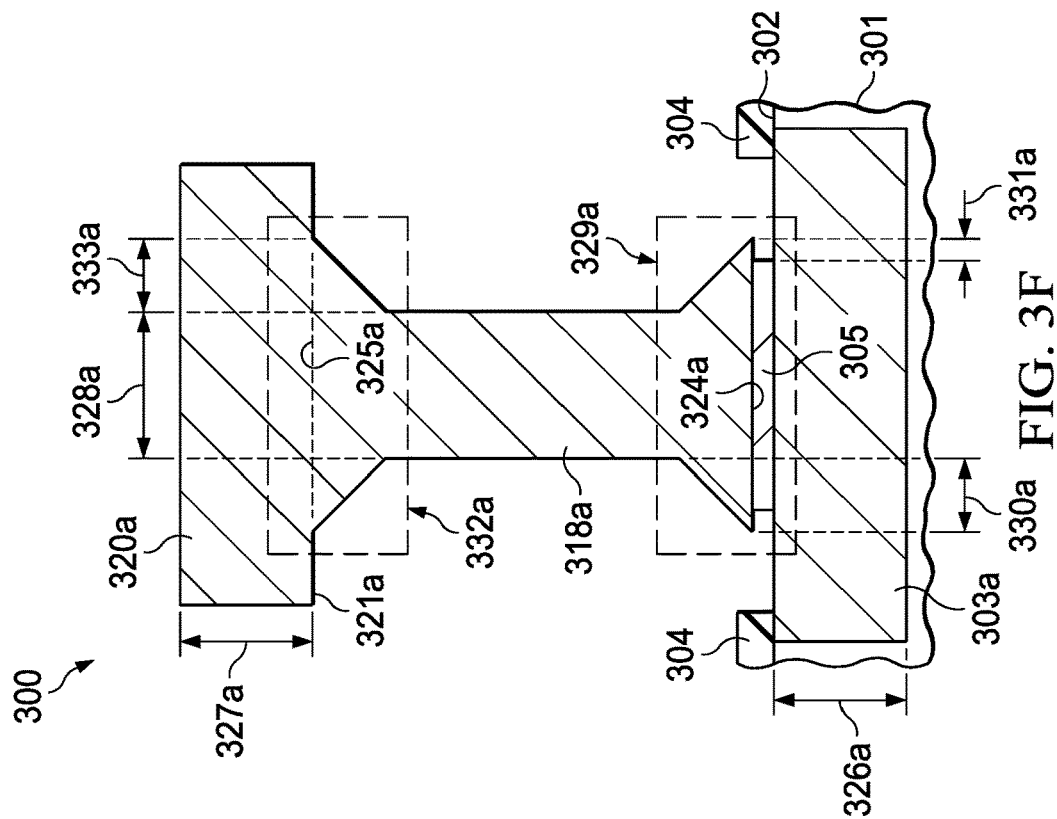

FIG. 3F is a cross section of the microelectronic device 300 through the first pillar 318a. The first pillar 318a has a first die end 324a coupled to the first die conductor 303a. In this example, the first die end 324a is coupled to the first die conductor 303a through the die interface layer 305. The first pillar 318a has a first head end 325a coupled to the first head 320a. In this example, the first head end 325a is directly connected to the first head 320a, as a results of the first pillar 318a being continuous with the first head 320a.

The first die conductor 303a has a first die conductor thickness 326a, which is a dimension of the first die conductor 303a in a direction perpendicular to the connection surface 302, at a point of overlap between the first die conductor 303a and an edge of the first pillar 318a at the first die end 324a. The first head 320a has a first head thickness 327a, which is a dimension of the first head 320a in a direction perpendicular to the connection surface 302, at a point of overlap between the first head 320a and an edge of the first pillar 318a at the first head end 325a. The first pillar 318a has a first pillar width 328a, which is a minimum dimension of the first pillar 318a in a direction parallel to the connection surface 302, midway between the first die end 324a and the first head end 325a.

The first pillar 318a has a first die-side flared end 329a at the first die end 324a. The first pillar 318a widens progressively along the first die-side flared end 329a toward the first die end 324a. The first die-side flared end 329a extends outward, at the first die end 324a, from a surface of the first pillar 318a midway between the first die end 324a and the first head end 325a, by a first die-side flare extension 330a. The first die-side flare extension 330a is greater than a lesser of half the first die conductor thickness 326a and half the first pillar width 328a, to accrue the advantage disclosed in reference to the first die-side flared end 129a of FIG. 1N. The die interface layer 305 may be recessed, that is, undercut, with respect to an edge of the first pillar 318a at the first die end 324a, as depicted in FIG. 3F, by a first die-side undercut 331a, which is a distance between an edge of the die interface layer 305 and the edge of the first pillar 318a at the first die end 324a. If the die interface layer 305 is recessed from an edge of the first pillar 318a, the first die-side undercut 331a is less than half the first die-side flare extension 330a, to retain the advantage accrued by the first die-side flared end 329a. The first die conductor 303a extends past the first pillar 318a in a first lateral direction parallel to the connection surface 302.

The first pillar 318a has a first head-side flared end 332a at the first head end 325a of the first pillar 318a. The first pillar 318a widens progressively along the first head-side flared end 332a toward the first head end 325a. The first head-side flared end 332a extends outward at the first head end 325a, from the surface of the first pillar 318a midway between the first die end 324a and the first head end 325a, by a first head-side flare extension 333a that is greater than a lesser of half the first head thickness 327a and half the first pillar width 328a, to accrue the advantage disclosed in reference to the first head-side flared end 132a of FIG. 1N. The first head-side flare extension 333a may be different from the first die-side flare extension 330a. The first head 320a extends past the first pillar 318a in a second lateral direction parallel to the connection surface 302. The second lateral direction may be in a different direction than the first lateral direction. In this example, the first bottom surface 321a of the first head 320a extends past the first pillar 318a in at least two directions parallel to the connection surface 302.

FIG. 3G is a cross section of the microelectronic device 300 through the second pillar 318b. The second pillar 318b has a second die end 324b coupled to the second die conductor 303b. In this example, the second die end 324b is coupled to the second die conductor 303b through the die interface layer 305. The second pillar 318b has a second head end 325b coupled to the second head 320b. In this example, the second head end 325b is directly connected to the second head 320b, as a results of the second pillar 318b being continuous with the second head 320b.

The second die conductor 303b has a second die conductor thickness 326b, which is a dimension of the second die conductor 303b in a direction perpendicular to the connection surface 302, at a point of overlap between the second die conductor 303b and an edge of the second pillar 318b at the second die end 324b. The second die conductor thickness 326b of the second die conductor 303b may be different from the first die conductor thickness 326a of the first die conductor 303a of FIG. 3F.

The second head 320b has a second head thickness 327b, which is a dimension of the second head 320b in a direction perpendicular to the connection surface 302, at a point of overlap between the second head 320b and an edge of the second pillar 318b at the second head end 325b. The second head thickness 327b of the second head 320b may be different from the first head thickness 327a of the first head 320a of FIG. 3F.

The second pillar 318b has a second pillar width 328b, which is a minimum dimension of the second pillar 318b in a direction parallel to the connection surface 302, midway between the second die end 324b and the second head end 325b. The second pillar width 328b of the second pillar 318b may be different from the first pillar width 328a of the first pillar 318a of FIG. 3F.

The second pillar 318b has a second die-side flared end 329b at the second die end 324b. The second pillar 318b widens progressively along the second die-side flared end 329b toward the second die end 324b. The second die-side flared end 329b extends outward, at the second die end 324b, from a surface of the second pillar 318b midway between the second die end 324b and the second head end 325b, by a second die-side flare extension 330b. The second die-side flare extension 330b is greater than a lesser of half the second die conductor thickness 326b and half the second pillar width 328b, to accrue the advantage disclosed in reference to the second die-side flared end 129b of FIG. 1O. The die interface layer 305 may be recessed, that is, undercut, with respect to an edge of the second pillar 318b at the second die end 324b, as depicted in FIG. 3G, by a second die-side undercut 331b, which is a distance between an edge of the die interface layer 305 and the edge of the second pillar 318b at the second die end 324b. If the die interface layer 305 is recessed from an edge of the second pillar 318b, the second die-side undercut 331b is less than half the second die-side flare extension 330b, to retain the advantage accrued by the second die-side flared end 329b. The second die-side flare extension 330b of the second pillar 318b may be different from the first die-side flare extension 330a of the first pillar 318a of FIG. 3F. The second die conductor 303b extends past the second pillar 318b in a third lateral direction parallel to the connection surface 302.

The second pillar 318b has a second head-side flared end 332b at the second head end 325b of the second pillar 318b. The second pillar 318b widens progressively along the second head-side flared end 332b toward the second head end 325b. The second head-side flared end 332b extends outward at the second head end 325b, from the surface of the second pillar 318b midway between the second die end 324b and the second head end 325b, by a second head-side flare extension 333b that is greater than a lesser of half the second head thickness 327b and half the second pillar width 328b, to reduce a current density in the second pillar 318b at the second head end 325b, to accrue the advantage disclosed in reference to the second head-side flared end 132b of FIG. 1O. The second head-side flare extension 333b of the second pillar 318b may be different from the first head-side flare extension 333a of the first pillar 318a of FIG. 3F. The second head-side flare extension 333b may be different from the second die-side flare extension 330b. The second head 320b extends past the second pillar 318b in a fourth lateral direction parallel to the connection surface 302. The fourth lateral direction may be in a different direction than the third lateral direction. In this example, the second bottom surface 321b of the second head 320b extends past the second pillar 318b in at least two directions parallel to the connection surface 302.

Figure 4A:
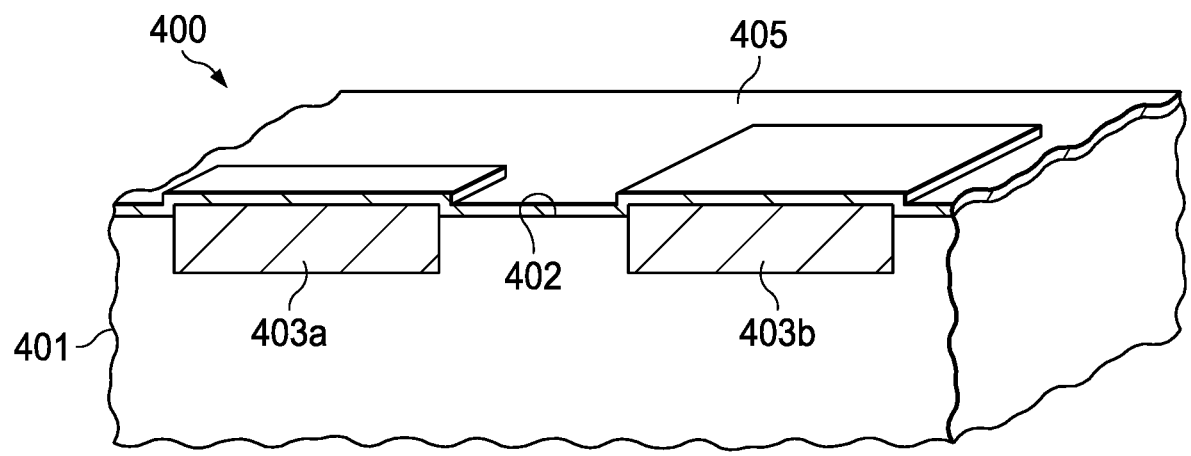
FIG. 4A through FIG. 4M are cross sections of another example microelectronic device, depicted in stages of another example method of formation.

FIG. 4A through FIG. 4M are cross sections of another example microelectronic device, depicted in stages of another example method of formation. Referring to FIG. 4A, the microelectronic device 400 includes a die 401. The die 401 may be implemented as any of the device types disclosed in reference to the die 101 of FIG. 1A. The die 401 may be part of a workpiece, not shown in FIG. 4A, that includes additional die, or may be a single die. The die 401 has a connection surface 402.

The microelectronic device 400 includes a first die conductor 403a and a second die conductor 403b at the connection surface 402. The first die conductor 403a and the second die conductor 403b are electrically conductive. The first die conductor 403a and the second die conductor 403b may include any of the materials disclosed in reference to the first die conductor 103a and a second die conductor 103b of FIG. 1A. In this example, the first die conductor 403a and the second die conductor 403b extend partway into the die 401, and extend partway out of the die 401, as depicted in FIG. 4A. A die interface layer 405 is formed over the die 401, the first die conductor 403a, and the second die conductor 403b. The die interface layer 405 contacts the first die conductor 403a and the second die conductor 403b. The die interface layer 405 is electrically conductive. The die interface layer 405 may have a structure and composition similar to the structure and composition disclosed in reference to the die interface layer 105 of FIG. 1B. The die interface layer 405 has a different composition than the first die conductor 403a and the second die conductor 403b. The die interface layer 405 may be formed by a process as disclosed in reference to the die interface layer 105. The die interface layer 405 may have a thickness of 100 nanometers to 5 microns, by way of example.

Figure 4B:
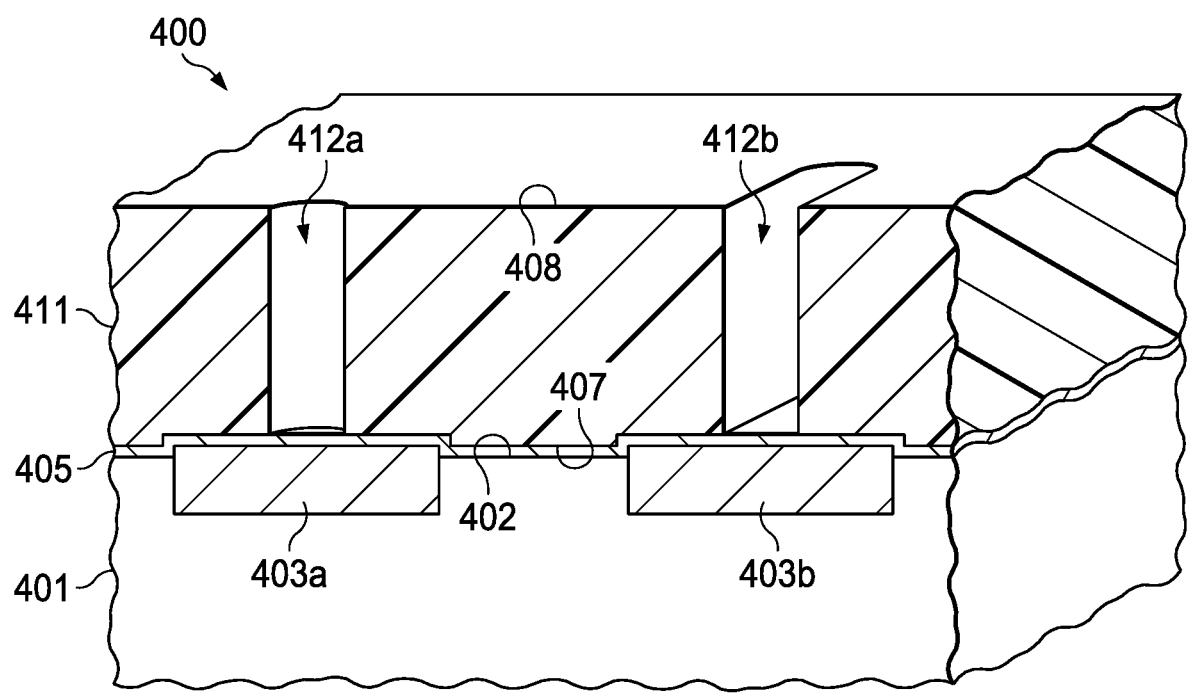

Referring to FIG. 4B, a pillar plating mask 411 is formed on the die interface layer 405. The pillar plating mask 411 has a die-side surface 407 adjacent to the die 401, and a head-side surface 408, located opposite from the die-side surface 407. The pillar plating mask 411 is formed to have a first pillar hole 412a which exposes a portion of the first die conductor 403a, and formed to have a second pillar hole 412b which exposes a portion of the second die conductor 403b. The pillar plating mask 411 may include photoresist, and may be formed by a photolithographic process.

Figure 4C:
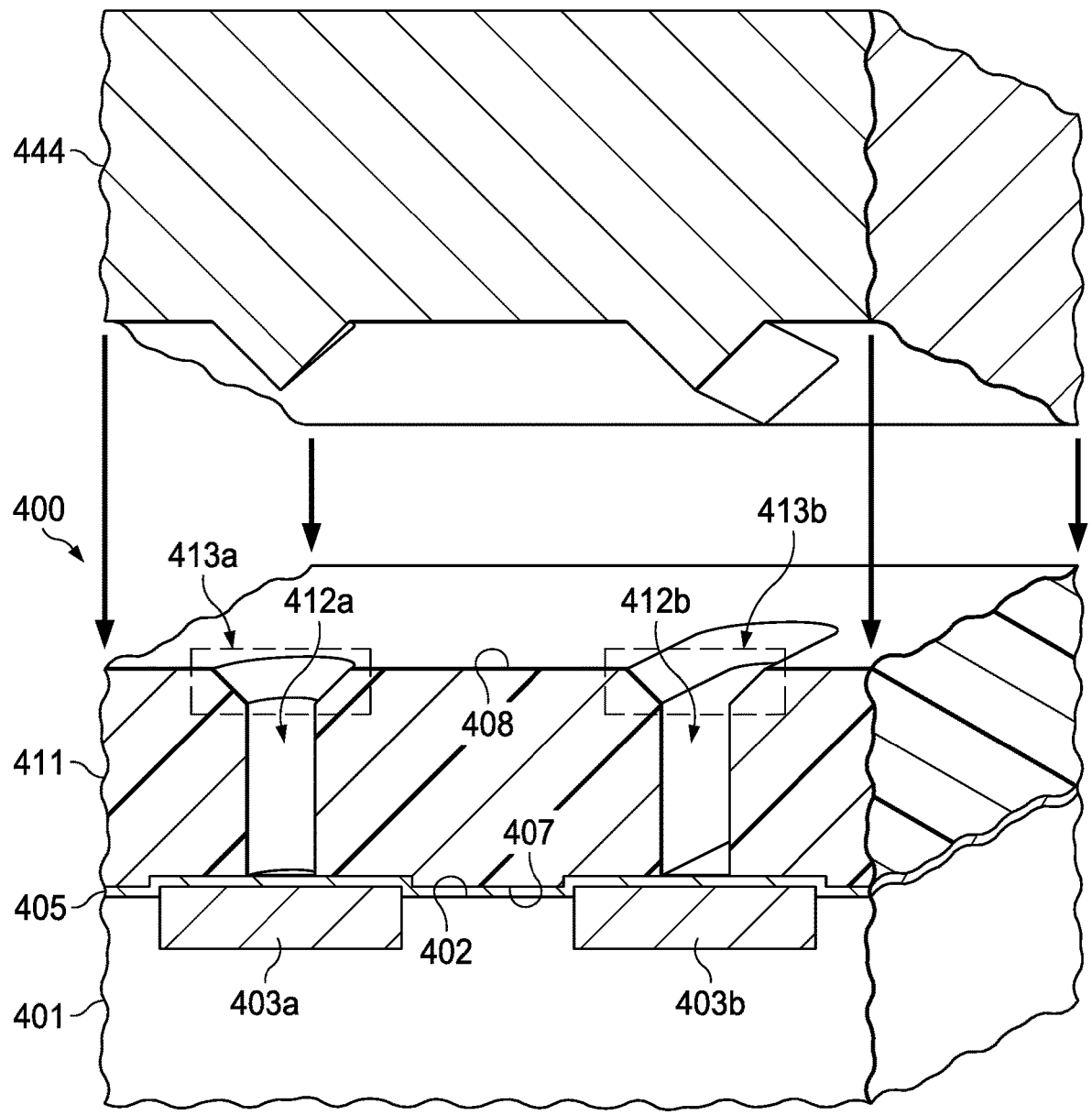

Referring to FIG. 4C, a first head-side flare 413a is formed in the pillar plating mask 411 around the first pillar hole 412a at the head-side surface 408 of the pillar plating mask 411. A second head-side flare 413b is formed in the pillar plating mask 411 around the second pillar hole 412b at the head-side surface 408. The first head-side flare 413a and the second head-side flare 413b may be formed by an imprint lithography process using an imprint tool 444 to shape the pillar plating mask 411 around the first pillar hole 412a and the second pillar hole 412b at the head-side surface 408. The imprint tool 444 is pressed into the pillar plating mask 411 to form the first head-side flare 413a and the second head-side flare 413b. The imprint tool 444 may be rigid or flexible. A rigid implementation of the imprint tool 444 may be advantageous for a version of this example in which the microelectronic device 400 is implemented as a single die. A flexible implementation of the imprint tool 444 may be advantageous for a version of this example in which the microelectronic device 400 is implemented as a die in a workpiece that contains additional die. The pillar plating mask 411 may be heated or exposed to UV light while the imprint tool 444 contacts the pillar plating mask 411, to stabilize the contours of the first head-side flare 413a and the second head-side flare 413b. Lateral dimensions of the first pillar hole 412a increase progressively along the first head-side flare 413a toward the head-side surface 408. Similarly, lateral dimensions of the second pillar hole 412b increase progressively along the second head-side flare 413b toward the head-side surface 408.

Figure 4D:
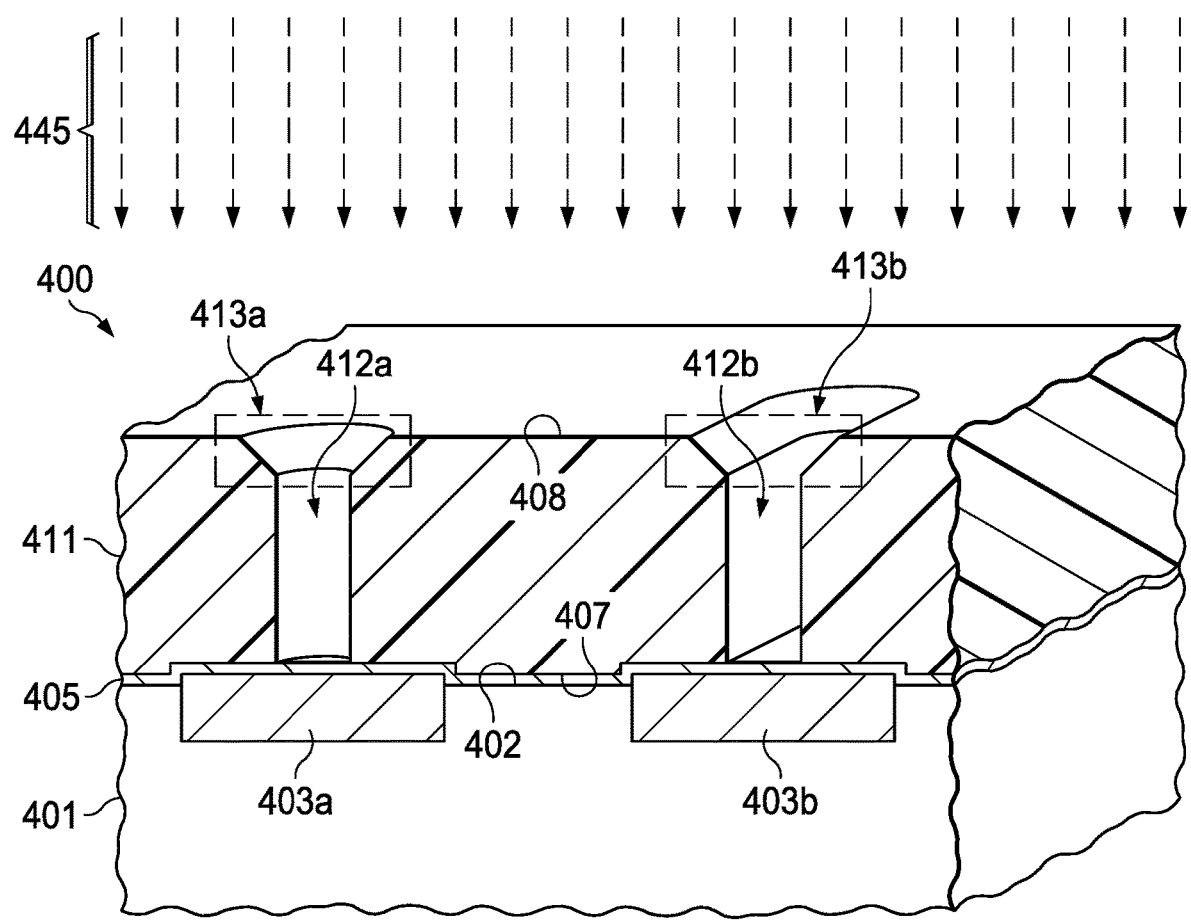

Referring to FIG. 4D, the pillar plating mask 411 is exposed to UV light 445. Exposure to the UV light increases a dissolution rate of the positive tone photoresist in the pillar plating mask 411 in a developer, such as an aqueous alkaline solution containing tetramethyl ammonium hydroxide. An exposure energy of the UV light 445, expressed in millijoules per square centimeter (mJ/cm$^2$), may be expressed as a product of an intensity of the UV light 445, summed over a wavelength range of 350 nanometers to 450 nanometers, expressed in milliwatts per square centimeter (mW/cm$^2$), and a time duration the pillar plating mask 411 is exposed to UV light 445, expressed in seconds. The pillar plating mask 411 may be exposed with an exposure energy greater than 75 mJ/cm$^2$ per micron thickness of the pillar plating mask 411, to provide a dissolution rate greater than 2 microns per minute of the positive tone photoresist in the pillar plating mask 411 in the developer, which may advantageously provide process latitude for forming die-side flares in the pillar plating mask 411 while providing an acceptable throughput rate.

Figure 4E:
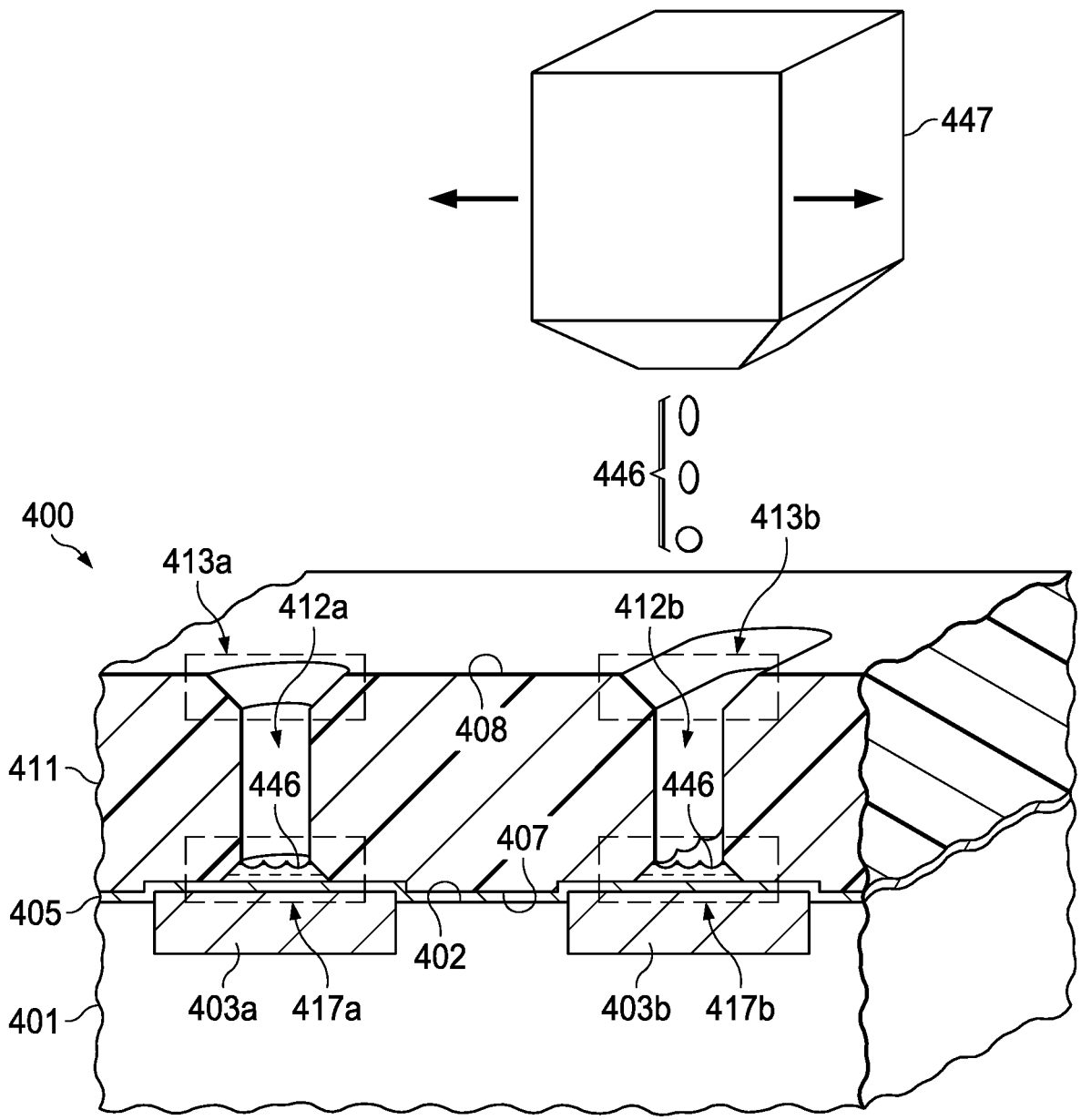

Referring to FIG. 4E, a developer solution 446 is dispensed into the first pillar hole 412a and the second pillar hole 412b of the pillar plating mask 411, to form a first die-side flare 417a in the pillar plating mask 411 around the first pillar hole 412a at the die-side surface 407 of the pillar plating mask 411, and to form a second die-side flare 417b in the pillar plating mask 411 around the second pillar hole 412b at the die-side surface 407 of the pillar plating mask 411. The developer solution 446 is dispensed so as to fill the first pillar hole 412a up to a level a fraction of a desired height of the first die-side flare 417a, and to fill the second pillar hole 412b up to a desired height of the second die-side flare 417b. The developer solution 446 dissolves photoresist in the pillar plating mask 411 at bottoms of the first pillar hole 412a and the second pillar hole 412b, that is, at the die-side surface 407 of the pillar plating mask 411. The developer solution 446 is dispensed over a time period comparable to a time required for the developer solution 446 to dissolve the photoresist by an amount sufficient to provide a desired width of the first pillar hole 412a and the second pillar hole 412b at the die-side surface 407 of the pillar plating mask 411. The developer solution 446 closer to the bottoms of the first pillar hole 412a and the second pillar hole 412b has more time to dissolve the photoresist, so that lateral widths of the first pillar hole 412a and the second pillar hole 412b become progressively larger toward the die-side surface 407 of the pillar plating mask 411. The developer solution 446 may be dispensed by a drop-on-demand dispenser 447, which may advantageously provide a desired measure of process control for forming the first die-side flare 417a and the second die-side flare 417b. FIG. 4E depicts the first die-side flare 417a and the second die-side flare 417b partway to completion.

Figure 4F:
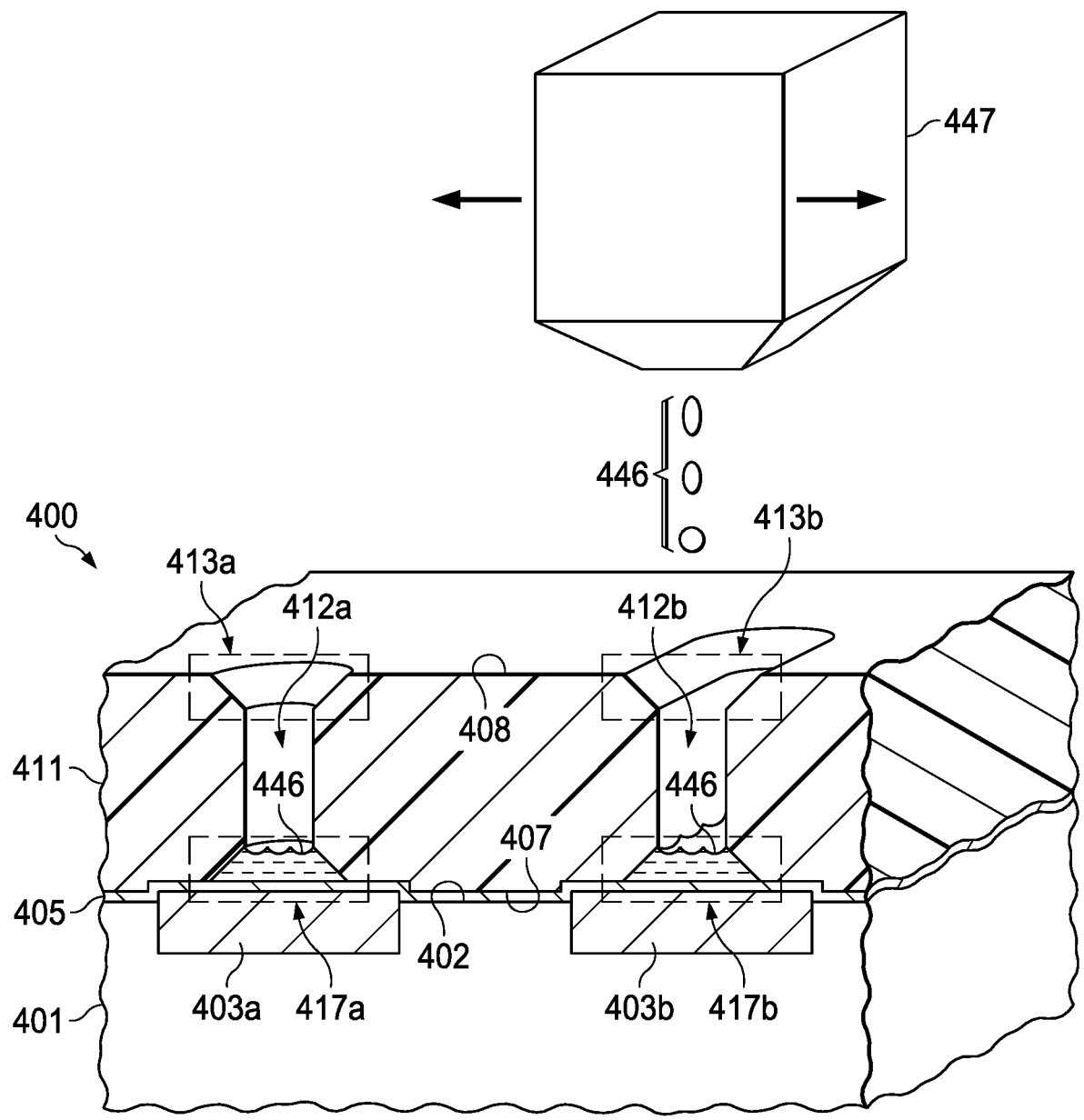

Referring to FIG. 4F, more developer solution 446 is dispensed into the first pillar hole 412a and the second pillar hole 412b of the pillar plating mask 411, to continue forming the first die-side flare 417a and the second die-side flare 417b. FIG. 4F depicts the first die-side flare 417a and the second die-side flare 417b at completion. Subsequently, the developer solution 446 is removed from the first pillar hole 412a and the second pillar hole 412b. The developer solution 446 may be removed by a rinse operation using a solvent such as water, followed by a drying operation.

Figure 4G:
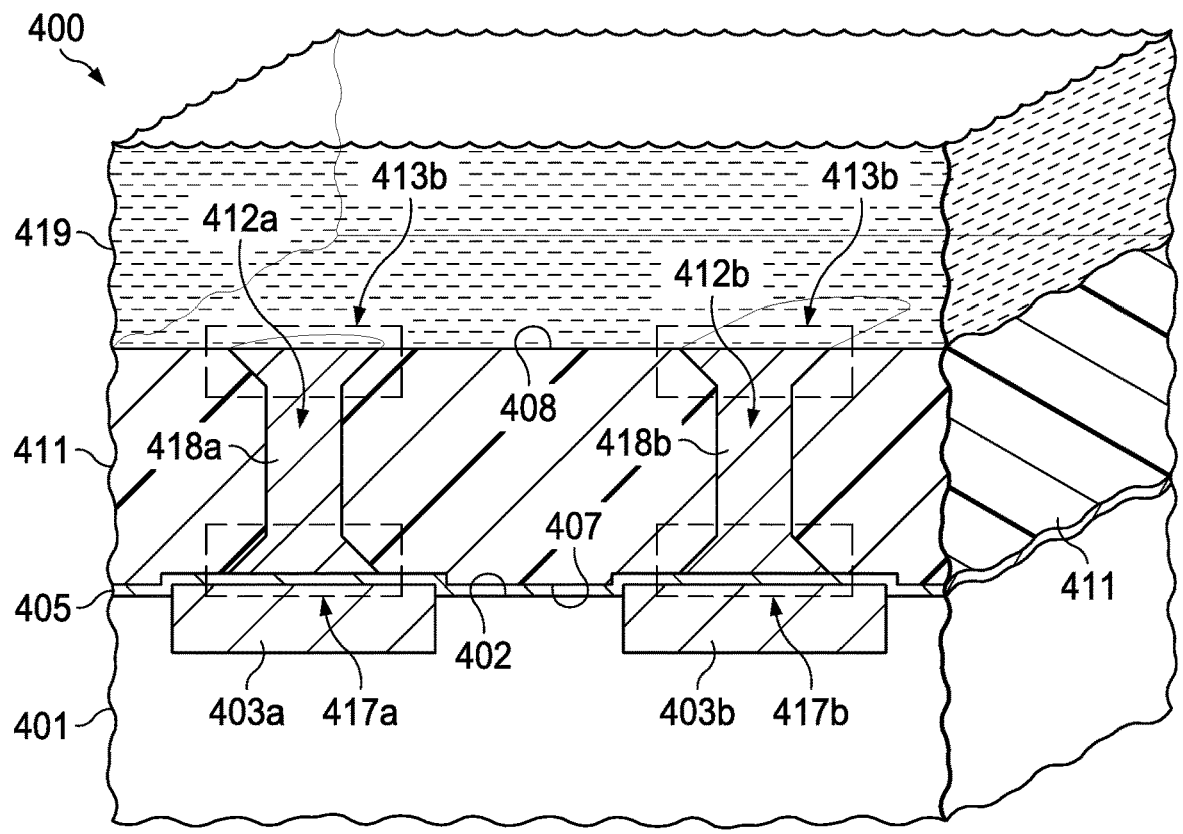

Referring to FIG. 4G, a first pillar 418*a* and a second pillar 418*b* are formed in the first pillar hole 412*a* and the second pillar hole 412*b*, respectively. In this example, the first pillar 418*a* and the second pillar 418*b* are formed by a pillar plating operation using a pillar plating bath 419. The pillar plating bath 419 may be implemented as an electroplating bath or as an electroless bath. The pillar plating bath 419 may include any of the metals disclosed in reference to the pillar plating bath 119 of FIG. 1I. Other implementations of the pillar plating bath 419 are within the scope of this example. The first pillar 418*a* and the second pillar 418*b* are formed directly on the die interface layer 405, so that the first pillar 418*a* and the second pillar 418*b* are electrically coupled to the first die conductor 403*a* and the second die conductor 403*b*, respectively, through the die interface layer 405. The die interface layer 405 has a different composition than the first pillar 418*a* and the second pillar 418*b*. The first pillar 418*a* and the second pillar 418*b* may fill the first pillar hole 412*a* and the second pillar hole 412*b*, respectively, including the first head-side flare 413*a*, the second head-side flare 413*b*, the first die-side flare 417*a*, and the second die-side flare 417*b*. Top surfaces of the first pillar 418*a* and the second pillar 418*b* may be coplanar with the head-side surface 408, as depicted in FIG. 4G.

Figure 4H:
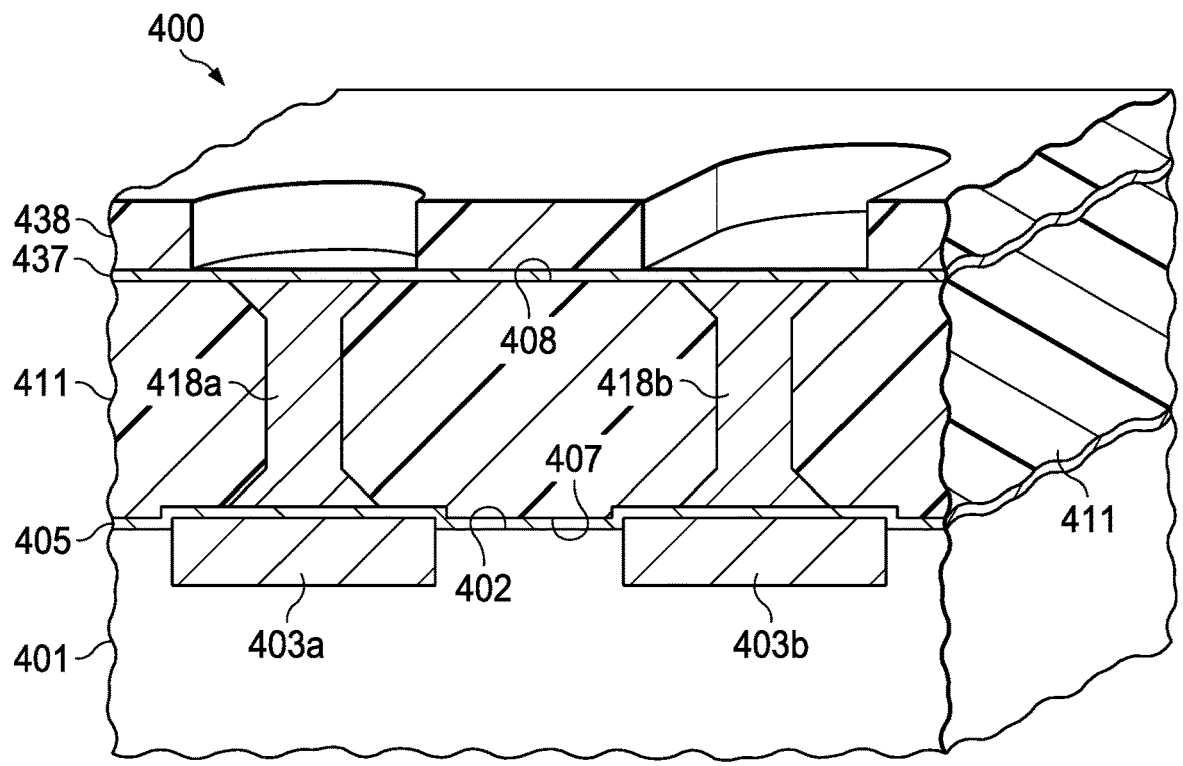

Referring to FIG. 4H, a head interface layer 437 is formed over the pillar plating mask 411, contacting the first pillar 418*a* and the second pillar 418*b*. The head interface layer 437 may include a structure and composition similar to the structure and composition disclosed in reference to the head interface layer 237 of FIG. 2G. The head interface layer 437 may be formed by one or more sputter processes, evaporation processes, or other metal thin film formation processes. The head interface layer 437 has a different composition than the first pillar 418*a* and the second pillar 418*b*.

A head plating mask 438 is formed over the head interface layer 437, exposing the head interface layer 437 in an area for a subsequently-formed first head 420*a* and a subsequently-formed second head 420*b*, shown in FIG. 4I. The head plating mask 438 may include photoresist and may be formed by a photolithographic process. Alternately, the head plating mask 438 may be formed by an additive process. Other methods of forming the head plating mask 438 are within the scope of this example.

Figure 4I:
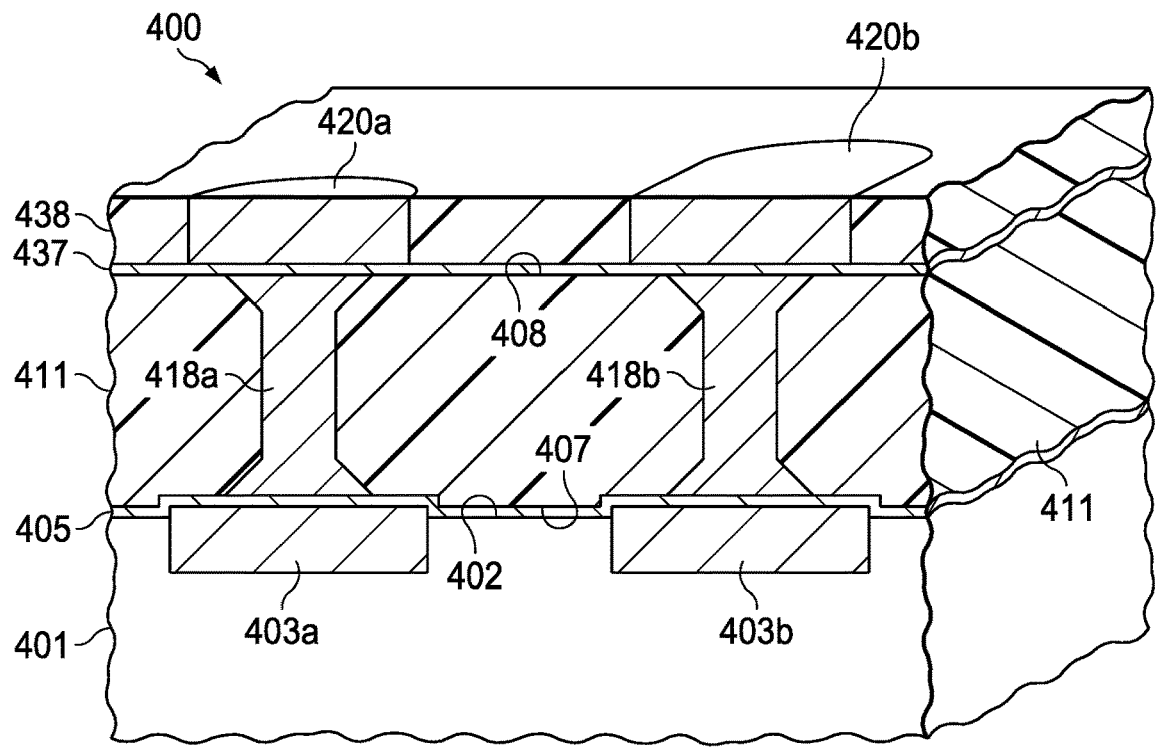

Referring to FIG. 4I, the first head 420*a* and the second head 420*b* are formed on the head interface layer 437 where exposed by the head plating mask 438, by a head plating operation. The head plating operation may be implemented with an electroplating process, or with an electroless plating process. The first head 420*a* and the second head 420*b* may include any of the metals disclosed in reference to the head 220 of FIG. 2H. The first head 420*a* and the second head 420*b* may have thicknesses of 5 microns to 100 microns, for example. The head interface layer 437 has a different composition than the first head 420*a* and the second head 420*b*.

The head plating mask 438 is subsequently removed. The head plating mask 438 may be removed by dissolving in solvents or by a dry process using oxygen radicals. A portion or all of the pillar plating mask 411 may be removed while the head plating mask 438 is removed. The head interface layer 437 is removed where exposed by the first head 420*a* and the second head 420*b*. The head interface layer 437 may be removed by a wet etch process, for example, as disclosed in reference to removal of the die interface layer 105 of FIG. 1M. The pillar plating mask 411 is removed. The pillar plating mask 411 may be removed by a process similar to the process used to remove the head plating mask 438. The die interface layer 405 is removed where exposed by the first pillar 418*a* and the second pillar 418*b*, for example, by a process similar to the process used to remove the head interface layer 437.

Figure 4J:
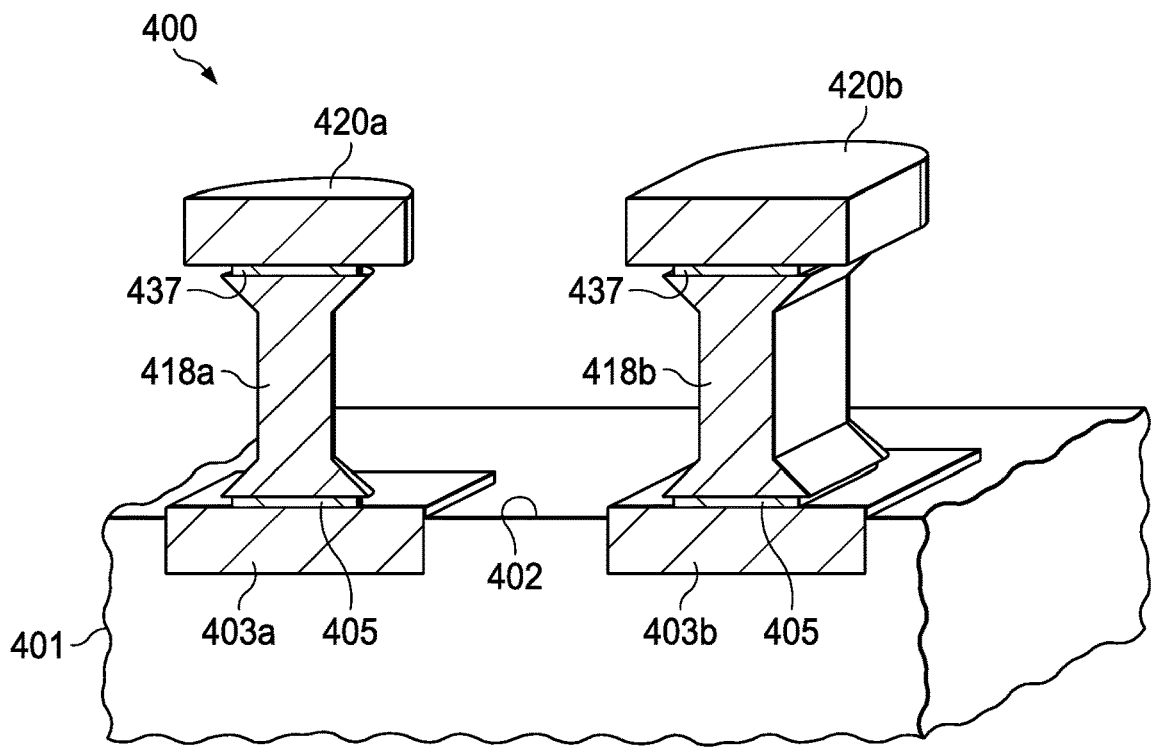

FIG. 4J depicts the microelectronic device 400 after the head plating mask 438, the head interface layer 437, the pillar plating mask 411, and the die interface layer 405, of FIG. 4I, are removed. The first head 420*a* is electrically coupled to the first pillar 418*a* through the head interface layer 437, and the second head 420*b* is electrically coupled to the second pillar 418*b* through the head interface layer 437. The first pillar 418*a* is electrically coupled to the first die conductor 403*a* through the die interface layer 405, and the second pillar 418*b* is electrically coupled to the second die conductor 403*b* through the die interface layer 405.

Figure 4K:
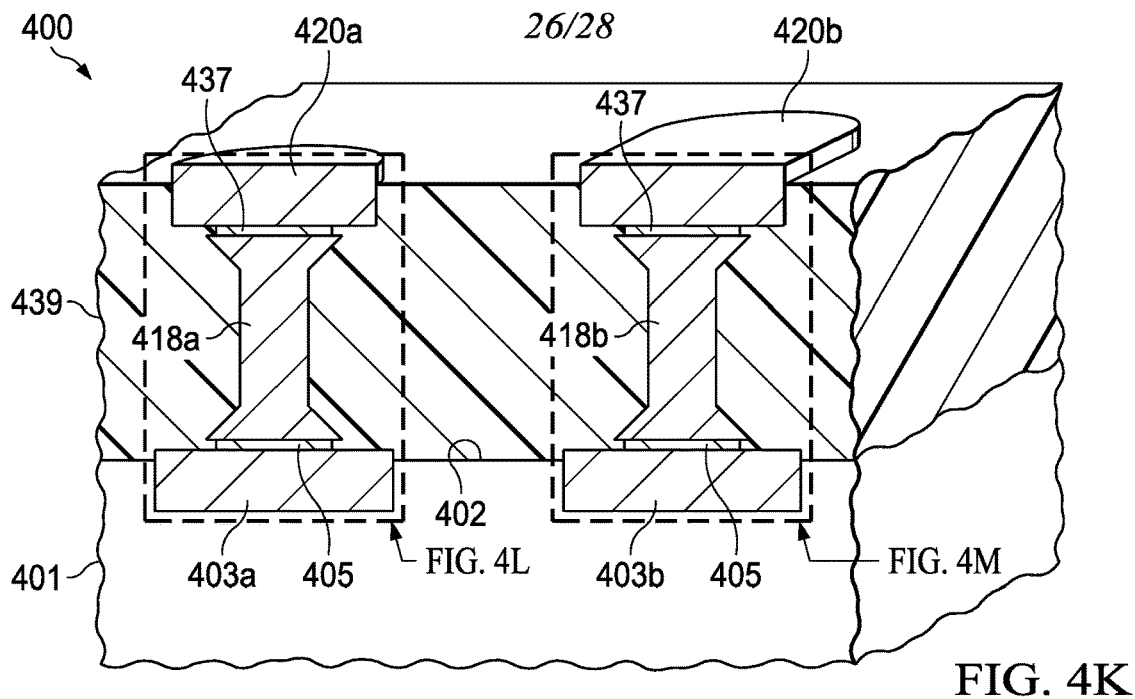

Referring to FIG. 4K, a package structure 439 of the microelectronic device 400 is formed on the die 401, contacting the first pillar 418*a*, the second pillar 418*b*, the first head 420*a*, and the second head 420*b*. The package structure 439 is electrically non-conductive. The package structure 439 may include epoxy, for example. In this example, a portion of the first head 420*a* and the second head 420*b* are exposed by the package structure 439. The package structure 439 may be formed by an injection molding process, such as a film-assisted molding process, by way of example. FIG. 4K depicts the completed microelectronic device 400.

Figure 4M:
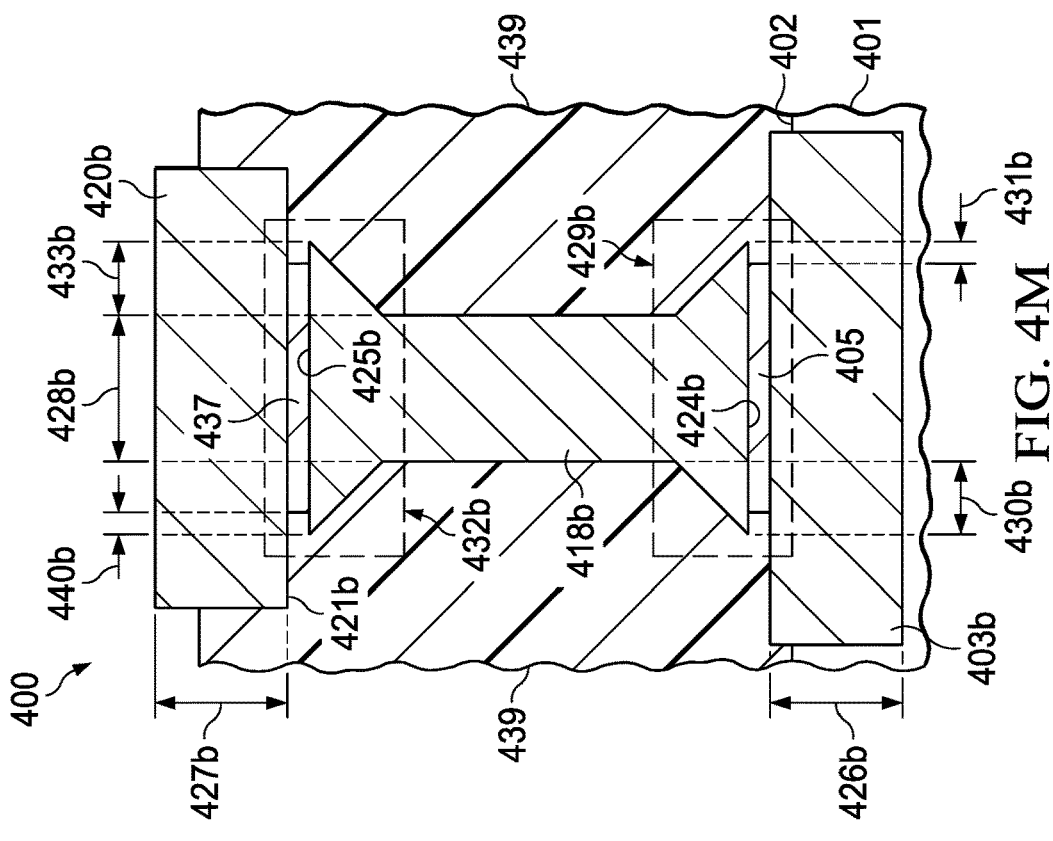
Figure 4L:
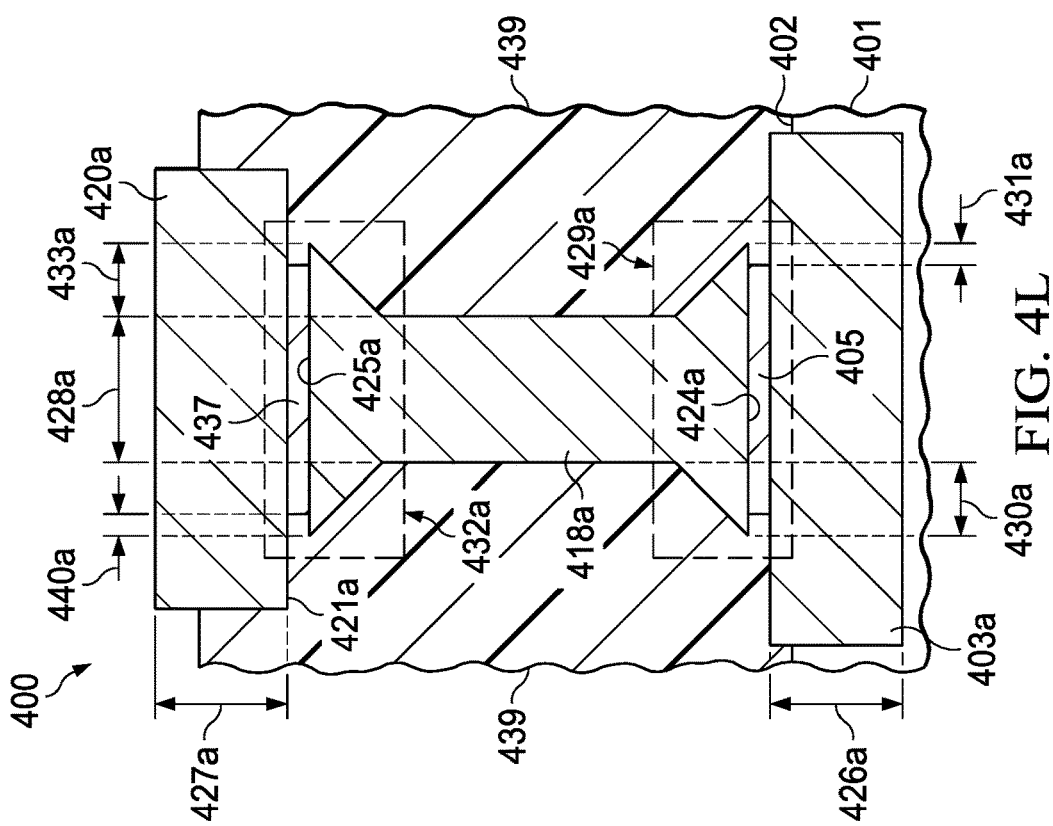

FIG. 4L is a cross section of the microelectronic device 400 through the first pillar 418*a*. The first pillar 418*a* has a first die end 424*a* coupled to the first die conductor 403*a*. In this example, the first die end 424*a* is coupled to the first die conductor 403*a* through the die interface layer 405. The first pillar 418*a* has a first head end 425*a* coupled to the first head 420*a*. In this example, the first head end 425*a* is coupled to the first head 420*a* through the head interface layer 437.

The first die conductor 403*a* has a first die conductor thickness 426*a*, which is a dimension of the first die conductor 403*a* in a direction perpendicular to the connection surface 402, at a point of overlap between the first die conductor 403*a* and an edge of the first pillar 418*a* at the first die end 424*a*. The first head 420*a* has a first head thickness 427*a*, which is a dimension of the first head 420*a* in a direction perpendicular to the connection surface 402, at a point of overlap between the first head 420*a* and an edge of the first pillar 418*a* at the first head end 425*a*. The first pillar 418*a* has a first pillar width 428*a*, which is a minimum dimension of the first pillar 418*a* in a direction parallel to the connection surface 402, midway between the first die end 424*a* and the first head end 425*a*.

The first pillar 418*a* has a first die-side flared end 429*a* at the first die end 424*a*. The first pillar 418*a* widens progressively along the first die-side flared end 429*a* toward the first die end 424*a*. The first die-side flared end 429*a* extends outward, at the first die end 424*a*, from a surface of the first pillar 418*a* midway between the first die end 424*a* and the first head end 425*a*, by a first die-side flare extension 430*a*. The first die-side flare extension 430*a* is greater than a lesser of half the first die conductor thickness 426*a* and half the first pillar width 428*a*, to reduce a current density in the first pillar 418*a* at the first die end 424*a*, to provide a measureable improvement in reliability of the first pillar 418*a*. The die interface layer 405 may be recessed, that is, undercut, with respect to an edge of the first pillar 418*a* at the first die end 424*a*, as depicted in FIG. 4L, by a first die-side undercut 431*a*, which is a distance between an edge of the die interface layer 405 and the edge of the first pillar 418*a* at the first die end 424*a*. If the die interface layer 405 is recessed from an edge of the first pillar 418*a*, the first die-side undercut 431*a* is less than half the first die-side flare extension 430a, to retain the advantage of reducing the current density in the first pillar 418a to provide a measureable improvement in reliability of the first pillar 418a. The first die conductor 403a extends past the first pillar 418a in a first lateral direction parallel to the connection surface 402.

The first pillar 418a has a first head-side flared end 432a at the first head end 425a of the first pillar 418a. The first pillar 418a widens progressively along the first head-side flared end 432a toward the first head end 425a. The first head-side flared end 432a extends outward at the first head end 425a, from the surface of the first pillar 418a midway between the first die end 424a and the first head end 425a, by a first head-side flare extension 433a that is greater than a lesser of half the first head thickness 427a and half the first pillar width 428a, to reduce a current density in the first pillar 418a at the first head end 425a, to provide a measureable improvement in reliability of the first pillar 418a. The first head-side flare extension 433a may be different from the first die-side flare extension 430a. The head interface layer 437 may be recessed, that is, undercut, with respect to an edge of the first pillar 418a at the first head end 425a, as depicted in FIG. 4L, by a first head-side undercut 440a, which is a distance between an edge of the head interface layer 437 and the edge of the first pillar 418a at the first head end 425a. If the head interface layer 437 is recessed from an edge of the first pillar 418a, the first head-side undercut 440a is less than half the first head-side flare extension 433a, to retain the advantage of reducing the current density in the first pillar 418a to provide a measureable improvement in reliability of the first pillar 418a. The first head 420a extends past the first pillar 418a in a second lateral direction parallel to the connection surface 402. The second lateral direction may be in a different direction than the first lateral direction. In this example, the first bottom surface 421a of the first head 420a extends past the first pillar 418a in at least two directions parallel to the connection surface 402.

FIG. 4M is a cross section of the microelectronic device 400 through the second pillar 418b. The second pillar 418b has a second die end 424b coupled to the second die conductor 403b. In this example, the second die end 424b is coupled to the second die conductor 403b through the die interface layer 405. The second pillar 418b has a second head end 425b coupled to the second head 420b. In this example, the second head end 425b is coupled to the second head 420b through the head interface layer 437.

The second die conductor 403b has a second die conductor thickness 426b, which is a dimension of the second die conductor 403b in a direction perpendicular to the connection surface 402, at a point of overlap between the second die conductor 403b and an edge of the second pillar 418b at the second die end 424b. The second head 420b has a second head thickness 427b, which is a dimension of the second head 420b in a direction perpendicular to the connection surface 402, at a point of overlap between the second head 420b and an edge of the second pillar 418b at the second head end 425b. The second pillar 418b has a second pillar width 428b, which is a minimum dimension of the second pillar 418b in a direction parallel to the connection surface 402, midway between the second die end 424b and the second head end 425b.

The second pillar 418b has a second die-side flared end 429b at the second die end 424b. The second pillar 418b widens progressively along the second die-side flared end 429b toward the second die end 424b. The second die-side flared end 429b extends outward, at the second die end 424b, from a surface of the second pillar 418b midway between the second die end 424b and the second head end 425b, by a second die-side flare extension 430b. The second die-side flare extension 430b is greater than a lesser of half the second die conductor thickness 426b and half the second pillar width 428b, to reduce a current density in the second pillar 418b at the second die end 424b, to provide a measureable improvement in reliability of the second pillar 418b. The die interface layer 405 may be recessed, that is, undercut, with respect to an edge of the second pillar 418b at the second die end 424b, as depicted in FIG. 4M, by a second die-side undercut 431b, which is a distance between an edge of the die interface layer 405 and the edge of the second pillar 418b at the second die end 424b. If the die interface layer 405 is recessed from an edge of the second pillar 418b, the second die-side undercut 431b is less than half the second die-side flare extension 430b, to retain the advantage of reducing the current density in the second pillar 418b to provide a measureable improvement in reliability of the second pillar 418b. The second die conductor 403b extends past the second pillar 418b in a third lateral direction parallel to the connection surface 402.

The second pillar 418b has a second head-side flared end 432b at the second head end 425b of the second pillar 418b. The second pillar 418b widens progressively along the second head-side flared end 432b toward the second head end 425b. The second head-side flared end 432b extends outward at the second head end 425b, from the surface of the second pillar 418b midway between the second die end 424b and the second head end 425b, by a second head-side flare extension 433b that is greater than a lesser of half the second head thickness 427b and half the second pillar width 428b, to reduce a current density in the second pillar 418b at the second head end 425b, to provide a measureable improvement in reliability of the second pillar 418b. The head interface layer 437 may be recessed, that is, undercut, with respect to an edge of the second pillar 418b at the second head end 425b, as depicted in FIG. 4M, by a second head-side undercut 440b, which is a distance between an edge of the head interface layer 437 and the edge of the second pillar 418b at the second head end 425b. If the head interface layer 437 is recessed from an edge of the second pillar 418b, the second head-side undercut 440b is less than half the second head-side flare extension 433b, to retain the advantage of reducing the current density in the second pillar 418b to provide a measureable improvement in reliability of the second pillar 418b. The second head 420b extends past the second pillar 418b in a fourth lateral direction parallel to the connection surface 402. The fourth lateral direction may be in a different direction than the third lateral direction. In this example, the second bottom surface 421b of the second head 420b extends past the second pillar 418b in at least two directions parallel to the connection surface 402.

Figure 5A:
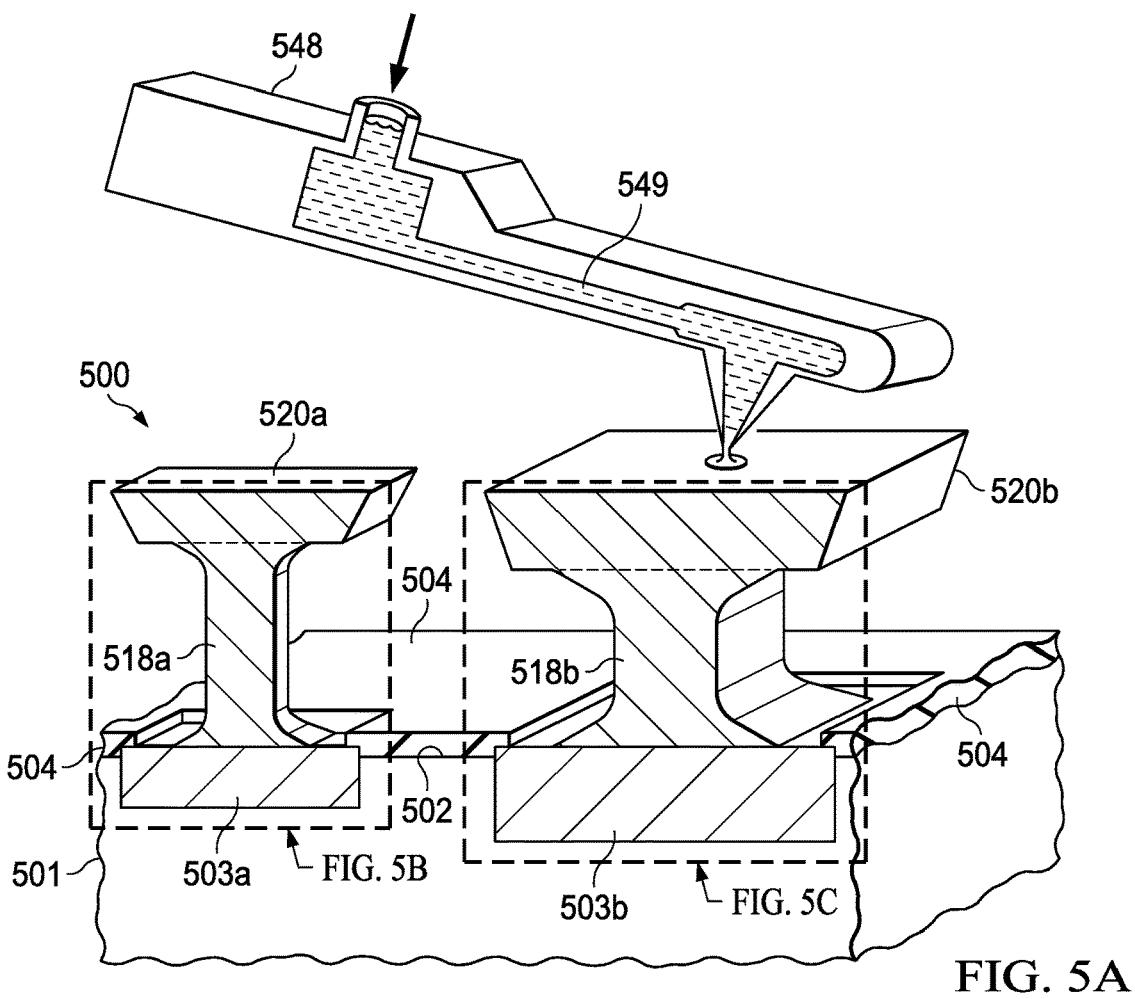
FIG. 5A through FIG. 5C are cross sections of another example microelectronic device, depicted in stages of another example method of formation.
Figure 5C:
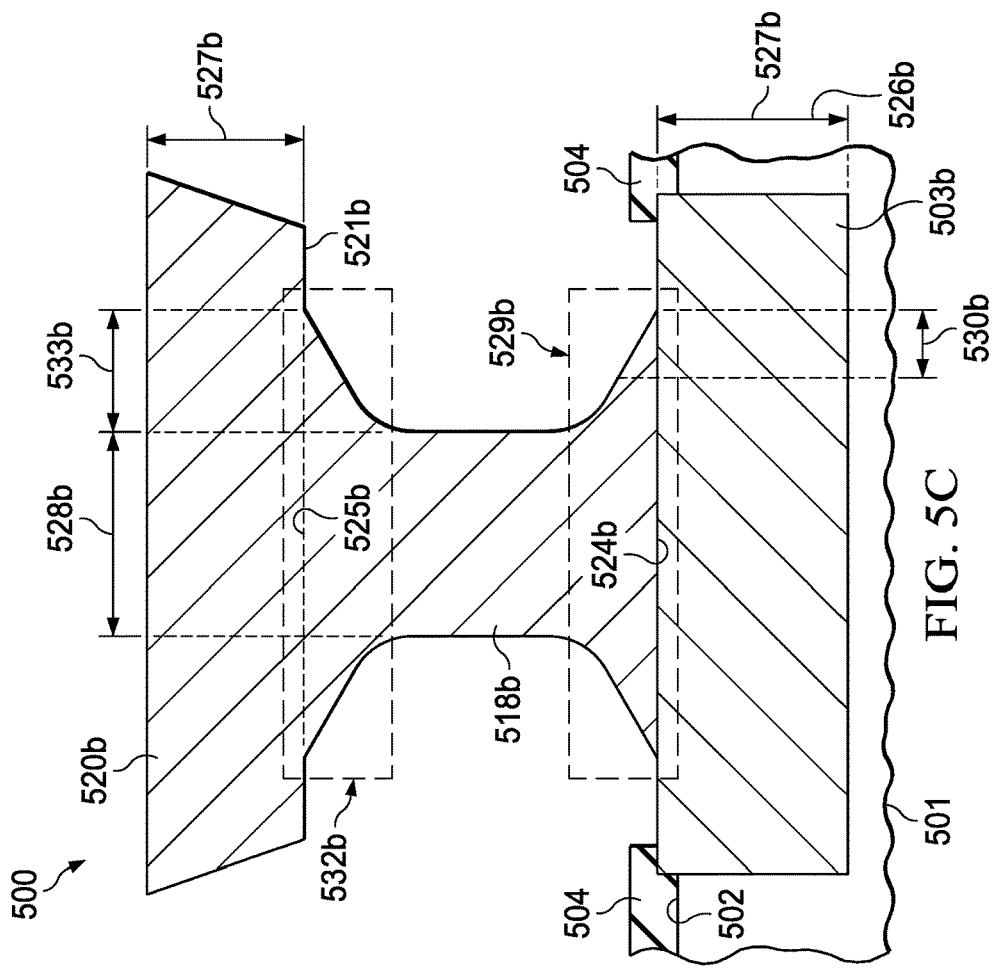
Figure 5B:
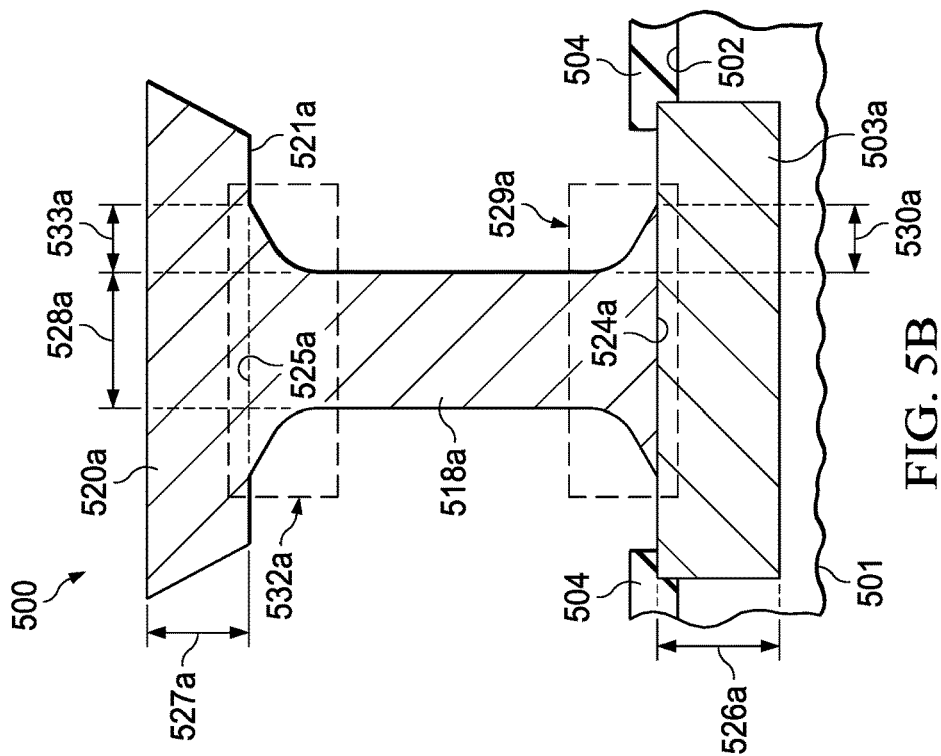

FIG. 5A through FIG. 5C are cross sections of another example microelectronic device, depicted in stages of another example method of formation. Referring to FIG. 5A, the microelectronic device 500 includes a die 501. The die 501 may be implemented as any of the device types disclosed in reference to the die 101 of FIG. 1A. The die 501 may be part of a workpiece, not shown in FIG. 5A, that includes additional die, or may be a single die. The die 501 has a connection surface 502.

The microelectronic device 500 includes a first die conductor 503a and a second die conductor 503b at the connection surface 502. The first die conductor 503a and the second die conductor 503b are electrically conductive. The first die conductor 503a and the second die conductor 503b may include any of the materials disclosed in reference to the first die conductor 103*a* and a second die conductor 103*b* of FIG. 1A. In this example, the first die conductor 503*a* and the second die conductor 503*b* extend partway into the die 501, and extend partway past the connection surface 502 out of the die 501, as depicted in FIG. 5A. The microelectronic device 500 may optionally include a PO layer 504 over the connection surface 502 extending partway onto the first die conductor 503*a* and the second die conductor 503*b*, so that portions of the first die conductor 503*a* and the second die conductor 503*b* are exposed by the PO layer 504.

A first pillar 518*a* is formed on the first die conductor 503*a*, and a first head 520*a* is formed on the first pillar 518*a*, a second pillar 518*b* is formed on the second die conductor 503*b*, and a second head 520*b* is formed on the second pillar 518*b*. In this example, the first pillar 518*a*, the second pillar 518*b*, the first head 520*a*, and the second head 520*b* are formed by an additive process, implemented as a microelectrodeposition process using a microcapillary electrodeposition head 548 which provides a plating solution 549 containing one or more metal ion species such as copper ions, nickel ions, or gold ions, for example. The microcapillary electrodeposition head 548 electrodeposits the one or more metals from the plating solution 549 onto the first die conductor 503*a* and the second die conductor 503*b* to form the first pillar 518*a*, the second pillar 518*b*, the first head 520*a*, and the second head 520*b*. The first pillar 518*a*, the second pillar 518*b*, the first head 520*a*, and the second head 520*b* may include more than 95 weight percent copper, or at least 50 weight percent copper, accruing the advantages disclosed in reference to forming the first pillar 118*a* and the second pillar 118*b* of FIG. 1I. Other compositions of the first pillar 518*a*, the second pillar 518*b*, the first head 520*a*, and the second head 520*b* are within the scope of this example. In this example, the first pillar 518*a* is formed directly on the first die conductor 503*a*, and the second pillar 518*b* is formed directly on the second die conductor 503*b*, advantageously without need for a die interface layer or a pillar plating mask. The first head 520*a* is formed directly on the first pillar 518*a*, and the second head 520*b* is formed directly on the second pillar 518*b*, without need for a head interface layer or a head plating mask. In this example, a boundary between the first head 520*a* and the first pillar 518*a* may be difficult to discern by examination, and similarly for a boundary between the second head 520*b* and the second pillar 518*b*, because the first head 520*a* and the first pillar 518*a* have similar compositions as a result of both being formed using the additive process. The boundary between the first head 520*a* and the first pillar 518*a* may be taken to be coplanar with a first bottom surface 521*a* of the first head 520*a* outward of the first pillar 518*a*, as indicated in FIG. 5A by the dashed line at the boundary between the first head 520*a* and the first pillar 518*a*. Similarly, the boundary between the second head 520*b* and the second pillar 518*b* may be taken to be coplanar with a second bottom surface 521*b* of the second head 520*b* outward of the second pillar 518*b*, as indicated in FIG. 5A by the dashed line at the boundary between the second head 520*b* and the second pillar 518*b*.

FIG. 5B is a cross section of the microelectronic device 500 through the first pillar 518*a*. The first pillar 518*a* has a first die end 524*a* coupled to the first die conductor 503*a*. In this example, the first die end 524*a* is directly connected to the first die conductor 503*a*. The first pillar 518*a* has a first head end 525*a* coupled to the first head 520*a*. In this example, the first head end 525*a* is directly connected to the first head 520*a*, as a result of the first head end 525*a* being formed continuously with the first pillar 518*a*.

The first die conductor 503*a* has a first die conductor thickness 526*a*, which is a dimension of the first die conductor 503*a* in a direction perpendicular to the connection surface 502, at a point of overlap between the first die conductor 503*a* and an edge of the first pillar 518*a* at the first die end 524*a*. The first head 520*a* has a first head thickness 527*a*, which is a dimension of the first head 520*a* in a direction perpendicular to the connection surface 502, at a point of overlap between the first head 520*a* and an edge of the first pillar 518*a* at the first head end 525*a*. The first pillar 518*a* has a first pillar width 528*a*, which is a minimum dimension of the first pillar 518*a* in a direction parallel to the connection surface 502, midway between the first die end 524*a* and the first head end 525*a*.

The first pillar 518*a* has a first die-side flared end 529*a* at the first die end 524*a*. The first pillar 518*a* widens progressively along the first die-side flared end 529*a* toward the first die end 524*a*. The first die-side flared end 529*a* extends outward, at the first die end 524*a*, from a surface of the first pillar 518*a* midway between the first die end 524*a* and the first head end 525*a*, by a first die-side flare extension 530*a*. The first die-side flare extension 530*a* is greater than a lesser of half the first die conductor thickness 526*a* and half the first pillar width 528*a*, to reduce a current density in the first pillar 518*a* at the first die end 524*a*, to provide a measureable improvement in reliability of the first pillar 518*a*. The first die conductor 503*a* extends past the first pillar 518*a* in a first lateral direction parallel to the connection surface 502.

The first pillar 518*a* has a first head-side flared end 532*a* at the first head end 525*a* of the first pillar 518*a*. The first pillar 518*a* widens progressively along the first head-side flared end 532*a* toward the first head end 525*a*. The first head-side flared end 532*a* extends outward at the first head end 525*a*, from the surface of the first pillar 518*a* midway between the first die end 524*a* and the first head end 525*a*, by a first head-side flare extension 533*a* that is greater than a lesser of half the first head thickness 527*a* and half the first pillar width 528*a*, to reduce a current density in the first pillar 518*a* at the first head end 525*a*, to provide a measureable improvement in reliability of the first pillar 518*a*. The first head-side flare extension 533*a* may be different from the first die-side flare extension 530*a*. The first head 520*a* extends past the first pillar 518*a* in a second lateral direction parallel to the connection surface 502. The second lateral direction may be in a different direction than the first lateral direction. In this example, the first bottom surface 521*a* of the first head 520*a* extends past the first pillar 518*a* in at least two directions parallel to the connection surface 502.

FIG. 5C is a cross section of the microelectronic device 500 through the second pillar 518*b*. The second pillar 518*b* has a second die end 524*b* coupled to the second die conductor 503*b*. In this example, the second die end 524*b* is directly connected to the second die conductor 503*b*. The second pillar 518*b* has a second head end 525*b* coupled to the second head 520*b*. In this example, the second head end 525*b* is directly connected to the second head 520*b*, as a result of the second head end 525*b* being formed continuously with the second pillar 518*b*.

The second die conductor 503*b* has a second die conductor thickness 526*b*, which is a dimension of the second die conductor 503*b* in a direction perpendicular to the connection surface 502, at a point of overlap between the second die conductor 503*b* and an edge of the second pillar 518*b* at the second die end 524*b*. The second head 520*b* has a second head thickness 527*b*, which is a dimension of the second head 520*b* in a direction perpendicular to the connection surface 502, at a point of overlap between the second head 520b and an edge of the second pillar 518b at the second head end 525b. The second pillar 518b has a second pillar width 528b, which is a minimum dimension of the second pillar 518b in a direction parallel to the connection surface 502, midway between the second die end 524b and the second head end 525b.

The second pillar 518b has a second die-side flared end 529b at the second die end 524b. The second pillar 518b widens progressively along the second die-side flared end 529b toward the second die end 524b. The second die-side flared end 529b extends outward, at the second die end 524b, from a surface of the second pillar 518b midway between the second die end 524b and the second head end 525b, by a second die-side flare extension 530b. The second die-side flare extension 530b is greater than a lesser of half the second die conductor thickness 526b and half the second pillar width 528b, to reduce a current density in the second pillar 518b at the second die end 524b, to provide a measureable improvement in reliability of the second pillar 518b. The second die conductor 503b extends past the second pillar 518b in a third lateral direction parallel to the connection surface 502.

The second pillar 518b has a second head-side flared end 532b at the second head end 525b of the second pillar 518b. The second pillar 518b widens progressively along the second head-side flared end 532b toward the second head end 525b. The second head-side flared end 532b extends outward at the second head end 525b, from the surface of the second pillar 518b midway between the second die end 524b and the second head end 525b, by a second head-side flare extension 533b that is greater than a lesser of half the second head thickness 527b and half the second pillar width 528b, to reduce a current density in the second pillar 518b at the second head end 525b, to provide a measureable improvement in reliability of the second pillar 518b. The second head-side flare extension 533b may be different from the second die-side flare extension 530b. The second head 520b extends past the second pillar 518b in a fourth lateral direction parallel to the connection surface 502. The fourth lateral direction may be in a different direction than the third lateral direction. In this example, the second bottom surface 521b of the second head 520b extends past the second pillar 518b in at least two directions parallel to the connection surface 502.

Various features of the examples disclosed herein may be combined in other manifestations of example microelectronic devices. For example, any of the die conductors 103a, 103b, 203, 303a, 303b, 403a, 403b, 503a, or 503b may be implemented as top level interconnects, bond pads, or leads of RDLs, and may be formed as disclosed in reference to FIG. 2A through FIG. 2K. Any of the pillar plating masks 111, 211, or 411 may have die-side flares formed by the methods disclosed in reference to FIG. 1A through FIG. 1O, FIG. 2A through FIG. 2K, or FIG. 4A through FIG. 4M. Similarly, any of the pillar plating masks 111, 211, or 411 may have head-side flares formed by the methods disclosed in reference to FIG. 1A through FIG. 1O, FIG. 2A through FIG. 2K, or FIG. 4A through FIG. 4M. Barrier layers, such as the barrier layers disclosed in reference to FIG. 1A through FIG. 1K may be formed on any of the heads 120a, 120b, 220, 320a, 320b, 420a, 420b, 520a, or 520b. Any of the microelectronic devices 100, 200, 300, 400, or 500 may include a package structure as disclosed in reference to FIG. 2A through FIG. 2K.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a die including a connection surface and a die conductor at the connection surface;
   a pillar including a die end, and including a head end located opposite from the die end, the pillar being electrically coupled to the die conductor at the die end; and
   a head electrically coupled to the pillar at the head end; wherein:
      the pillar includes a die-side flared end at the die end, the pillar widening progressively along the die-side flared end toward the die end; and
      the pillar includes a head-side flared end at the head end, the pillar widening progressively along the head-side flared end toward the head end.

2. The microelectronic device of claim 1, wherein the pillar is electrically coupled to the die conductor through a die interface layer, the die interface layer being electrically conductive, wherein the die interface layer includes a different composition than the die conductor and the pillar.

3. The microelectronic device of claim 2, wherein the die interface layer is undercut with respect to the pillar at the die end by a die-side undercut that is less than half the die-side flare extension.

4. The microelectronic device of claim 1, wherein the pillar is electrically coupled to the head through a head interface layer, the head interface layer being electrically conductive, wherein the head interface layer includes a different composition than the die conductor and the pillar.

5. The microelectronic device of claim 4, wherein the head interface layer is undercut with respect to the pillar at the head end by a head-side undercut that is less than half the head-side flare extension.

6. The microelectronic device of claim 1, wherein the pillar includes at least 50 weight percent copper, and includes another metal.

7. The microelectronic device of claim 1, wherein the pillar includes more than 95 weight percent copper.

8. The microelectronic device of claim 1, wherein the die conductor includes a die conductor thickness, the die conductor thickness being a dimension of the first die conductor in a direction perpendicular to the connection surface, at a point of overlap between the die conductor and an edge of the pillar at the die end.

9. The microelectronic device of claim 1, wherein the head includes a head thickness, the head thickness being a dimension of the head in a direction perpendicular to the connection surface, at a point of overlap between the head and an edge of the pillar at the head end.

10. The microelectronic device of claim 1, wherein the pillar includes a pillar width, the pillar width being a minimum dimension of the pillar in a direction parallel to the connection surface midway between the die end and the head end.

11. The microelectronic device of claim 1, wherein the die-side flare extension that is greater than a lesser of half the die conductor thickness and half the pillar width.

12. The microelectronic device of claim 1, wherein the head-side flare extension that is greater than a lesser of half the head thickness and half the pillar width.

13. The microelectronic device of claim 1, wherein the die conductor extends past the pillar in a first lateral direction parallel to the connection surface.

14. The microelectronic device of claim 13, wherein a portion of the head extends past the pillar in the first lateral direction and another portion of the head extends past the pillar in a second lateral direction parallel to the connection surface.

15. The microelectronic device of claim 13, wherein the first lateral direction is orthogonal to the second lateral direction.

16. The microelectronic device of claim 1 further comprising a barrier layer including nickel, cobalt, or molybdenum.

17. The microelectronic device of claim 1, wherein the head-side flared end extends outward at the head end in a direction parallel to the connection surface by a head-side flare extension.

18. The microelectronic device of claim 1, wherein the die-side flared end extends outward at the die end in a direction parallel to the connection surface by a die-side flare extension.

\* \* \* \* \*